US012696529B2

(12) United States Patent
Cho et al.

(10) Patent No.: US 12,696,529 B2
(45) Date of Patent: Jul. 28, 2026

(54) SEMICONDUCTOR DEVICE AND METHOD OF FABRICATING THE SAME

(71) Applicant: SAMSUNG ELECTRONICS CO., LTD., Suwon-si (KR)

(72) Inventors: Kyung Hee Cho, Suwon-si (KR); Seokhyeon Yoon, Suwon-si (KR); Hyeongrae Kim, Suwon-si (KR); Jeewoong Shin, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 460 days.

(21) Appl. No.: 18/199,014

(22) Filed: May 18, 2023

(65) Prior Publication Data

US 2024/0113110 A1     Apr. 4, 2024

(30) Foreign Application Priority Data

Oct. 4, 2022     (KR) ........................ 10-2022-0126467

(51) Int. Cl.
| | |
|---|---|
| *H10D 84/83* | (2025.01) |
| *H10D 30/01* | (2025.01) |
| *H10D 30/43* | (2025.01) |
| *H10D 30/67* | (2025.01) |
| *H10D 62/10* | (2025.01) |

(Continued)

(52) U.S. Cl.
CPC ........... *H10D 84/83* (2025.01); *H10D 30/014* (2025.01); *H10D 30/43* (2025.01); *H10D 30/6735* (2025.01); *H10D 62/121* (2025.01);

*H10D 62/151* (2025.01); *H10D 62/292* (2025.01); *H10D 64/017* (2025.01);
(Continued)

(58) Field of Classification Search
CPC ........... H10D 30/6713; H10D 30/6715; H10D 30/6717; H10D 84/853
See application file for complete search history.

(56) References Cited

U.S. PATENT DOCUMENTS

| | | | |
|---|---|---|---|
| 7,381,601 B2 | 6/2008 | Kim et al. | |
| 10,164,030 B2 * | 12/2018 | Kim ................... | H10D 84/0186 |

(Continued)

FOREIGN PATENT DOCUMENTS

| | | | |
|---|---|---|---|
| EP | 3876287 A1 | | 9/2021 |
| KR | 10-2022-0076992 | * | 6/2022 |

*Primary Examiner* — Mary A Wilczewski
(74) *Attorney, Agent, or Firm* — Sughrue Mion, PLLC

(57) ABSTRACT
A semiconductor device includes first and second active patterns on first and second PMOS regions, two first source/drain patterns spaced apart along a first direction on the first active pattern and a first channel pattern including first semiconductor patterns between the two first source/drain patterns, and two second source/drain patterns spaced apart along the first direction on the second active pattern and a second channel pattern including second semiconductor patterns between the two second source/drain patterns. A width in a second direction of the each of the first semiconductor patterns is greater than a width of each of the second semiconductor patterns. Each of the first and second source/drain patterns includes semiconductor layers having different germanium concentrations. A number of the semiconductor layers of each of the two second source/drain patterns is greater than a number of the semiconductor layers of each of the two first source/drain patterns.

15 Claims, 58 Drawing Sheets

(51) Int. Cl.

| | | |
|---|---|---|
| *H10D 62/13* | (2025.01) | |
| *H10D 62/17* | (2025.01) | |
| *H10D 64/01* | (2025.01) | |
| *H10D 84/01* | (2026.01) | |
| *H10D 84/03* | (2025.01) | |

(52) U.S. Cl.
CPC ....... *H10D 84/0128* (2025.01); *H10D 84/013* (2025.01); *H10D 84/038* (2025.01)

(56) References Cited

U.S. PATENT DOCUMENTS

| | | | |
|---|---|---|---|
| 10,749,038 B2 | 8/2020 | Cheng et al. | |
| 10,916,544 B2 | 2/2021 | Xiao | |
| 11,276,691 B2 | 3/2022 | Guha et al. | |
| 2014/0054716 A1* | 2/2014 | Chen | H10D 89/10 |
| | | | 257/E27.06 |
| 2020/0098878 A1 | 3/2020 | Guler et al. | |
| 2020/0303502 A1 | 9/2020 | Bomberger et al. | |
| 2021/0273114 A1 | 9/2021 | Chen et al. | |
| 2022/0199773 A1* | 6/2022 | Rachmady | H10D 64/021 |
| 2022/0238713 A1* | 7/2022 | Lee | H10D 30/797 |
| 2022/0246728 A1* | 8/2022 | Kim | H10D 62/121 |
| 2023/0020176 A1* | 1/2023 | Park | H10D 30/0415 |
| 2023/0023711 A1* | 1/2023 | Choi | H10D 62/151 |
| 2023/0068364 A1* | 3/2023 | Choi | H10D 30/43 |
| 2023/0402523 A1* | 12/2023 | Song | H10D 64/017 |
| 2024/0113110 A1* | 4/2024 | Cho | H10D 30/6735 |
| 2024/0363701 A1* | 10/2024 | Yoo | H10D 30/6729 |
| 2025/0374664 A1* | 12/2025 | Chae | H10D 84/851 |

* cited by examiner

SEMICONDUCTOR DEVICE AND METHOD OF FABRICATING THE SAME

CROSS-REFERENCE TO RELATED APPLICATION

This U.S. nonprovisional application claims priority under 35 U.S.C § 119 to Korean Patent Application No. 10-2022-0126467 filed on Oct. 4, 2022 in the Korean Intellectual Property Office, the disclosure of which is hereby incorporated by reference in its entirety.

BACKGROUND

The present disclosure relates to a semiconductor device and a method of fabricating the same, and more particularly, to a semiconductor device including a field effect transistor and a method of fabricating the same.

A semiconductor device includes an integrated circuit including metal oxide semiconductor field effect transistors (MOSFETs). As sizes and design rules of the semiconductor device are gradually decreased, sizes of the MOSFETs are also increasingly scaled down. The scaled down MOSFETs may deteriorate operating characteristics of the semiconductor device. Accordingly, various studies have been conducted to develop methods of fabricating semiconductor devices having superior performance while overcoming limitations caused by high integration of the semiconductor devices.

SUMMARY

It is an aspect to provide a semiconductor device with increased reliability and improved electrical properties.

It is another aspect to provide a method of fabricating a semiconductor device with increased reliability and improved electrical properties.

According to an aspect of some embodiments, a semiconductor device may comprise a substrate that includes a first PMOS region and a second PMOS region; a first active pattern on the first PMOS region and a second active pattern on the second PMOS region; two first source/drain patterns and a first channel pattern between the two first source/drain patterns, the two first source/drain patterns being spaced apart along a first direction on the first active pattern, and the first channel pattern including a plurality of first semiconductor patterns stacked on the first active pattern; and two second source/drain patterns and a second channel pattern between the two second source/drain patterns, the two second source/drain patterns being spaced apart along the first direction on the second active pattern, and the second channel pattern including a plurality of second semiconductor patterns stacked on the second active pattern. A first width in a second direction of each of the plurality of first semiconductor patterns is greater than a second width in the second direction of each of the plurality of second semiconductor patterns, the second direction intersecting the first direction, each of the two first source/drain patterns and each of the two second source/drain patterns includes a plurality of semiconductor layers having germanium concentrations that are different in an upward direction, and a number of the plurality of semiconductor layers of each of the two second source/drain patterns is greater than a number of the plurality of semiconductor layers of each of the two first source/drain patterns.

According to another aspect of some embodiments, a semiconductor device may comprise a substrate that includes a first PMOS region and a second PMOS region; a first active pattern on the first PMOS region and a second active pattern on the second PMOS region; two first source/drain patterns and a first channel pattern between the two first source/drain patterns, the two first source/drain patterns being spaced apart along a first direction on the first active pattern, and the first channel pattern including a plurality of first semiconductor patterns stacked on the first active pattern; and two second source/drain patterns and a second channel pattern between the two second source/drain patterns, the two second source/drain patterns being spaced apart along the first direction on the second active pattern, and the second channel pattern including a plurality of second semiconductor patterns stacked on the second active pattern. A first width in a second direction of each of the plurality of first semiconductor patterns is greater than a second width in the second direction of each of the plurality of second semiconductor patterns, the second direction intersecting the first direction, each of the two first source/drain patterns and each of the two second source/drain patterns includes a plurality of semiconductor layers having germanium concentrations that are different in an upward direction, and a level difference between a top surface of an uppermost one of the plurality of second semiconductor patterns included in the second channel pattern and a top surface of each of the two second source/drain patterns is above 0 nm to about 5 nm.

According to yet another aspect of some embodiments, a method of fabricating a semiconductor device may comprise forming a first active pattern and a second active pattern respectively on a first PMOS region and a second PMOS region of a substrate, wherein the first active pattern has a first width in a first direction parallel to a top surface of the substrate, and wherein the second active pattern has a second width in the first direction less than the first width; forming a first stack pattern and a second stack pattern on the first active pattern and the second active pattern, respectively, wherein each of the first stack pattern and the second stack pattern includes sacrificial layers and active layers that are alternately stacked; forming a first sacrificial pattern and a second sacrificial pattern that extend along the first direction on the first stack pattern and the second active pattern, respectively; forming first recesses and second recesses using the first sacrificial pattern and the second sacrificial pattern, respectively, wherein the first recesses are on opposite sides of the first sacrificial pattern, and wherein the second recesses are on opposite sides of the second sacrificial pattern; forming a plurality of first semiconductor layers that fill the first recesses; and forming a plurality of second semiconductor layers that fill the second recesses. The plurality of first semiconductor layers and the plurality of second semiconductor layers include germanium whose concentration increases in a direction from an underlying layer toward an overlying layer, and forming the plurality of first semiconductor layers is performed sequentially with forming the plurality of second semiconductor layers.

BRIEF DESCRIPTION OF THE DRAWINGS

Figure 5:
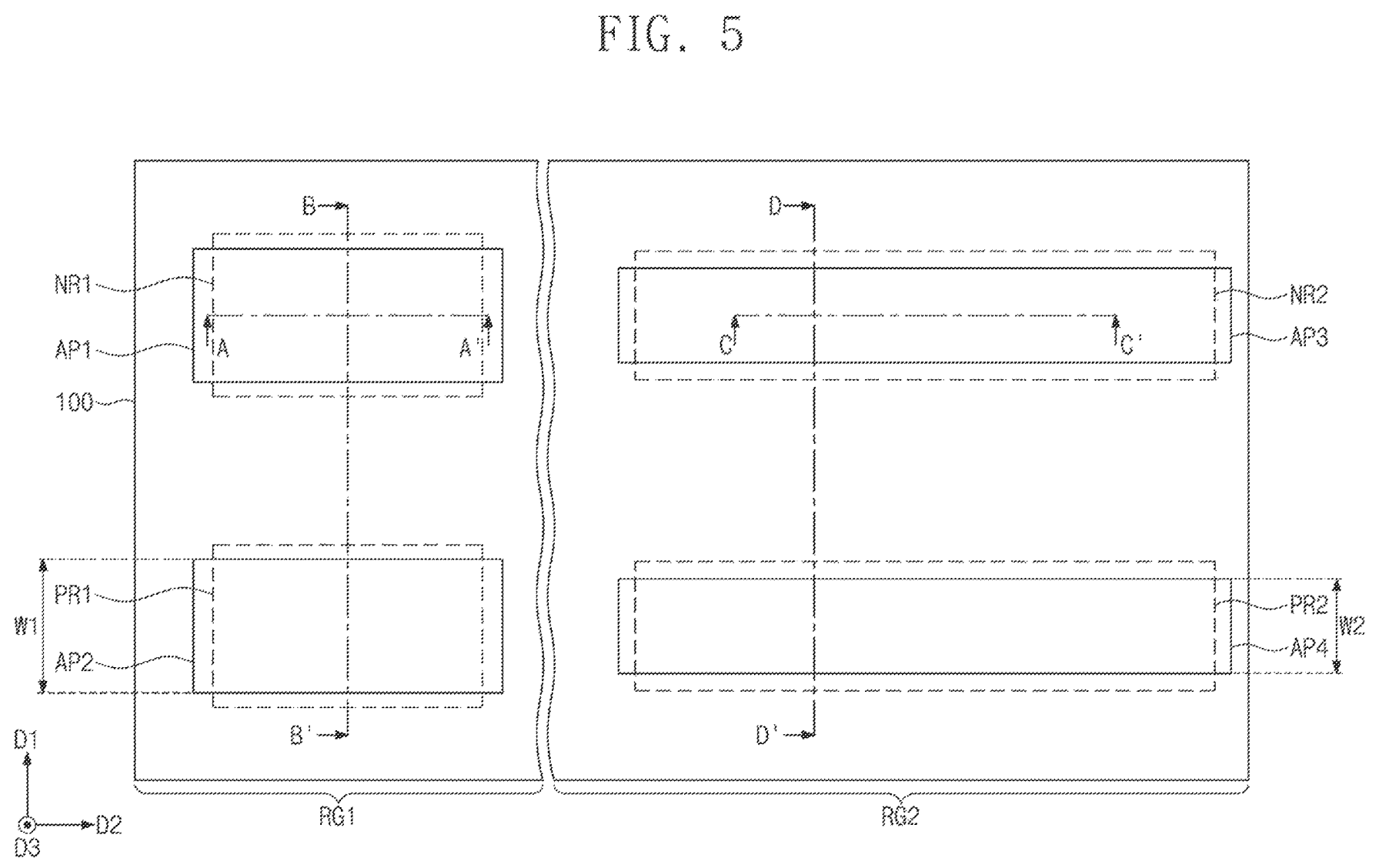

FIGS. 5, 7, 9, 11, 14, 17, 19, and 21 illustrate plan views showing a method of fabricating a semiconductor device according to some embodiments.

FIGS. 6C, 8C, 10C, 12C, 18C, 20C, and 22C illustrate cross-sectional views taken along line C-C' of FIGS. 5, 7, 9, 11, 17, 19, and 21, respectively.

Figure 13:
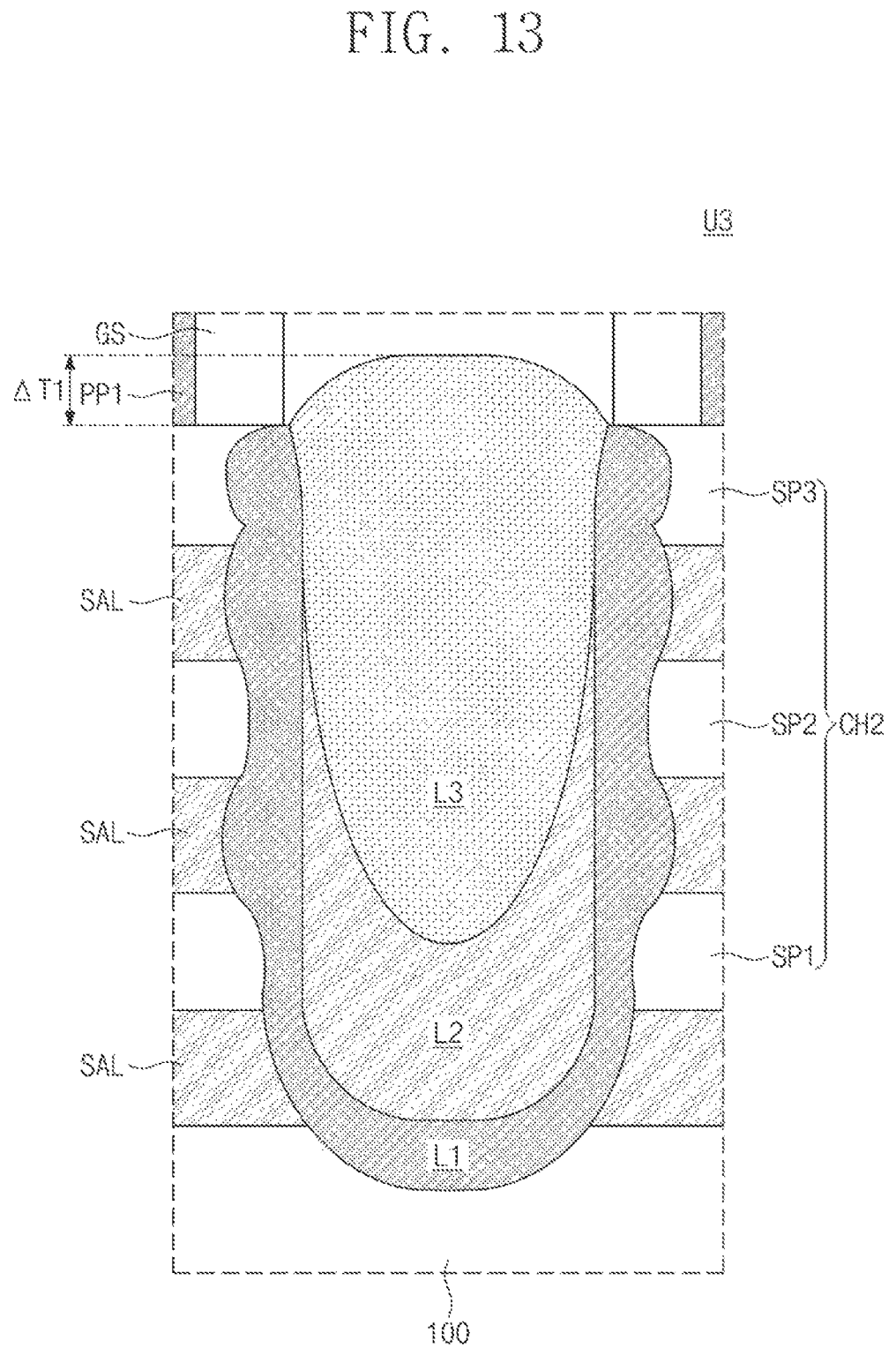

FIG. 13 illustrates an enlarged view showing section U3 of FIG. 12A.

DETAILED DESCRIPTION

Some embodiments will now be described in detail with reference to the accompanying drawings to aid in clearly explaining the embodiments.

It will be understood that, although the terms "first", "second", "third", and so on may be used herein to describe various elements, components, regions, layers and/or sections, these elements, components, regions, layers and/or sections should not be limited by these terms. The terms "first", "second", "third", and so on are used to distinguish one element, component, region, layer or section from another element, component, region, layer or section. Thus, in some cases, a "first" element, component, region, layer or section described below could be termed a "second" element, component, region, layer or section, without departing from the spirit and scope of the present disclosure.

Figure 1:
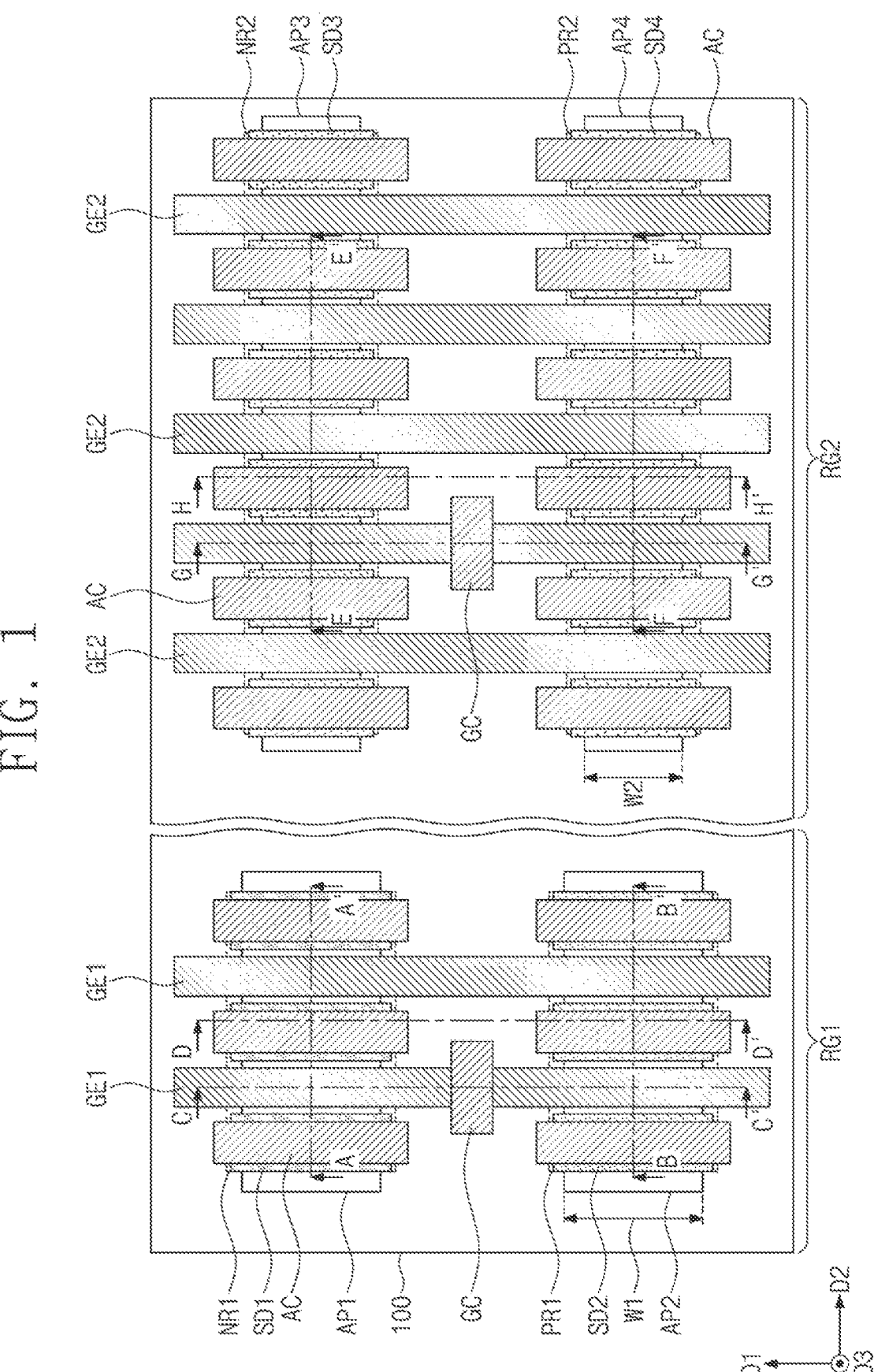
FIG. 1 illustrates a plan view showing a semiconductor device according to some embodiments.
Figure 3B:
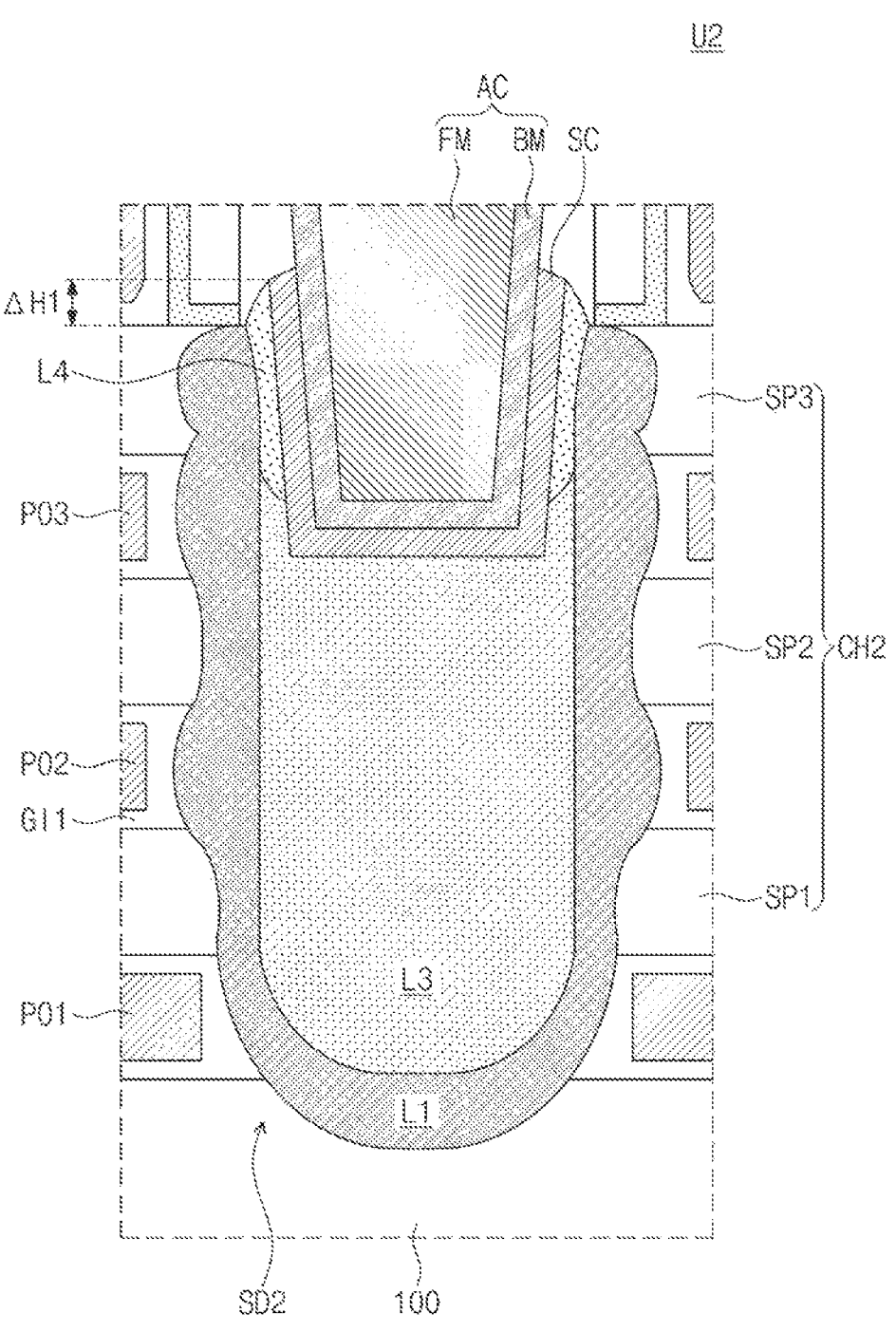
FIG. 3B illustrates an enlarged cross-sectional view showing section U1 of FIG. 2B.
Figure 4A:
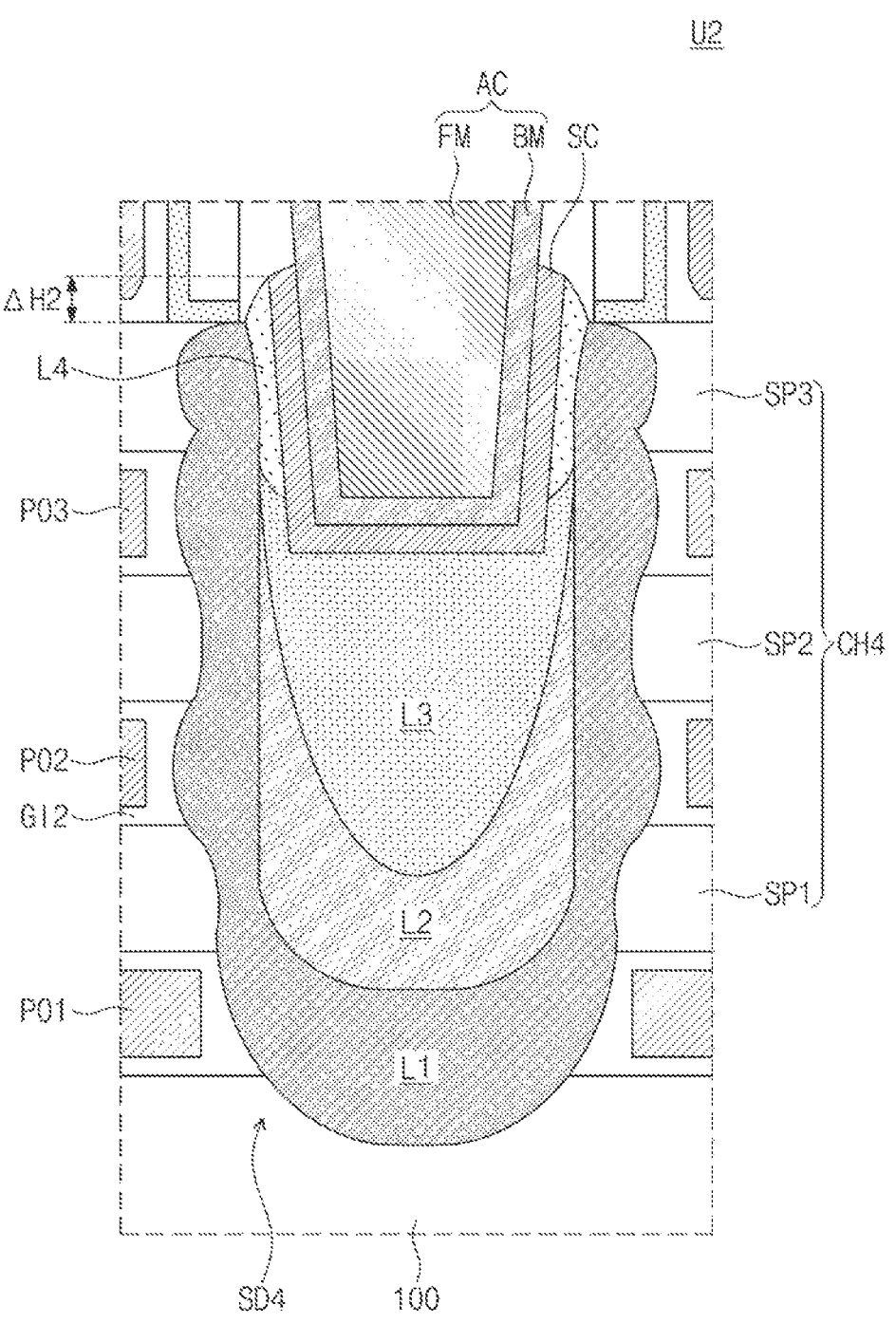
FIG. 4A illustrates an enlarged cross-sectional view showing section U2 of FIG. 2F.
Figure 4B:
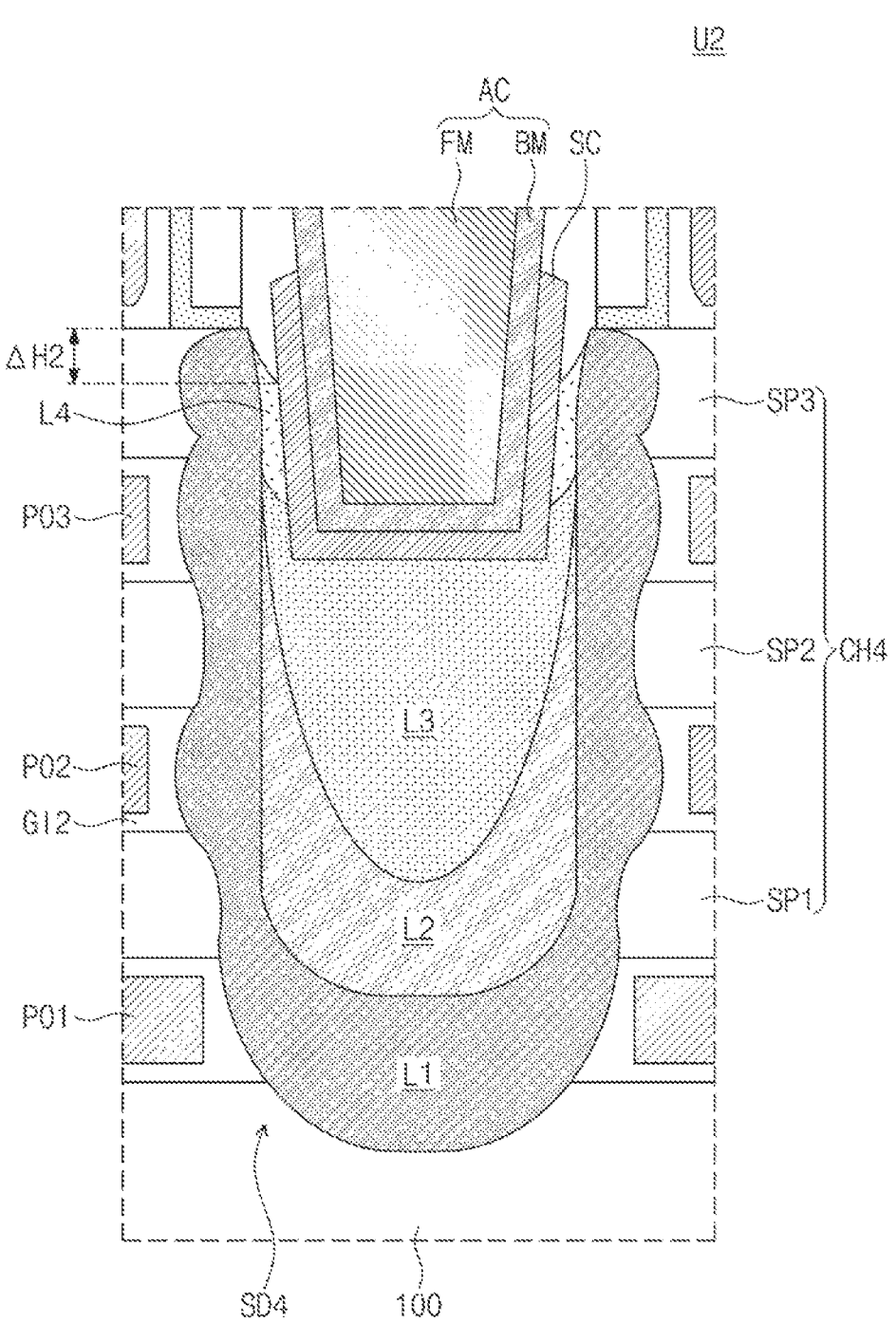
FIG. 4B illustrates an enlarged view of section U2 depicted in FIG. 2F, showing a semiconductor device according to some embodiments.
Figure 6A:
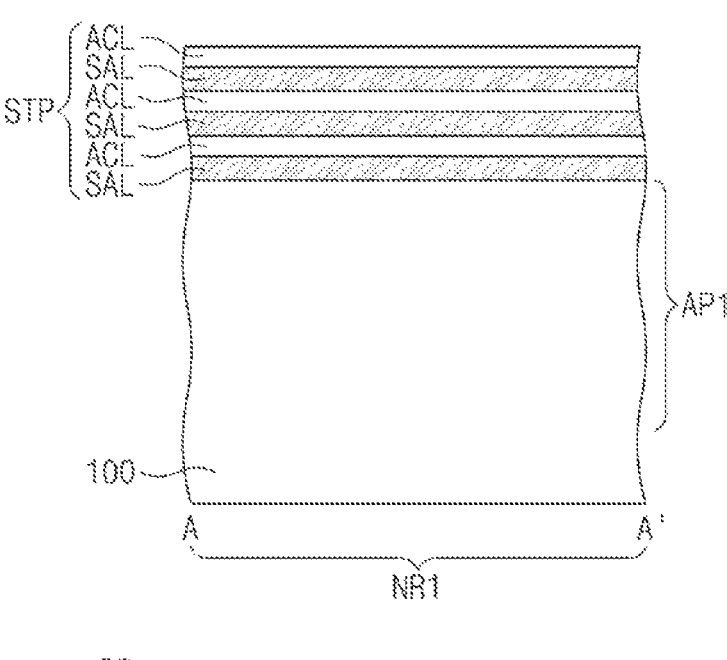
FIGS. 6A, 8A, 10A, 12A, 15A, 18A, 20A, and 22A illustrate cross-sectional views taken along line A-A' of FIGS. 5, 7, 9, 11, 14, 17, 19, and 21, respectively.
Figure 6B:
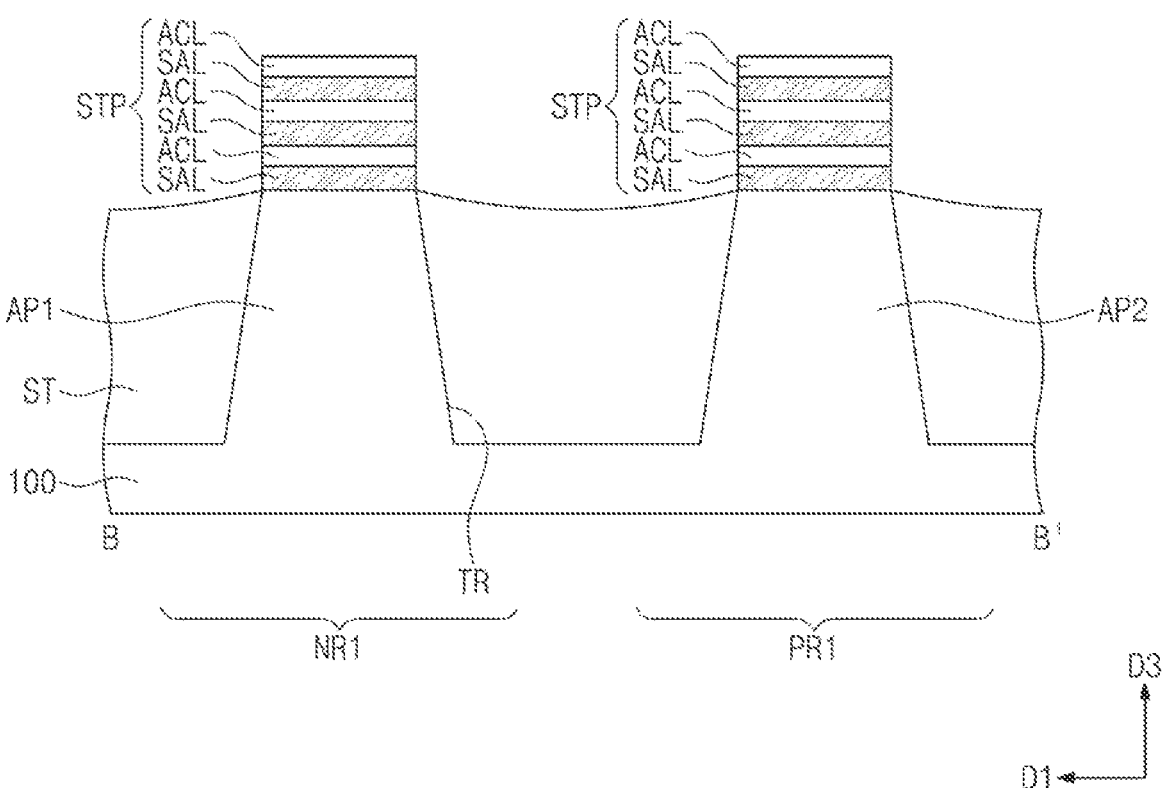
FIGS. 6B, 8B, 10B, 12B, 15B, 18B, 20B, and 22B illustrate cross-sectional views taken along line B-B' of FIGS. 5, 7, 9, 11, 14, 17, 19, and 21, respectively.
Figure 6C:
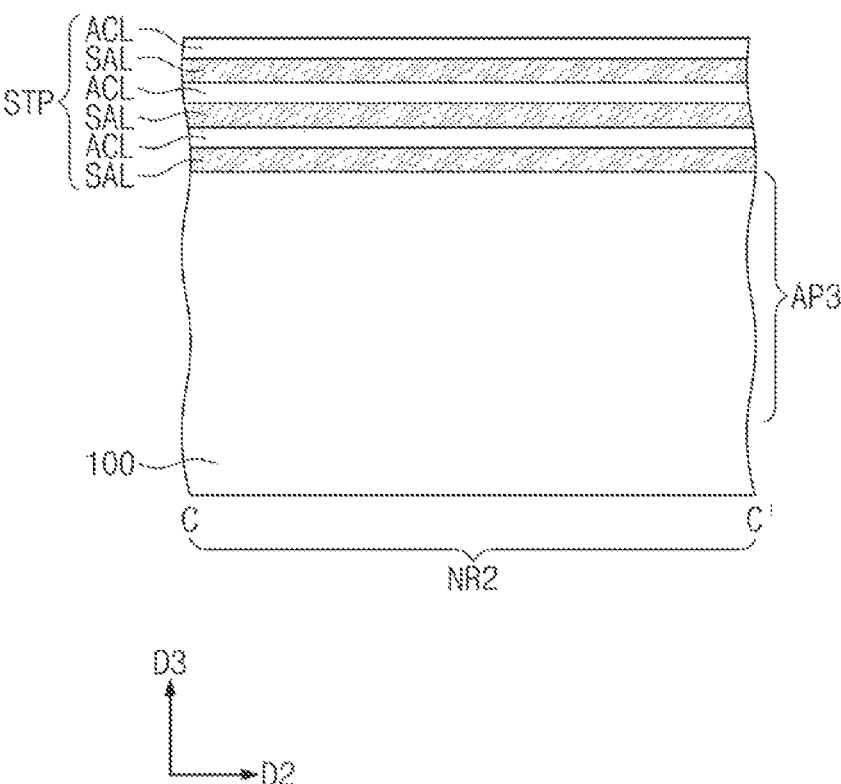
Figure 6D:
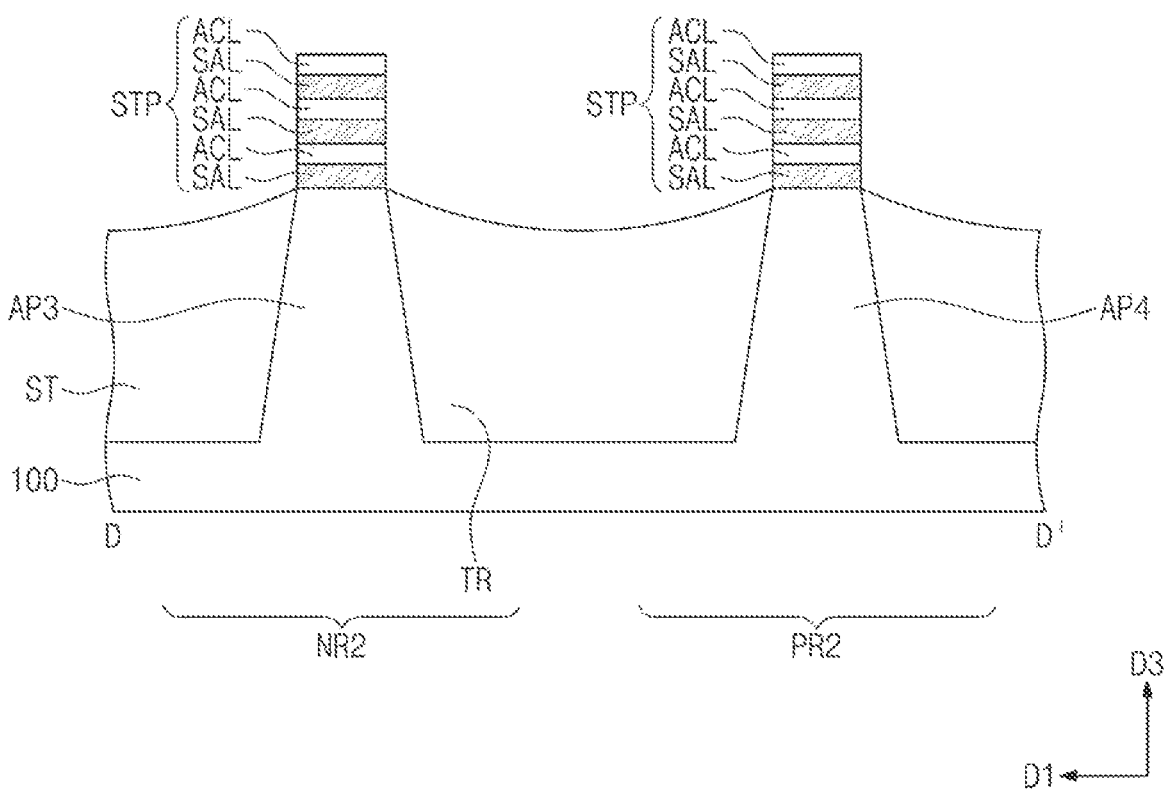
FIGS. 6D, 8D, 10D, 18D, 20D, and 22D illustrate cross-sectional views taken along line D-D' of FIGS. 5, 7, 9, 17, 19, and 21, respectively.
Figure 7:
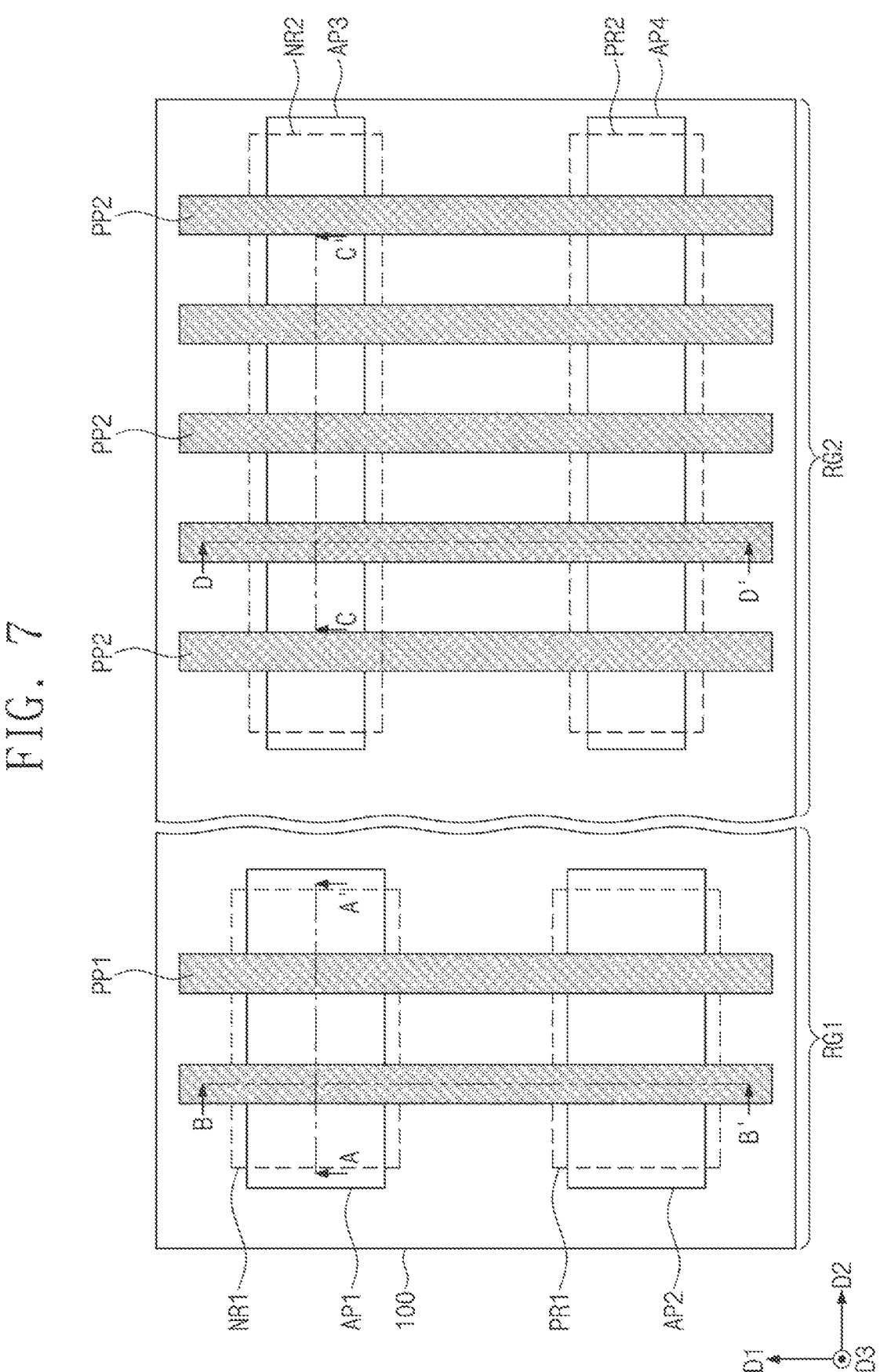
Figure 8A:
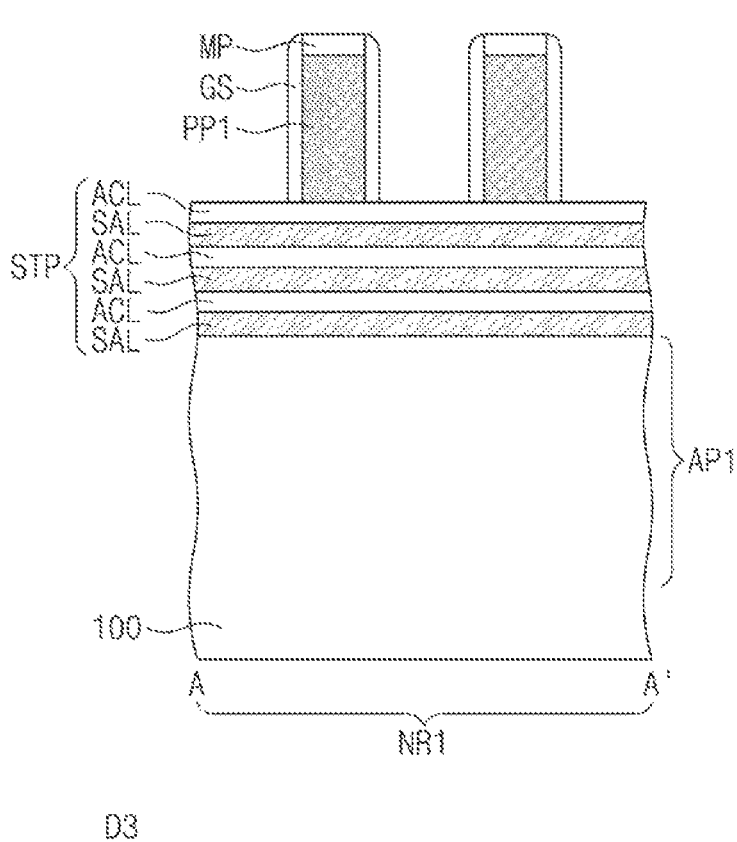
Figure 8B:
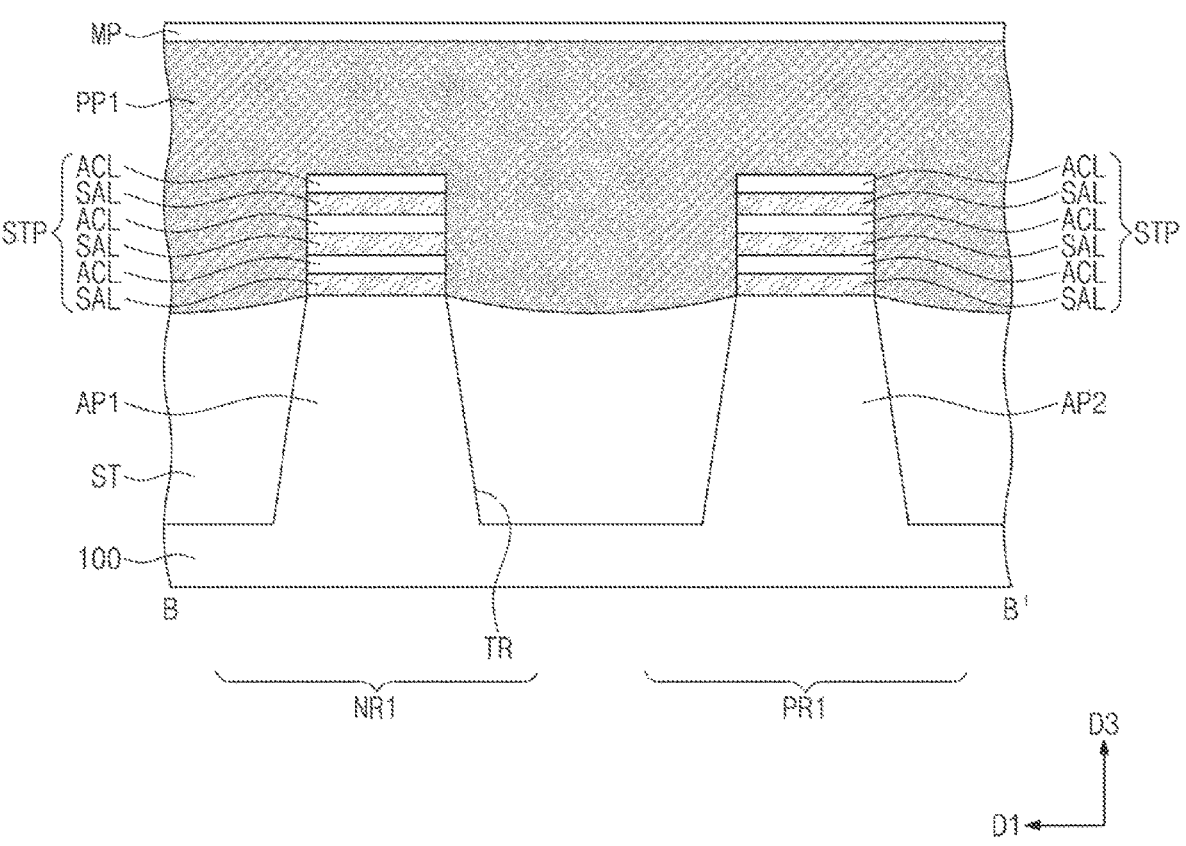
Figure 8C:
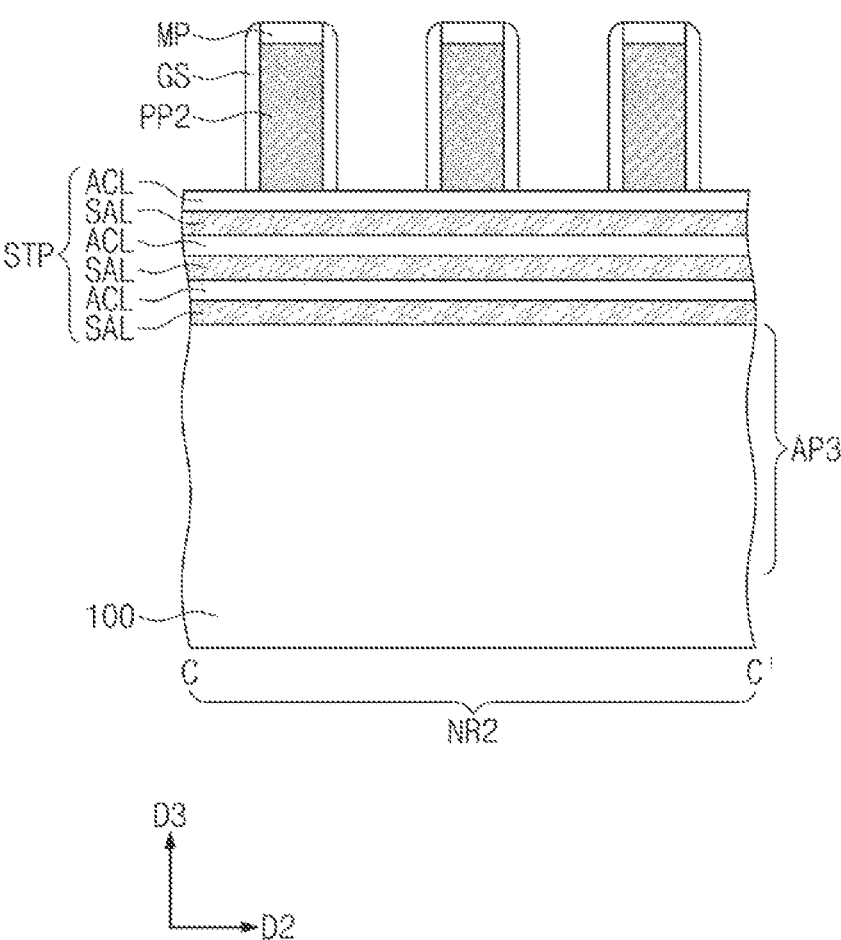
Figure 8D:
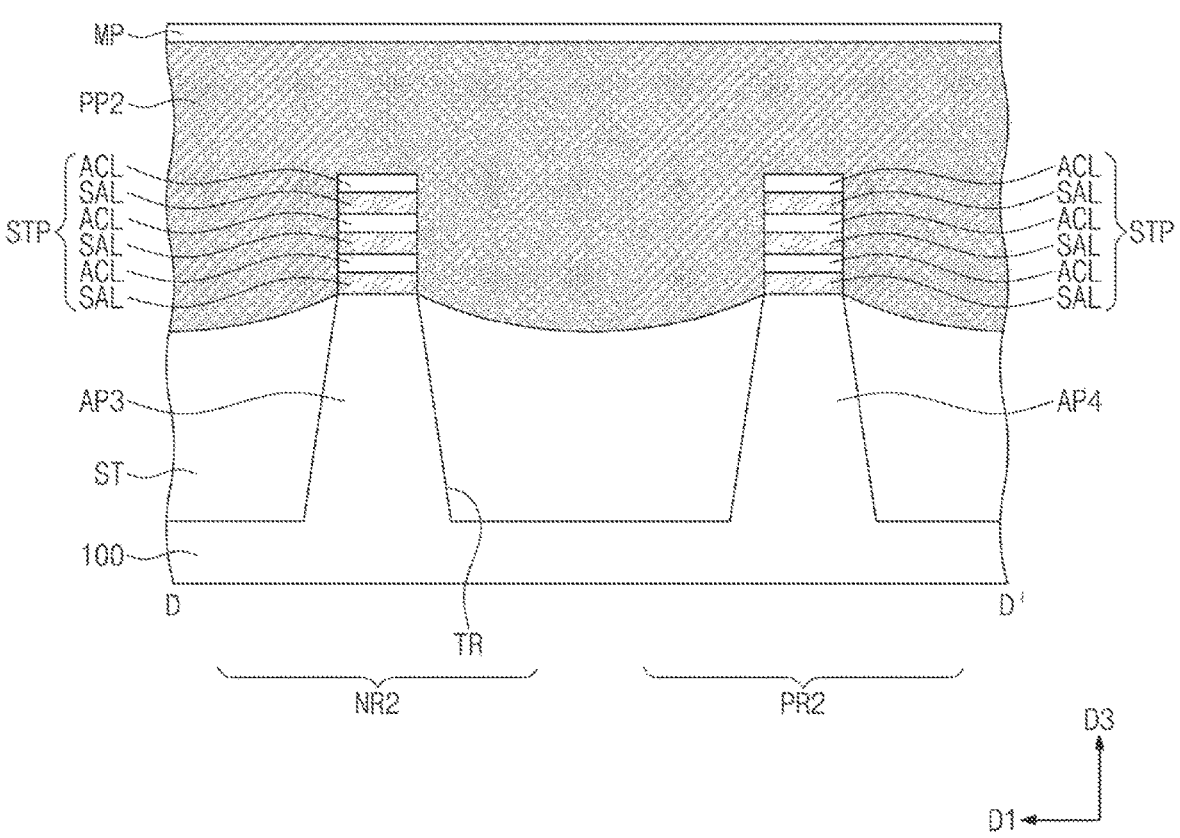
Figure 9:
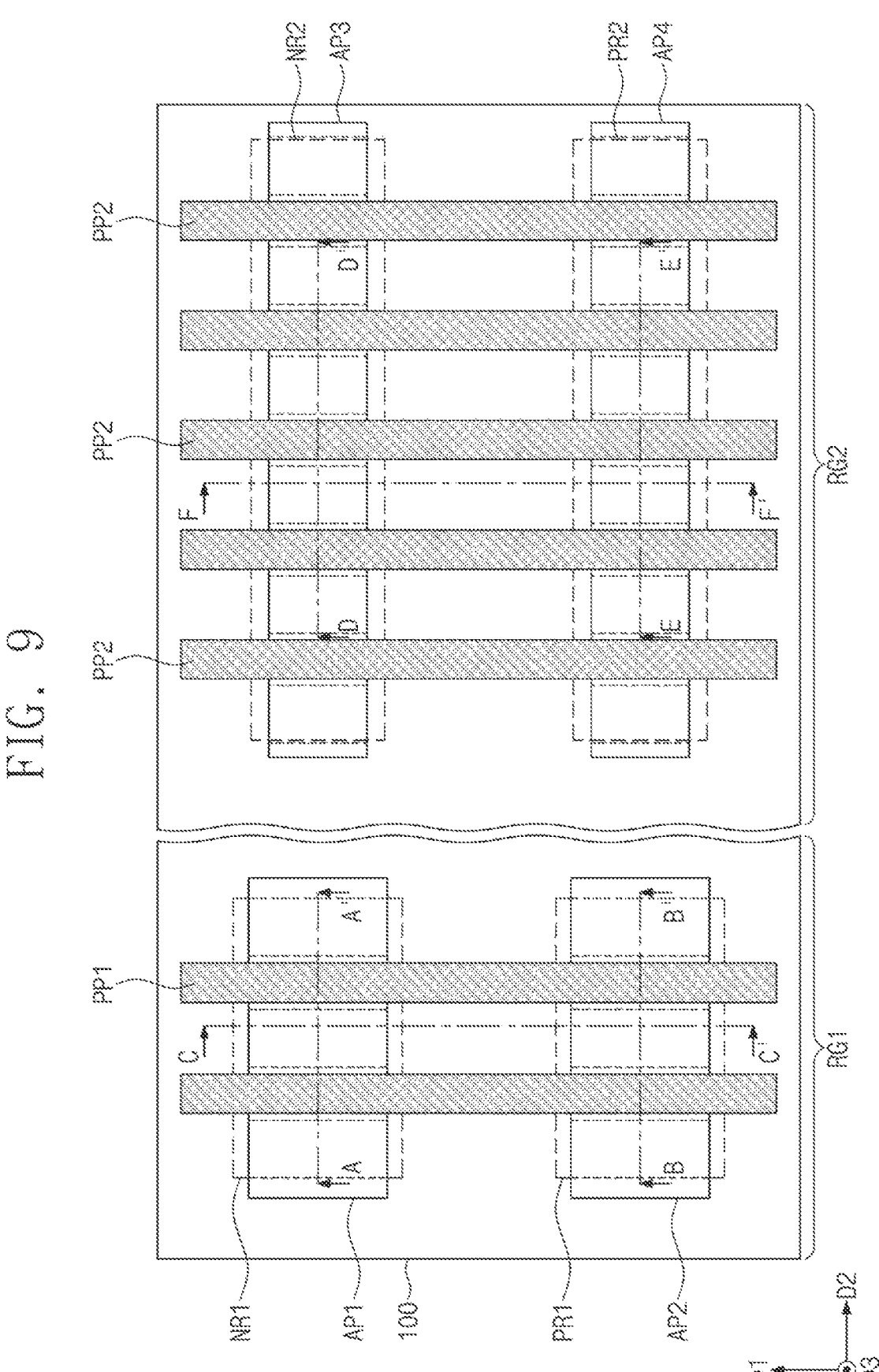

FIG. 1 illustrates a plan view showing a semiconductor device according to some embodiments. FIGS. 2A, 2B, 2C, 2D, 2E, 2F, 2G, and 2H illustrate cross-sectional views respectively taken along lines A-A', B-B', C-C', D-D', E-E', F-F', G-G', and H-H' of FIG. 1. FIG. 3B illustrates an enlarged cross-sectional view showing section U1 of FIG. 2B. FIG. 4A illustrates an enlarged cross-sectional view showing section U2 of FIG. 2F. FIG. 4B illustrates an enlarged view of section U2 depicted in FIG. 2F, showing a semiconductor device according to some embodiments.

Referring to FIG. 1, a substrate 100 may be provided which includes a first region RG1 and a second region RG2. In some embodiments, the substrate 100 may be a compound semiconductor substrate. In some embodiments, the substrate 100 may be a semiconductor substrate including silicon, germanium, or silicon-germanium. For example, the substrate 100 may be a silicon substrate.

The first region RG1 and the second region RG2 may areas on which different elements are disposed. The first region RG1 and the second region RG2 may each be an area on which is disposed one of a logic chip, a static random access memory (SRAM), and an extra gate (EG).

The first region RG1 may include a transistor having a channel pattern whose length is relatively large in a direction that is the same as an extending direction of a gate. The second region RG2 may include a transistor having a channel pattern whose length is relatively small in the direction.

A transistor on the first region RG1 will be first discussed below in detail with reference to FIGS. 1 and 2A to 2D.

The first region RG1 may include a first NMOSFET region NR1 and a first PMOSFET region PR1. The first NMOSFET region NR1 and the first PMOSFET region PR1 may be defined by a trench TR formed on an upper portion of the substrate 100. For example, the trench TR may be positioned between the first NMOSFET region NR1 and the first PMOSFET region PR1. The first NMOSFET region NR1 and the first PMOSFET region PR1 may be spaced apart in a first direction D1 from each other across the trench TR.

A first active pattern AP1 and a second active pattern AP2 may be respectively provided on the first NMOSFET region NR1 and the first PMOSFET region PR1. When viewed in plan, the first and second active patterns AP1 and AP2 may extend in a second direction D2. The first and second active patterns AP1 and AP2 may be vertically protruding portions of the substrate 100.

The trench TR may be filled with a device isolation layer ST. The device isolation layer ST may define the first NMOSFET region NR1 and the first PMOSFET region PR1 of the substrate 100. The device isolation layer ST may cover sidewalls of the first and second active patterns AP1 and AP2. The device isolation layer ST may include a silicon oxide layer.

A first channel pattern CH1 may be provided on the first active pattern AP1. A second channel pattern CH2 may be provided on the second active pattern AP2. Each of the first and second channel patterns CH1 and CH2 may include a first semiconductor pattern SP1, a second semiconductor pattern SP2, and a third semiconductor pattern SP3 that are sequentially stacked. The first, second, and third semiconductor patterns SP1, SP2, and SP3 may be spaced apart from each other in a vertical direction (or a third direction D3).

Each of the first, second, and third semiconductor patterns SP1, SP2, and SP3 may include silicon (Si), germanium (Ge), or silicon-germanium (SiGe). For example, in some embodiments, each of the first, second, and third semiconductor patterns SP1, SP2, and SP3 may include crystalline silicon.

A pair of first source/drain patterns SD1 may be provided on the first active pattern AP1. For example, in some embodiments, two first source/drain patterns SD1 may be provided on the first active pattern AP1. The first source/drain patterns SD1 may be impurity regions of a first conductivity type (e.g., n-type). The first, second, and third semiconductor patterns SP1, SP2, and SP3 of the first channel pattern CH1 may be interposed between the pair of first source/drain patterns SD1. For example, the first, second, and third semiconductor patterns SP1, SP2, and SP3 of the first channel pattern CH1 may connect the pair of first source/drain patterns SD1 to each other.

A pair of second source/drain patterns SD2 may be provided on the second active pattern AP2. For example, in some embodiments, two second source/drain patterns SD2 may be provided on the second active pattern AP2. The second source/drain patterns SD2 may be impurity regions of a second conductivity type (e.g., p-type). The first, second, and third semiconductor patterns SP1, SP2, and SP3 of the second channel pattern CH2 may be interposed between the pair of second source/drain patterns SD2. For example, the first, second, and third semiconductor patterns SP1, SP2, and SP3 of the second channel pattern CH2 may connect the pair of second source/drain patterns SD2 to each other.

The first and second source/drain patterns SD1 and SD2 may be epitaxial patterns formed by a selective epitaxial growth process. Each of the first source/drain patterns SD1 may have a top surface at a level substantially the same as or higher than that of a top surface of the third semiconductor pattern SP3. Each of the second source/drain patterns SD2 may have a top surface at a level substantially the same as or higher than that of a top surface of the third semiconductor pattern SP3.

In an embodiment, the first source/drain patterns SD1 may include the same semiconductor element (e.g., Si) as the semiconductor element of the substrate 100. The second source/drain patterns SD2 may include a semiconductor element (e.g., SiGe) whose lattice constant is greater than a lattice constant of a semiconductor element of the substrate 100. The second source/drain patterns SD2 may therefore provide the second channel pattern CH2 with a compressive stress.

In some embodiments, the second source/drain pattern SD2 may have an uneven embossing shape on a sidewall thereof. For example, the sidewall of the second source/drain pattern SD2 may have a wavy profile. The sidewall of the second source/drain pattern SD2 may protrude toward a first portion PO1, a second portion PO2, and a third portion PO3 of a first gate electrode GE1 which will be discussed below.

Figure 2A:
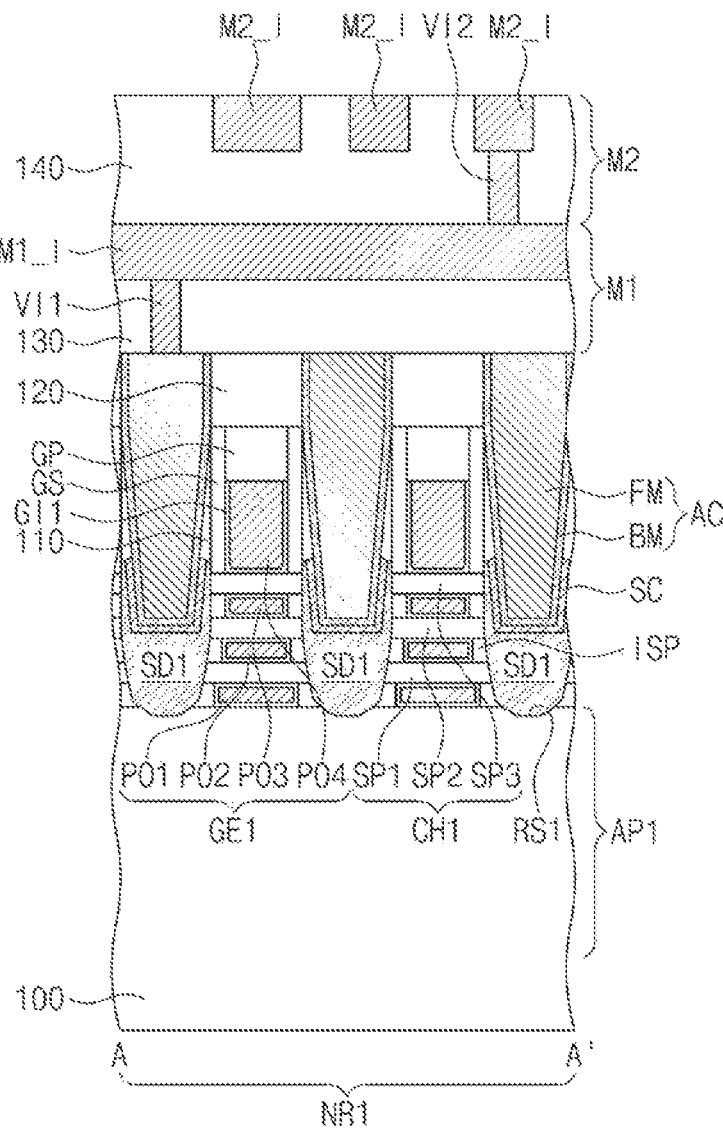
FIGS. 2A, 2B, 2C, 2D, 2E, 2F, 2G, and 2H illustrate cross-sectional views respectively taken along lines A-A', B-B', C-C', D-D', E-E', F-F', G-G', and H-H' of FIG. 1.
Figure 2B:
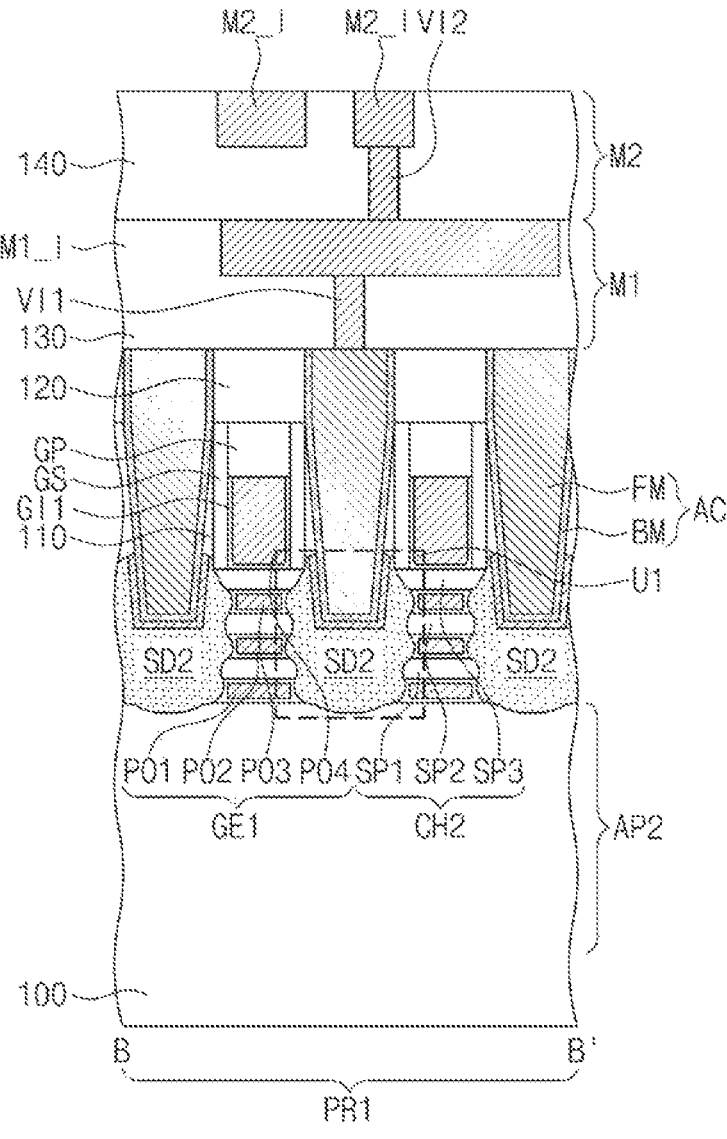
Figure 2B:
Figure 2C:
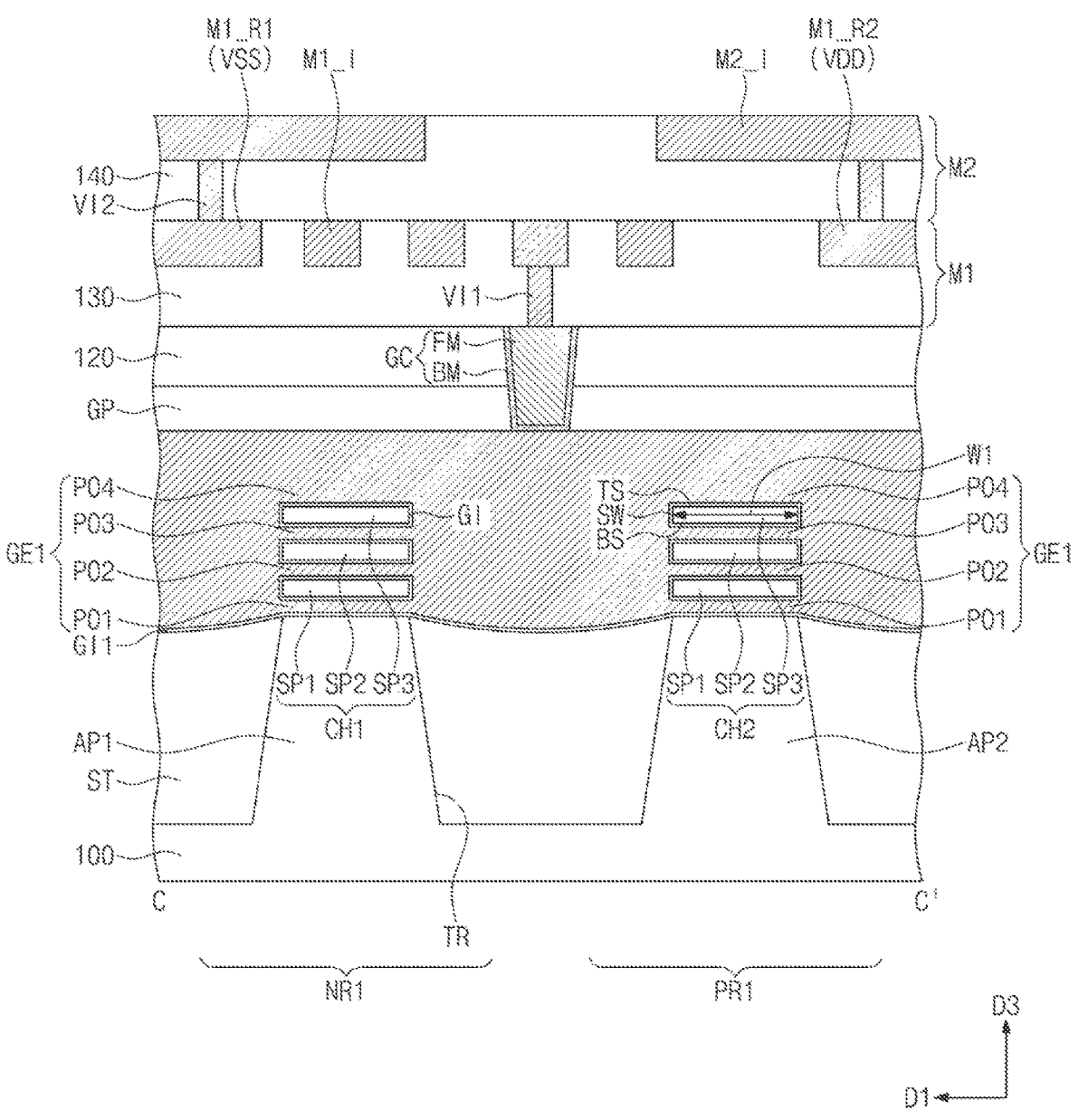
Figure 2D:
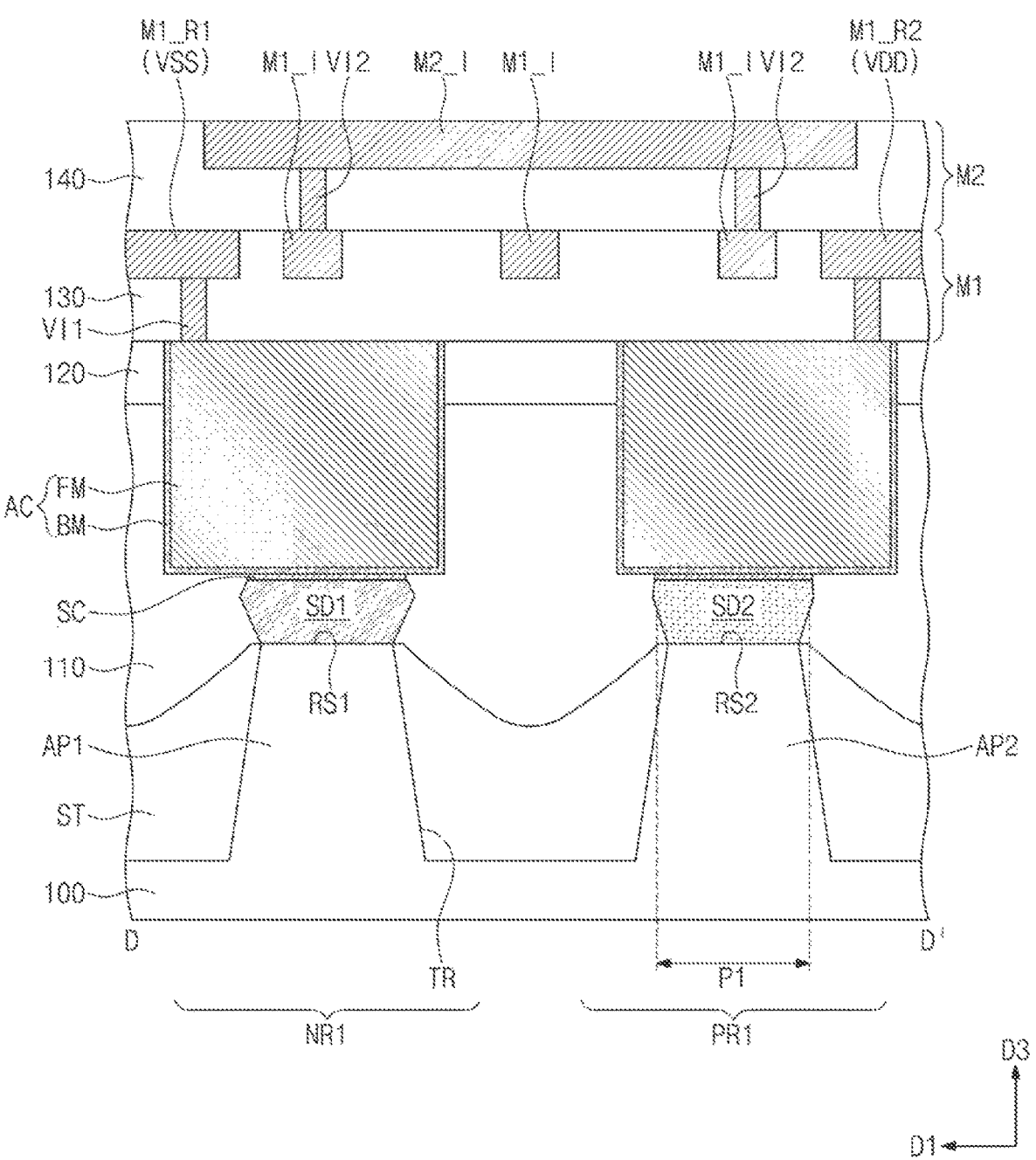
Figure 3A:
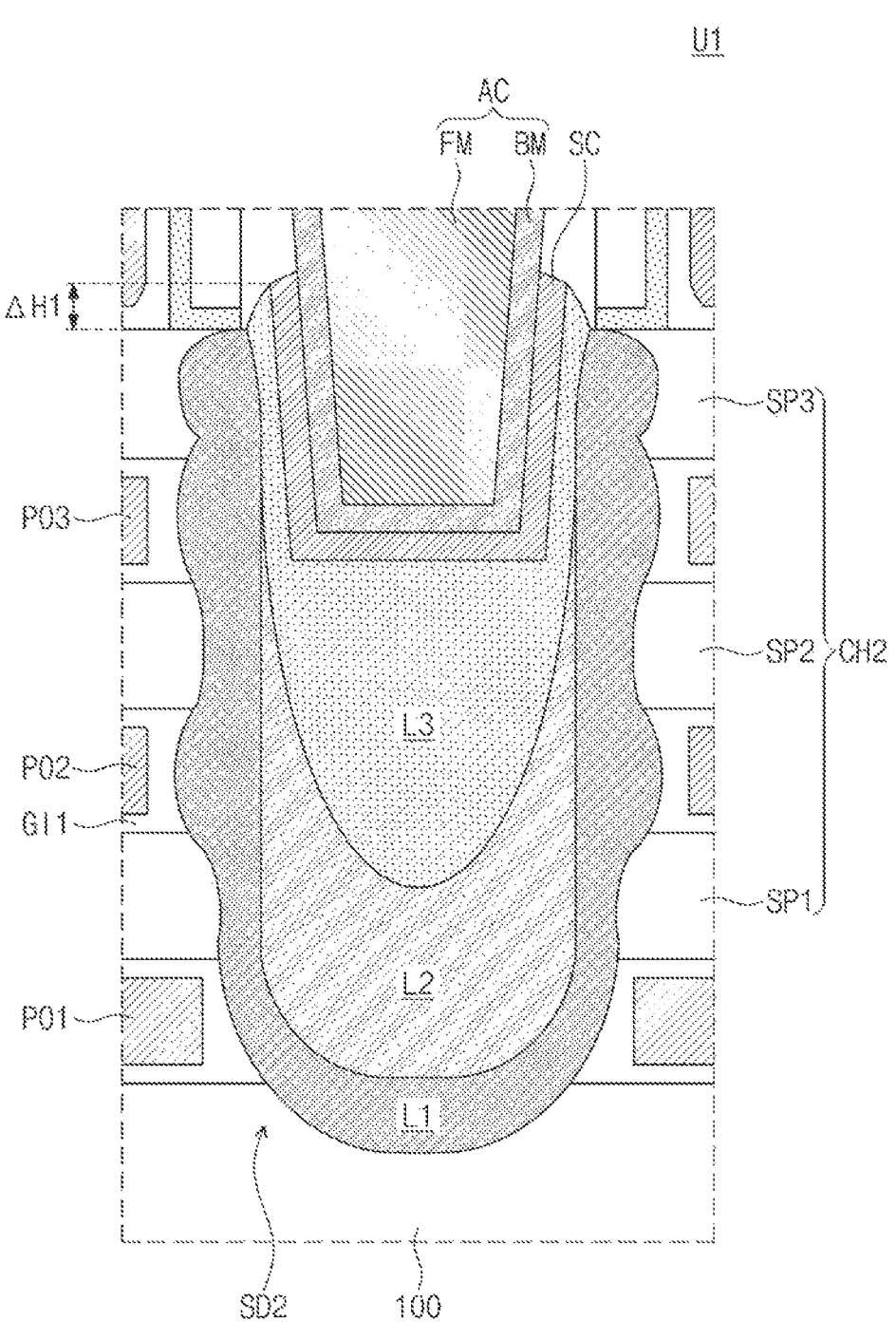
FIG. 3A illustrates an enlarged cross-sectional view showing section U1 of FIG. 2B.

Referring to FIGS. 2B and 3A, each of the second source/drain patterns SD2 may include a first semiconductor layer L1, a second semiconductor layer L2 on the first semiconductor layer L1, and a third semiconductor layer L3 on the second semiconductor layer L2. The first semiconductor layer L1 may be shaped like a letter U.

The second semiconductor layer L2 may be provided on the first semiconductor layer L1. The second semiconductor layer L2 may have a shape in which a lateral side thereof extends higher than a central side thereof. The third semiconductor layer L3 may fill a recess that the second semiconductor layer L2 does not fill. Each of the first, second, and third semiconductor layers L1, L2, and L3 may include silicon-germanium (SiGe). The first semiconductor layer L1 may contain germanium (Ge) whose concentration is relatively less than that of germanium contained in the second semiconductor layer L2, and the concentration of germanium contained in the second semiconductor layer L2 may be relatively less than that of germanium contained in the third semiconductor layer L3.

For example, the germanium concentration of the first semiconductor layer L1 may range from about 0 at % to about 15 at %, the germanium concentration of the second semiconductor layer L2 may range from about 30 at % to about 50 at %, and the germanium concentration of the third semiconductor layer L3 may range from about 50 at % to about 55 at %.

The first, second, and third semiconductor layers L1, L2, and L3 may include impurities (e.g., boron) that cause the second source/drain pattern SD2 to have a p-type conductivity. A concentration (e.g., atomic percent) of impurities in the third semiconductor layer L3 may be greater than that of impurities in the second semiconductor layer L2, and the concentration of impurities in the second semiconductor layer L2 may be greater than that of impurities in the first semiconductor layer L1.

About 5 nm or less may be given as a level difference $\Delta H1$ between a top surface of a semiconductor pattern (or the third semiconductor pattern SP3) positioned at top of the second channel pattern CH2 and a top surface of each of the second source/drain pattern SD2. That is, the level difference $\Delta H1$ may be from about 0 nm to about 5 nm. For example, the top surface of the semiconductor pattern (e.g., the third semiconductor pattern SP3) positioned at top of the second channel pattern CH2 may be located at a level the same as or higher than a level of the top surface of the second source/drain pattern SD2 ($\Delta H1=0\sim5$ nm). For another example, the top surface of the semiconductor pattern (e.g., the third semiconductor pattern SP3) positioned at top of the second channel pattern CH2 may be located at a level the same as or less than a level of the top surface of the second source/drain pattern SD2 ($\Delta H1=-5$ nm$\sim0$ nm).

Referring to FIGS. 2B and 3B, according to some embodiments, the second semiconductor layer L2 may be omitted from each of the second source/drain patterns SD2, and a fourth semiconductor layer L4 may be provided on the third semiconductor layer L3. The fourth semiconductor layer L4 may contain germanium (Ge) whose concentration is relatively greater than a concentration of germanium contained in the third semiconductor layer L3. For example, the germanium concentration of the fourth semiconductor layer L4 may range from about 55 at % to about 60 at %. The fourth semiconductor layer L4 may include impurities (e.g., boron) that cause the second source/drain pattern SD2 to have a p-type conductivity, and may have an impurity concentration greater than that of the third semiconductor layer L3.

Referring back to FIGS. 1 and 2A to 2D, a first gate electrode GE1 may be provided to extend in the first direction D1 while running across the first and second active patterns AP1 and AP2. The first gate electrode GE1 may extend from the first NMOSFET region NR1 toward the first PMOSFET region PR1. The first gate electrode GE1 may vertically overlap the first and second channel patterns CH1 and CH2. The first channel pattern CH1 may have a first width W1 in the first direction D1, and for example, the first width W1 may range from about 20 nm to about 75 nm.

The first gate electrode GE1 may include the first portion PO1 interposed between the substrate 100 and the first semiconductor pattern SP1, the second portion PO2 interposed between the first semiconductor pattern SP1 and the second semiconductor pattern SP2, the third portion PO3 interposed between the second semiconductor pattern SP2 and the third semiconductor pattern SP3, and the fourth portion PO4 on the third semiconductor pattern SP3.

Referring back to FIG. 2C, the first gate electrode GE1 may be provided to face a top surface TS, a bottom surface BS, and opposite sidewalls SW of each of the first, second, and third semiconductor patterns SP1, SP2, and SP3. For example, a transistor according to some embodiments may be a three-dimensional field effect transistor (e.g., multibridge channel field effect transistor (MBCFET) or a gate-all-around field effect transistor (GAAFET)) in which a gate electrode three-dimensionally surrounds a channel.

Referring again to FIGS. 1 and 2A to 2D, a pair of gate spacers GS may be disposed on opposite sidewalls of the first gate electrode GE1. That is, two gate spacers GS may be disposed with one gate spacer GS on each of opposite sidewalls of the first gate electrode GE1. The gate spacers GS may extend in the first direction D1 along the first gate electrode GE1. The gate spacers GS may have top surfaces higher than top surfaces of the first gate electrode GE1. In an embodiment, the top surfaces of the gate spacers GS may be coplanar with top surfaces of a first interlayer dielectric layer 110 which will be discussed below. The gate spacers GS may include at least one selected from SiCN, SiCON, and SiN. For example, the gate spacers GS may each include a multi-layer formed of at least two selected from SiCN, SiCON, and SiN.

A gate capping pattern GP may be provided on the first gate electrode GE1. The gate capping pattern GP may extend in the first direction D1 along the first gate electrode GE1. The gate capping pattern GP may include a material having an etch selectivity with respect to a first interlayer dielectric layer 110 and a second interlayer dielectric layer 120 which will be discussed below. For example, the gate capping pattern GP may include at least one selected from SiON, SiCN, SiCON, and SiN.

A first gate dielectric layer GI1 may be interposed between the first gate electrode GE1 and the first channel pattern CH1 and between the first gate electrode GE1 and the second channel pattern CH2. The first gate dielectric layer GI1 may directly cover the top surface TS, the bottom surface BS, and the opposite sidewalls SW of each of the first, second, and third semiconductor patterns SP1, SP2, and SP3 (see FIG. 2C). The first gate dielectric layer GI1 may extend along a bottom surface of the first gate electrode GE1 that overlies the first gate dielectric layer GI1. The first gate dielectric layer GI1 may cover a top surface of the device isolation layer ST that underlies the first gate electrode GE1.

In some embodiments, the first gate dielectric layer GI1 may include one or more of a silicon oxide layer, a silicon oxynitride layer, and a high-k dielectric layer. The high-k dielectric layer may include a high-k dielectric material whose dielectric constant is greater than a dielectric constant of a silicon oxide layer. For example, the high-k dielectric material may include at least one selected from hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

The first gate electrode GE1 may include a first metal pattern and a second metal pattern on the first metal pattern. The first gate dielectric layer GI1 may be provided thereon with the first metal pattern adjacent to the first and second channel patterns CH1 and CH2. The first metal pattern may include a work-function metal that controls a threshold voltage of a transistor. A thickness and composition of the first metal pattern may be adjusted to achieve a target threshold voltage of a transistor.

The first metal pattern may include a metal nitride layer. For example, the first metal pattern may include nitrogen (N) and at least one metal selected from titanium (Ti), tantalum (Ta), aluminum (Al), tungsten (W), and molybdenum (Mo). In addition, the first metal pattern may further include carbon (C). The first metal pattern may include a plurality of stacked work-function metal layers.

The second metal pattern may include metal whose resistance is less than a resistance of the first metal pattern. For example, the second metal pattern may include at least one metal selected from tungsten (W), aluminum (Al), titanium (Ti), and tantalum (Ta).

Although not shown, in some embodiments, the second metal pattern may not be included in any of the first, second, and third portions PO1, PO2, and PO3 of the first gate electrode GE1, and may be included only in the fourth portion PO4 of the first gate electrode GE1. That is, the second metal pattern may be omitted from each of the first, second, and third portions PO1, PO2, and PO3 of the first gate electrode GE1, and may be included only in the fourth portion PO4 of the first gate electrode GE1. For example, the first, second, and third portions PO1, PO2, and PO3 of the first gate electrode GE1 may include only the first metal pattern, or a work-function metal layer. The fourth portion PO4 of the first gate electrode GE1 may include a first metal pattern and a second metal pattern on the first metal pattern.

Referring back to FIG. 2A, inner spacers ISP may be provided on the first NMOSFET region NR1. The inner spacers ISP may be correspondingly interposed between the first source/drain pattern SD1 and each of the first, second, and third portions PO1, PO2, and PO3 of the first gate electrode GE1. The inner spacers ISP may be in direct contact with the first source/drain pattern SD1. The inner spacer ISP may separate the first source/drain pattern SD1 from each of the first, second, and third portions PO1, PO2, and PO3 of the first gate electrode GE1.

The inner spacer ISP may include a low-k dielectric material. The low-k dielectric material may include a material whose dielectric constant is less than a dielectric constant of silicon oxide or silicon nitride. For example, the low-k dielectric material may include at least one selected from silicon oxide, silicon oxide doped with fluorine or carbon, porous silicon oxide, and organic polymeric dielectrics.

The first interlayer dielectric layer 110 may be provided on the substrate 100. The first interlayer dielectric layer 110 may cover the gate spacers GS and the first and second source/drain patterns SD1 and SD2. The first interlayer dielectric layer 110 may have a top surface substantially coplanar with that of the gate capping pattern GP. The first interlayer dielectric layer 110 may be provided thereon with the second interlayer dielectric layer 120 that covers the gate capping pattern GP. For example, the first and second interlayer dielectric layers 110 and 120 may include a silicon oxide layer.

Active contacts AC may be provided to penetrate the first and second interlayer dielectric layers 110 and 120 to come into electrical connection with the first and second source/drain patterns SD1 and SD2. A pair of active contacts AC may be provided on opposite sides of the first gate electrode GE1. That is, in some embodiments, two active contacts AC may be provided with one active contact AC on each of opposite sides of the first gate electrode GE1. When viewed in plan, the active contact AC may have a bar shape that extends in the first direction D1.

The active contact AC may include a conductive pattern FM and a bather pattern BM that surrounds the conductive pattern FM. For example, the conductive pattern FM may include at least one metal selected from aluminum, copper, tungsten, molybdenum, and cobalt. The barrier pattern BM may cover sidewalls and a bottom surface of the conductive pattern FM. The barrier pattern BM may include a metal layer and a metal nitride layer. The metal layer may include at least one selected from titanium, tantalum, tungsten, nickel, cobalt, and platinum. The metal nitride layer may include at least one selected from a titanium nitride (TiN) layer, a tantalum nitride (TaN) layer, a tungsten nitride (WN) layer, a nickel nitride (NiN) layer, a cobalt nitride (CoN) layer, and a platinum nitride (PtN) layer.

The active contact AC may be a self-aligned contact. For example, the gate capping pattern GP and the gate spacer GS may be used to form the active contact AC in a self-alignment manner. The active contact AC may cover, for example, at least a portion of a sidewall of the gate spacer GS. Although not shown, in some embodiments, the active contact AC may cover a portion of the top surface of the gate capping pattern GP.

A silicide pattern SC may be interposed between the active contact AC and the first source/drain pattern SD1 and between the active contact AC and the second source/drain pattern SD2. The active contact AC may be electrically connected through the silicide pattern SC to one of the first and second source/drain patterns SD1 and SD2. The silicide pattern SC may include metal silicide, for example, at least one selected from titanium silicide, tantalum silicide, tungsten silicide, nickel silicide, and cobalt silicide.

A gate contact GC may be provided to penetrate the second interlayer dielectric layer 120 and the gate capping pattern GP to come into electrical connection with the first gate electrode GE1. The gate contact GC may be provided on the device isolation layer ST between the first NMOSFET region NR1 and the first PMOSFET region PR1. When viewed in plan, the gate contact GC may have a bar shape that extends in the second direction D2. Likewise the active contact AC, the gate contact GC may include a conductive pattern FM and a bather pattern BM that surrounds the conductive pattern FM.

A third interlayer dielectric layer 130 may be provided on the second interlayer dielectric layer 120. A first metal layer M1 may be provided in the third interlayer dielectric layer 130. The first metal layer M1 may include first lines M1_I and first vias VI1. The first vias VI1 may be provided below the first lines M1_I. The first lines M1_I may be disposed along the first direction D1. Each of the first lines M1_I may have a linear or bar shape that extends in the second direction D2.

The first vias VI1 may be correspondingly provided below the first lines M1_I of the first metal layer M1. The first vias VI1 may be correspondingly interposed between the active contacts AC and the first lines M1_I. The first vias VI1 may be correspondingly interposed between the gate contacts GC and the first lines M1_I.

The first line M1_I and its underlying first via VI1 of the first metal layer M1 may be formed by individual processes. For example, the first lines M1_I and the first vias VI1 may each be formed by a single damascene process. A sub-20 nm process may be employed to fabricate a semiconductor device according to some embodiments.

A fourth interlayer dielectric layer 140 may be provided on the third interlayer dielectric layer 130. A second metal layer M2 may be provided in the fourth interlayer dielectric layer 140. The second metal layer M2 may include second lines M2_I. Each of the second lines M2_I may have a linear or bar shape that extends in the first direction D1. For example, the second lines M2_I may extend in parallel to each other in the first direction D1.

The second metal layer M2 may further include second vias VI2. The second vias VI2 may be provided below the second lines M2_I. The second vias VI2 may be correspondingly interposed between the first lines M1_I and the second lines M2_I.

The second line M2_I and an underlying second via VI2 of the second metal layer M2 may be formed into a single piece in the same process. For example, a dual damascene process may be employed to simultaneously form the second line M2_I and the second via VI2 of the second metal layer M2.

The first lines M1_I of the first metal layer M1 and the second lines M2_I of the second metal layer M2 may include the same or different conductive materials. For example, the first lines M1_I and the second lines M2_I may include at least one metal selected from copper (Cu), ruthenium (Ru), cobalt (Co), tungsten (W), aluminum (Al), and molybdenum (Mo).

In some embodiments, although not shown, metal layers (e.g., M3, M4, M5, etc.) may be additionally stacked on the fourth interlayer dielectric layer 140. Each of the stacked metal layers may include routing lines.

With reference to FIGS. 1 and 2E to 2H, the following will discuss in detail a transistor on the second region RG2. Repeated description will be omitted for conciseness and to avoid repetitive technical features to the technical features of the transistor on the first region RG1 discussed with reference to FIGS. 1 and 2A to 2D, and a difference thereof will be described in detail.

The second region RG2 may include a second NMOSFET region NR2 and a second PMOSFET region PR2. The second NMOSFET region NR2 and the second PMOSFET region PR2 may be defined by a trench TR formed on an upper portion of the substrate 100. The device isolation layer ST that fills the trench TR may define a third active pattern AP3 and a fourth active pattern AP4. The second NMOSFET region NR2 and the second PMOSFET region PR2 may be respectively provided on the third active pattern AP3 and the further active pattern AP4.

A third channel pattern CH3 may be provided on the third active pattern AP3, and a fourth channel pattern CH4 may be provided on the fourth active pattern AP4. Each of the third and fourth channel patterns CH3 and CH4 may include first, second, and third semiconductor patterns SP1, SP2, and SP3 that are sequentially stacked.

Each of the first, second, and third semiconductor patterns SP1, SP2, and SP3 of the third and fourth channel patterns CH3 and CH4 may have a width in the first direction D1 less than a width of each of the first, second, and third semiconductor patterns SP1, SP2, and SP3 of the first and second channel patterns CH1 and CH2. For example, each of the first, second, and third semiconductor patterns SP1, SP2, and SP3 of the fourth channel pattern CH4 may have a second width W2 in the first direction D1, and the second width W2 may be less than the first width W1 (see FIG. 1). For example, in some embodiments, the second width W2 may be in a range of greater than about 0 nm and less than about 20 nm. In some embodiments, the second width W2 may be in a range of about 10 nm to about 20 nm.

A width in the second direction D2 of the fourth channel pattern CH4 may be substantially the same as a width in the second direction D2 of the second channel pattern CH2. According to some embodiments, the fourth channel pattern CH4 and the second channel pattern CH2 may have widths in the second direction D2 that are different from each other, and a difference in width in the second direction D2 may be equal to or less than about 5 nm.

Third source/drain patterns SD3 may be provided on an upper portion of the third active pattern AP3. Fourth source/drain patterns SD4 may be provided on an upper portion of the fourth active pattern AP4. The first, second, and third semiconductor patterns SP1, SP2, and SP3 of the third channel pattern CH3 may be interposed between a pair of (e.g., two) third source/drain patterns SD3. The first, second, and third semiconductor patterns SP1, SP2, and SP3 of the fourth channel pattern CH4 may be interposed between a pair of (e.g., two) fourth source/drain patterns SD4.

Each of the third source/drain patterns SD3 may be an epitaxial pattern containing impurities of the first conductivity type (e.g., n-type). Each of the fourth source/drain patterns SD4 may be an epitaxial pattern containing impurities of the second conductivity type (e.g., p-type).

The third and fourth source/drain patterns SD3 and SD4 may have lengths in the first direction D1 less than lengths in the first direction D1 of the first and second source/drain patterns SD1 and SD2 discussed above. For example, the second source/drain pattern SD2 may have a first length P1 in the first direction DE and the fourth source/drain pattern SD4 may have a second length P2 in the first direction D1. At the same level, the first length P1 may be greater than the second length P2 (see FIGS. 2D and 2H).

In some embodiments, the fourth source/drain pattern SD4 may have an uneven embossing shape on a sidewall thereof. For example, the sidewall of the fourth source/drain pattern SD4 may have a wavy profile. The sidewall of the fourth source/drain pattern SD4 may protrude toward a first portion PO1, a second portion PO2, and a third portion PO3 of the second gate electrode GE2.

Referring to FIGS. 2F and 4A, each of the fourth source/drain patterns SD4 may include a first semiconductor layer L1, a second semiconductor layer L2, a third semiconductor layer L3, and a fourth semiconductor layer L4 that are sequentially stacked. As discussed above with reference to FIGS. 3A and 3B, the first, second, third, and fourth semiconductor layers L1, L2, L3, and L4 may have germanium concentrations that increase in a direction from the first semiconductor layer L1 toward fourth semiconductor layer L4.

About 5 nm or less may be given as a level difference $\Delta H2$ between a top surface of a semiconductor pattern (or the third semiconductor pattern SP3) positioned at top of the fourth channel pattern CH4 and a top surface of each of the fourth source/drain pattern SD4. That is, the level difference $\Delta H2$ may be above 0 nm to about 5 nm.

For example, the top surface of the semiconductor pattern (e.g., the third semiconductor pattern SP3) positioned at top of the fourth channel pattern CH4 may be located at a level the same as or less than a level of the top surface of the fourth source/drain pattern SD4 ($\Delta H2=-5$ nm~0 nm) (overgrowth of source/drain pattern).

For another example, the top surface of the semiconductor pattern (e.g., the third semiconductor pattern SP3) positioned at top of the fourth channel pattern CH4 may be located at a level the same as or higher than a level of the top surface of the fourth source/drain pattern SD4 ($\Delta H2=0$~5 nm) (undergrowth of source/drain pattern).

The first semiconductor layer L1 may be shape like the letter U when viewed in vertical section, and may have a shape in which a bottom side thereof is thicker than a lateral side thereof.

In comparison of FIGS. 3A and 3B with FIGS. 4A and 4B, according to some embodiments, the first semiconductor layers L1 of the second source/drain patterns SD2 may each have a shape in which a bottom side thereof is thicker than a lateral side thereof. However, a ratio of bottom side thickness to lateral side thickness of the first semiconductor layer L1 included in the fourth source/drain pattern SD4 may be greater than a ratio of bottom side thickness to lateral side thickness of the first semiconductor layer L1 included in the second source/drain pattern SD2.

The fourth source/drain pattern SD4 may further include at least one semiconductor layer, compared to the second source/drain pattern SD2.

Second gate electrodes GE2 may be provided to extend in the first direction D1 while running across the third and fourth channel patterns CH3 and CH4. The second gate electrode GE2 may extend from the second NMOSFET region NR2 toward the second PMOSFET region PR2. The second gate electrode GE2 may vertically overlap the third and fourth channel patterns CH3 and CH4.

A pair of gate spacers GS may be disposed on opposite sidewalls of the second gate electrode GE2. That is, in some embodiments, two gate spacers GS may be disposed, with one gate spacer GS on each of opposite sidewalls of the second gate electrode GE2. A gate capping pattern GP may be provided on the second gate electrode GE2.

Similar to the first gate electrode GE1, the second gate electrode GE2 may include first, second, third, and fourth portions PO1, PO2, PO3, and PO4. The second gate electrode GE2 may be provided to face a top surface, a bottom surface, and opposite sidewalls of each of the first, second, and third semiconductor patterns SP1, SP2, and SP3. For example, a transistor on the second region RG2 may also be a three-dimensional field effect transistor (e.g., MBCFET or GAAFET).

Referring back to FIGS. 1 and 2E to 2H, a second gate dielectric layer GI2 may be interposed between the second gate electrode GE2 and the third channel pattern CH3 and between the second gate electrode GE2 and the fourth channel pattern CH4. The second gate dielectric layer GI2 may directly cover the top surface, the bottom surface, and the opposite sidewalls of each of the first, second, and third semiconductor patterns SP1, SP2, and SP3 (see FIG. 2G). The second gate dielectric layer GI2 may include one or more of a silicon oxide layer, a silicon nitride layer, and a high-k dielectric layer.

Figure 2E:
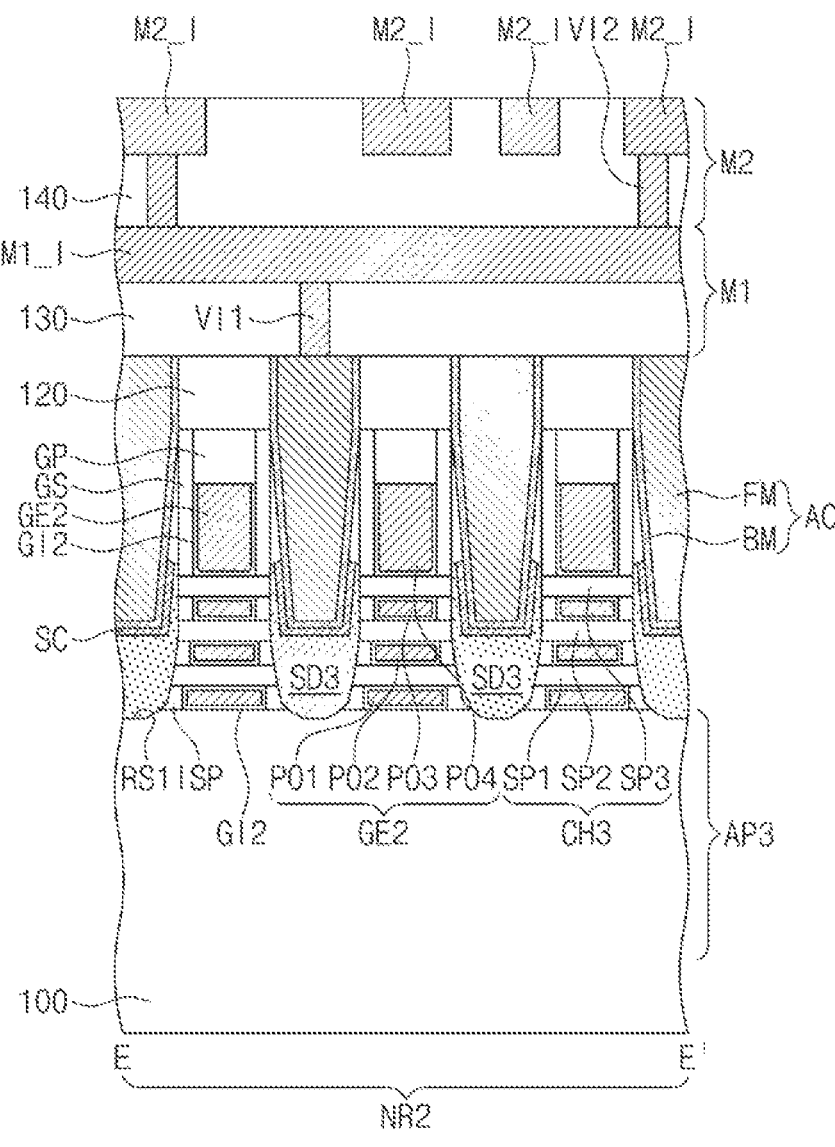
Figure 2E:
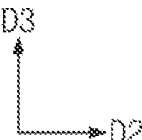
Figure 2F:
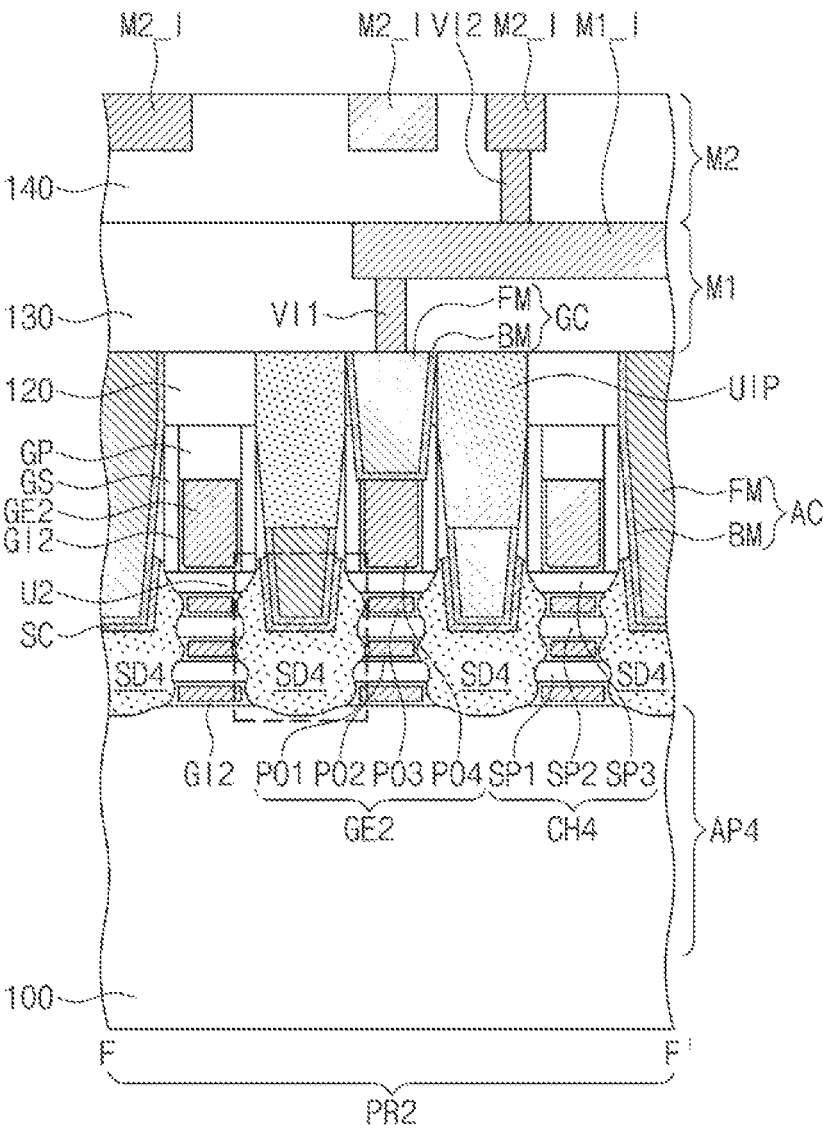
Figure 2F:
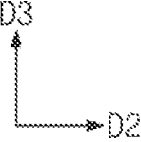
Figure 2G:
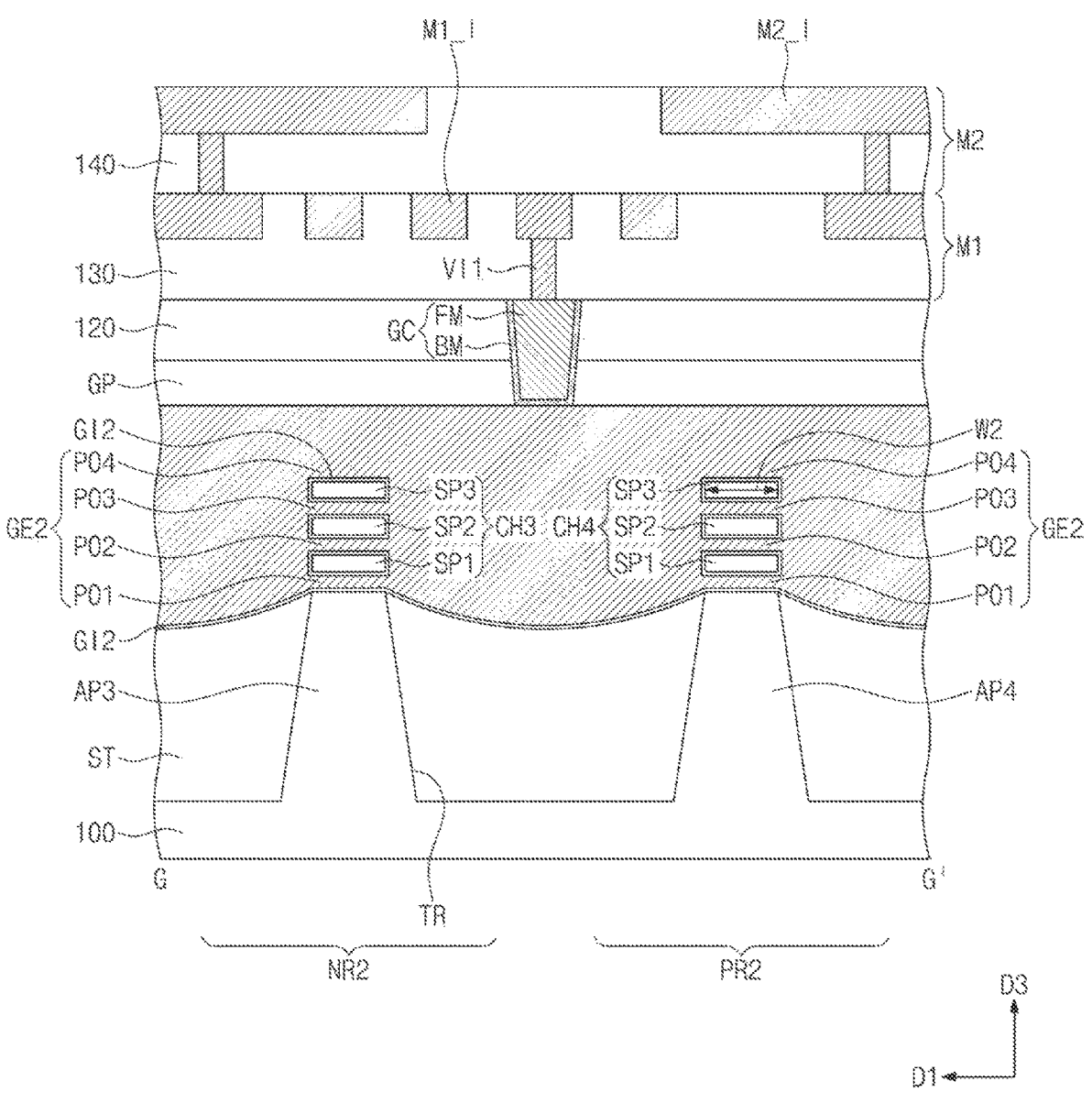
Figure 2H:
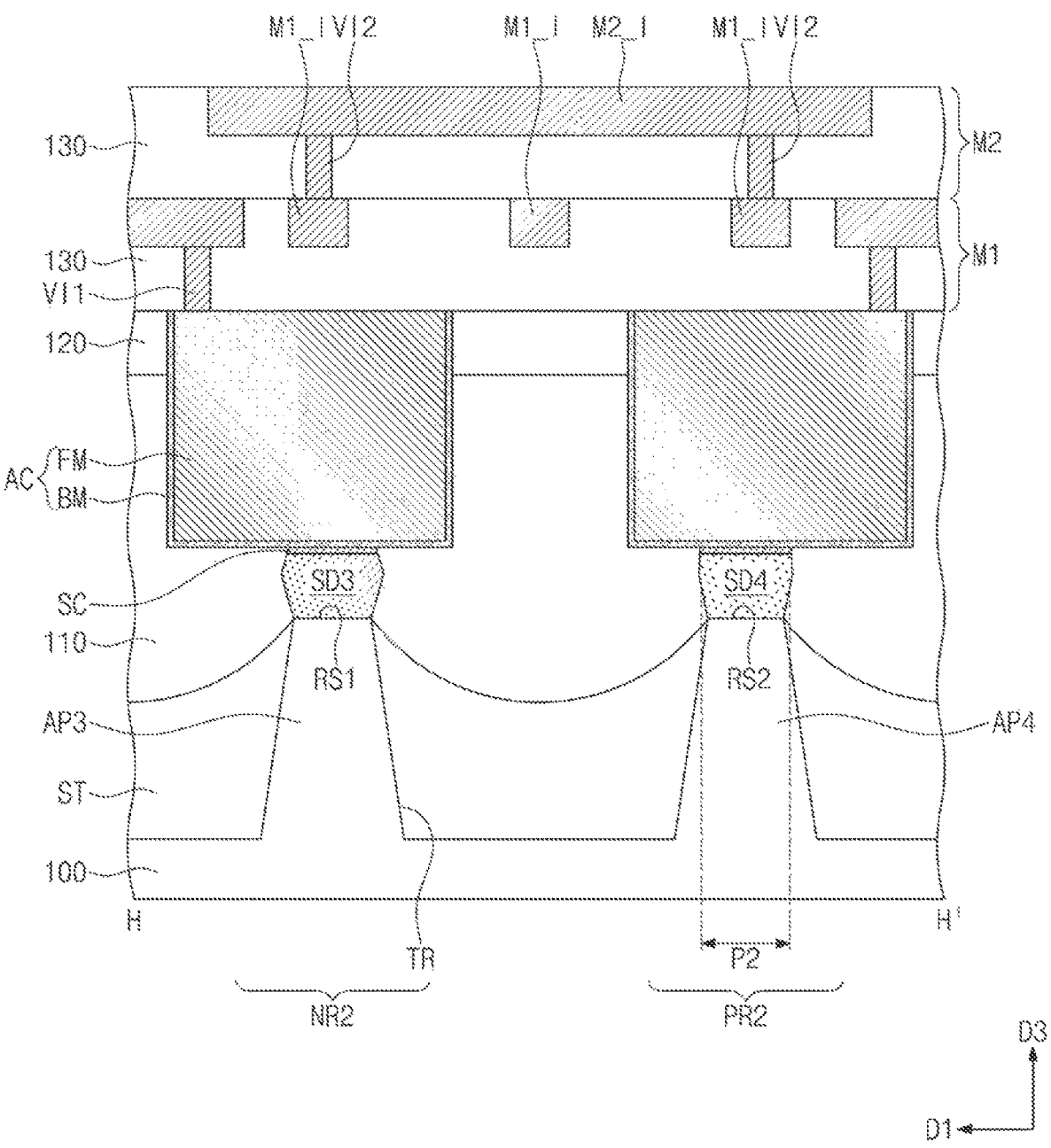

Inner spacers ISP may be provided on the second NMOSFET region NR2 (see FIG. 2E). In some embodiments, the inner spacers ISP may be correspondingly interposed between the third source/drain patterns SD3 and each of the first, second, and third portions PO1, PO2, and PO3 of the second gate electrode GE2. In some embodiments, the inner spacers ISP may be omitted from the second PMOSFET region PR2.

A first interlayer dielectric layer 110 and a second interlayer dielectric layer 120 may be provided on an entire surface of the substrate 100. Active contacts AC may be provided to penetrate the first and second interlayer dielectric layers 110 and 120 to come into connection with the third and fourth source/drain patterns SD3 and SD4. A gate contact GC may be provided to penetrate the second interlayer dielectric layer 120 and the gate capping pattern GP to come into electrical connection with the second gate electrode GE2. A first metal layer M1 and a second metal layer M2 may be provided on the second interlayer dielectric layer 120. A detailed description of the active contacts AC, the gate contact GC, the first metal layer M1, and the second metal layer M2 may be substantially the same as that discussed above with reference to FIGS. 1 and 2A to 2D.

FIGS. 5, 7, 9, 11, 14, 17, 19, and 21 illustrate plan views showing a method of fabricating a semiconductor device according to some embodiments. FIGS. 6A, 8A, 10A, 12A, 15A, 18A, 20A, and 22A illustrate cross-sectional views taken along line A-A' of FIGS. 5, 7, 9, 11, 14, 17, 19, and 21, respectively. FIGS. 6B, 8B, 10B, 12B, 15B, 18B, 20B, and 22B illustrate cross-sectional views taken along line B-B' of FIGS. 5, 7, 9, 11, 14, 17, 19, and 21, respectively.

Figure 10A:
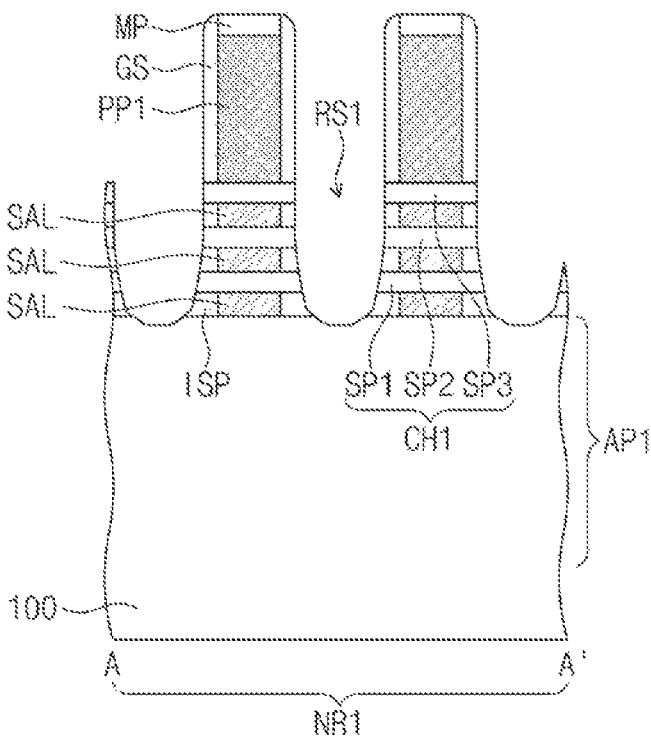
Figure 10A:
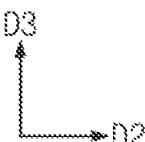
Figure 10B:
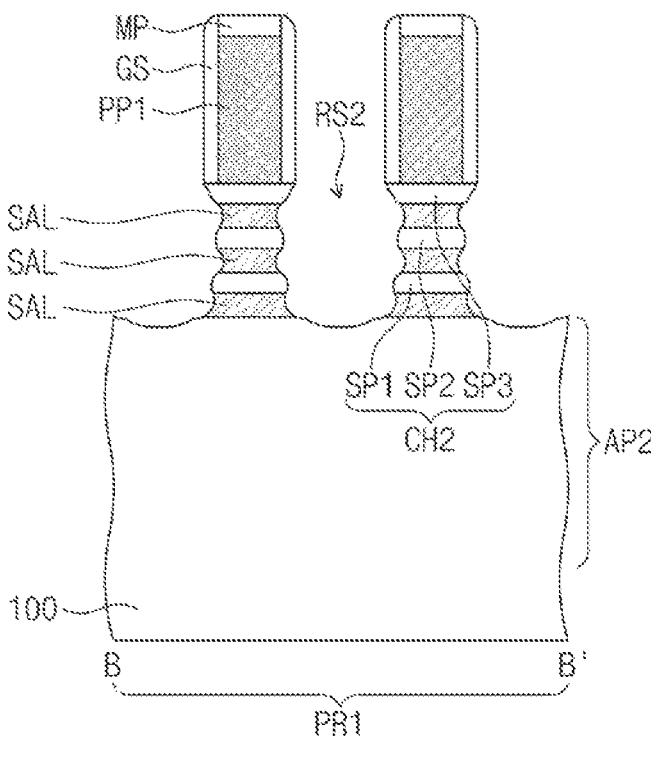
Figure 10C:
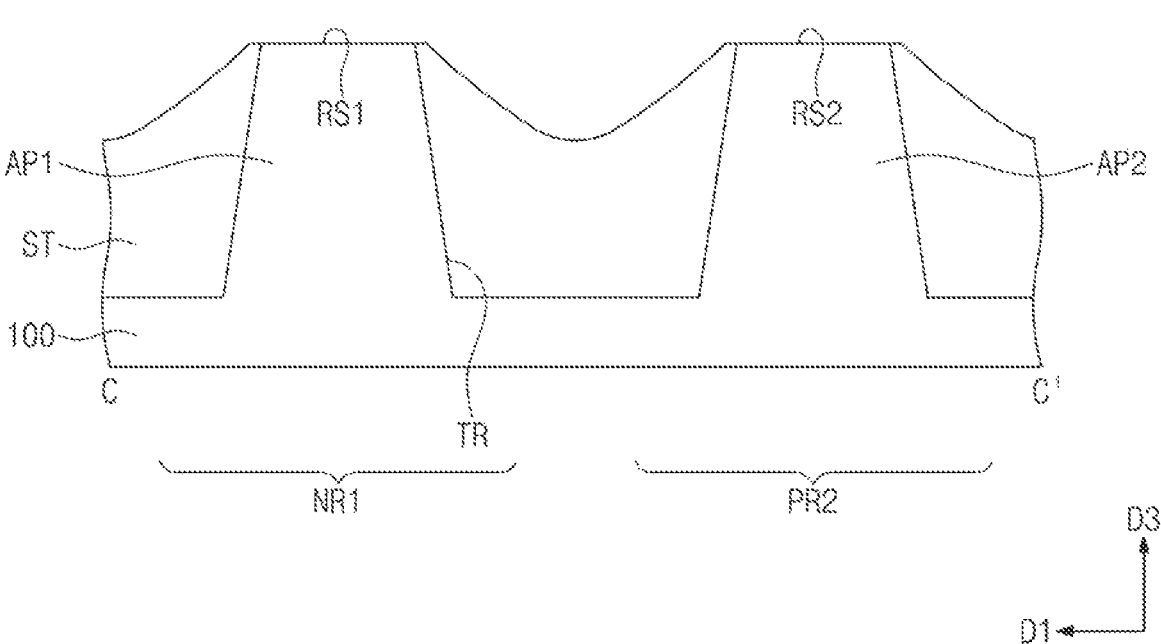
Figure 10D:
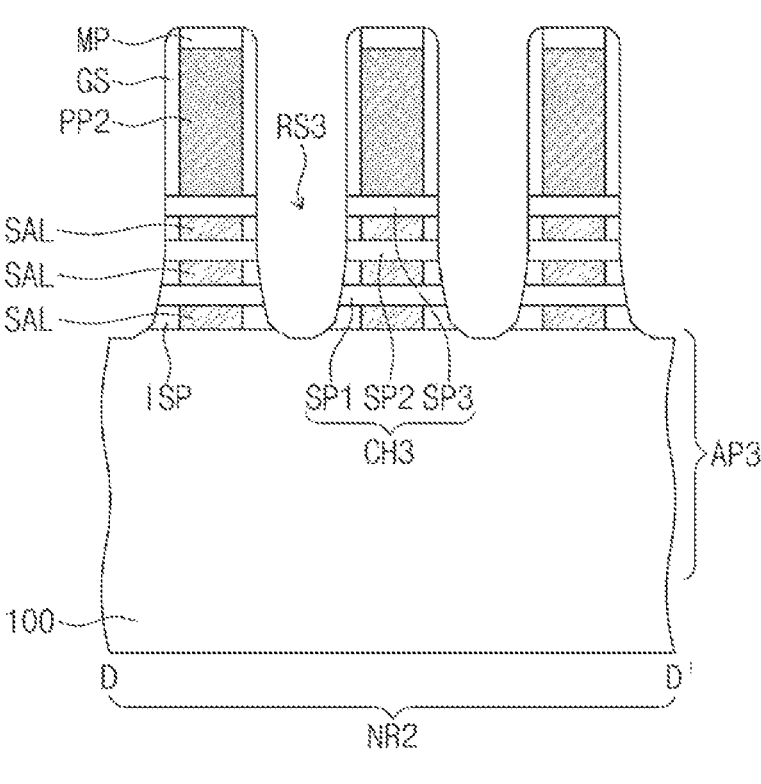
Figure 10E:
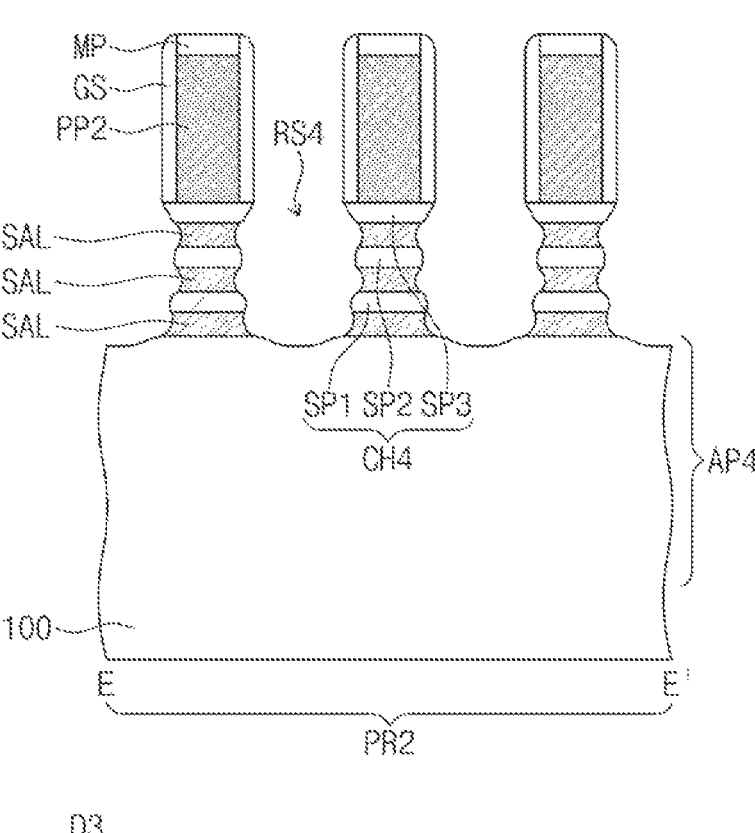
FIGS. 10E, 20E, and 22E illustrate cross-sectional views taken along line E-E' of FIGS. 9, 19, and 21, respectively.
Figure 10F:
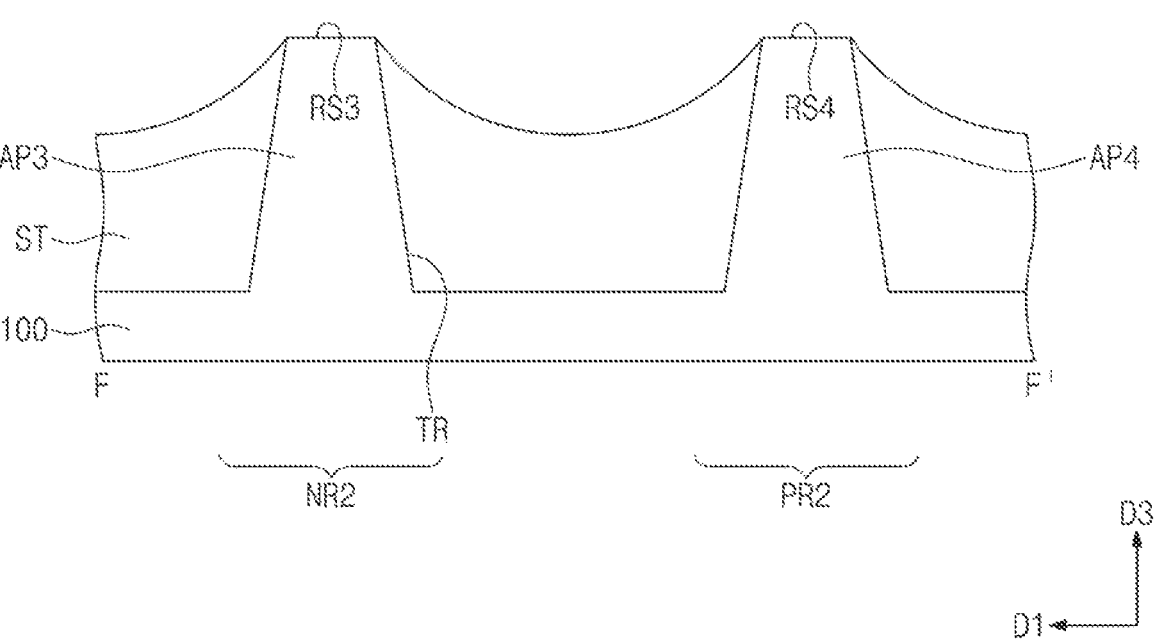
FIGS. 10F, 20F, and 22F illustrate cross-sectional views taken along line F-F' of FIGS. 9, 19, and 21, respectively.
Figure 20A:
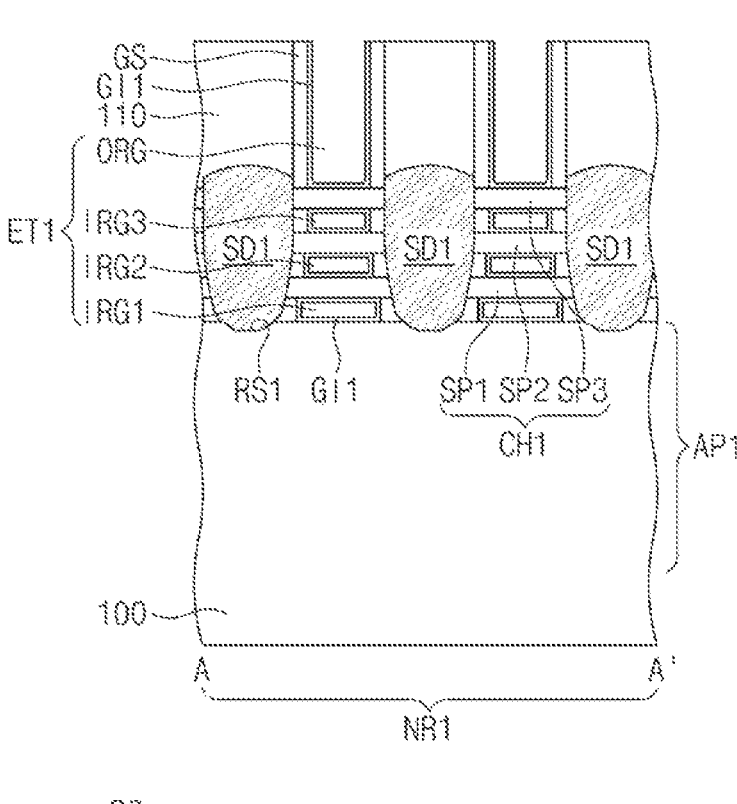
Figure 20A:
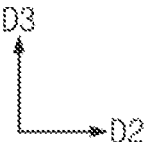
Figure 20B:
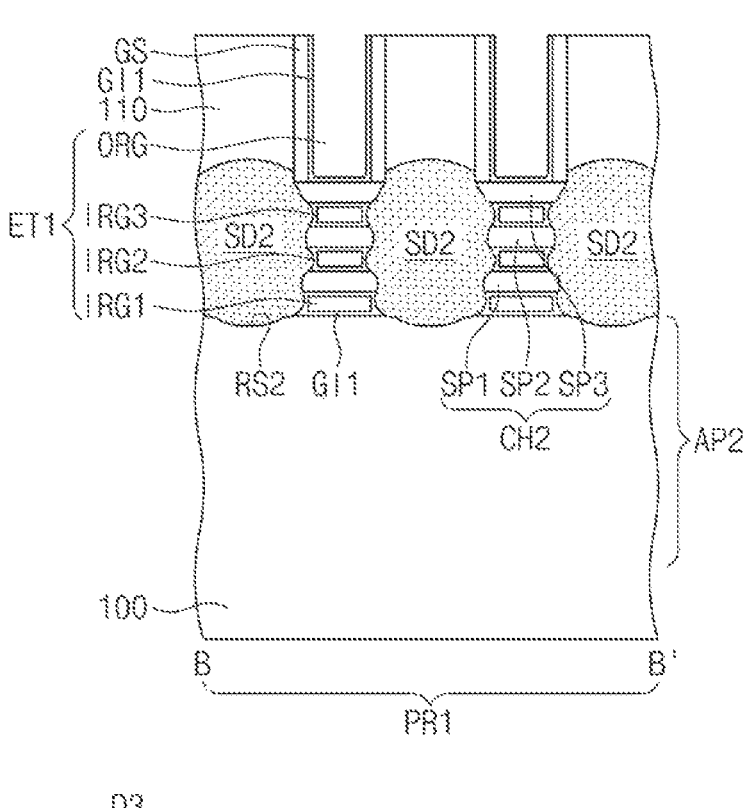
Figure 20C:
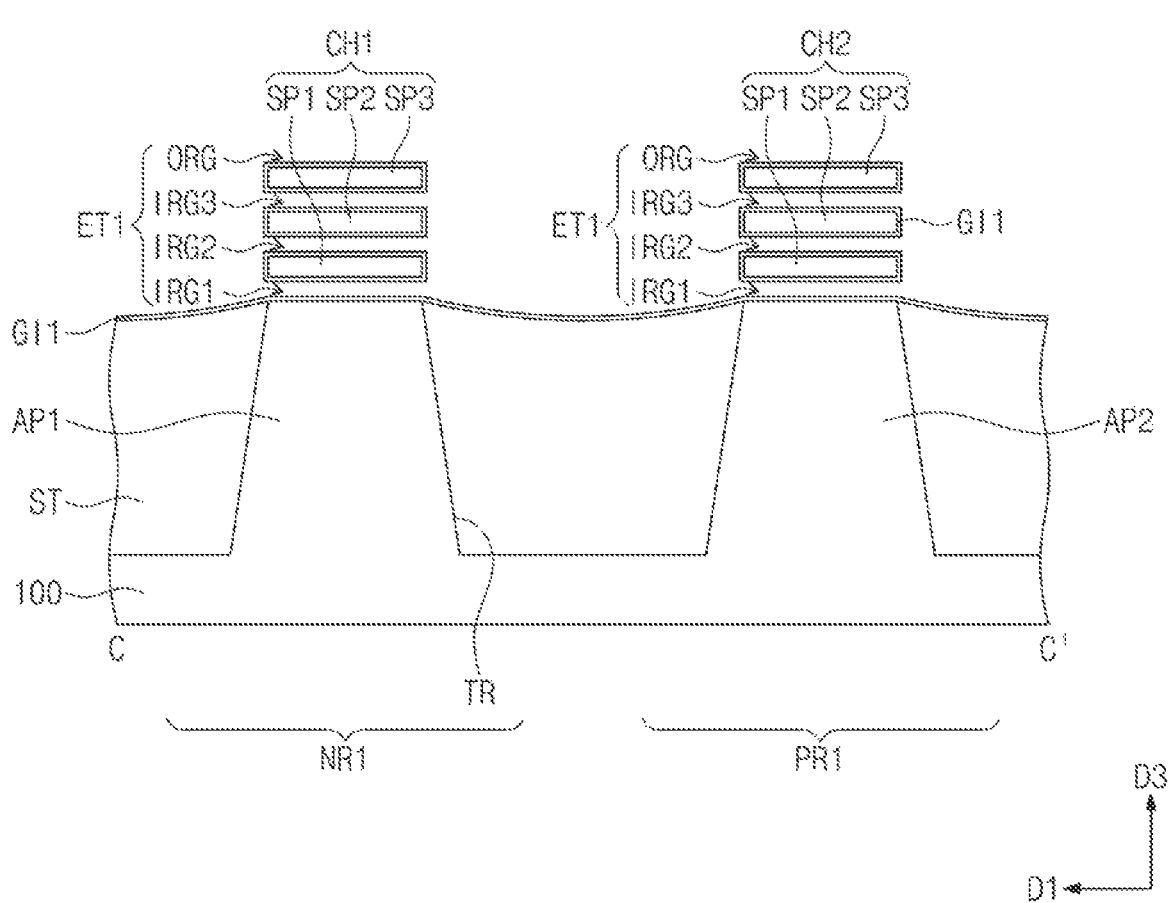
Figure 20D:
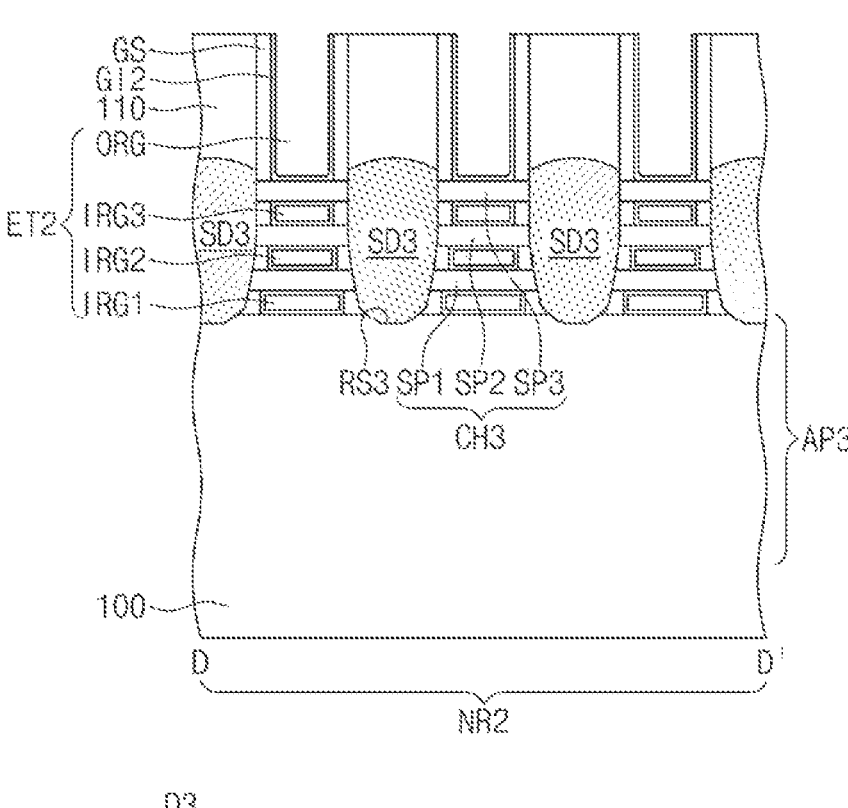
Figure 20E:
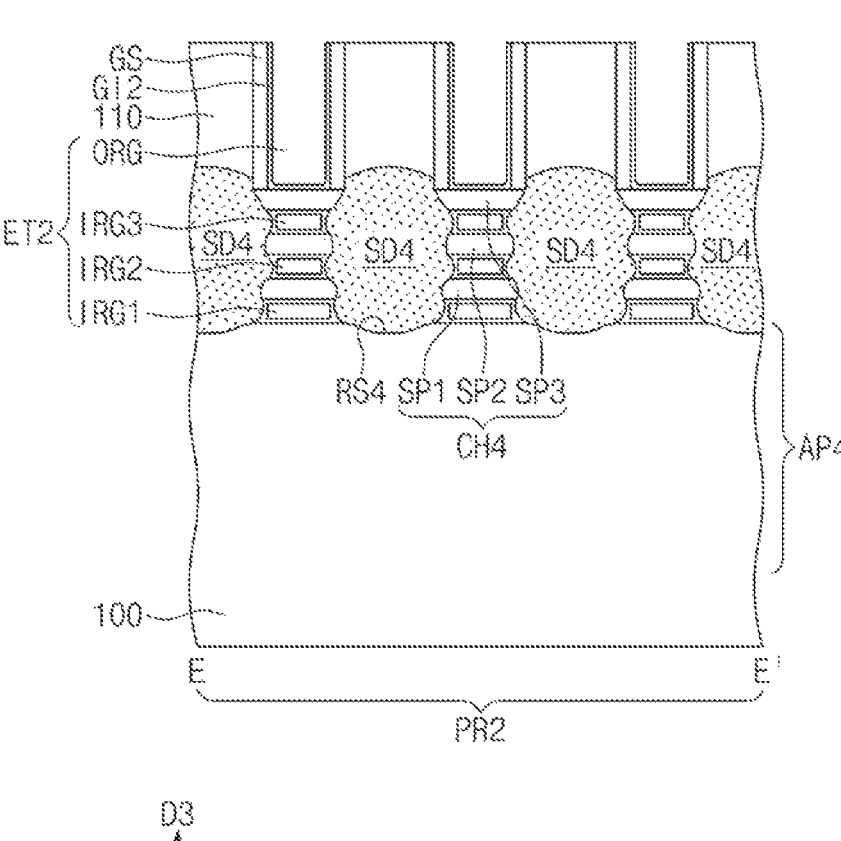
Figure 20F:
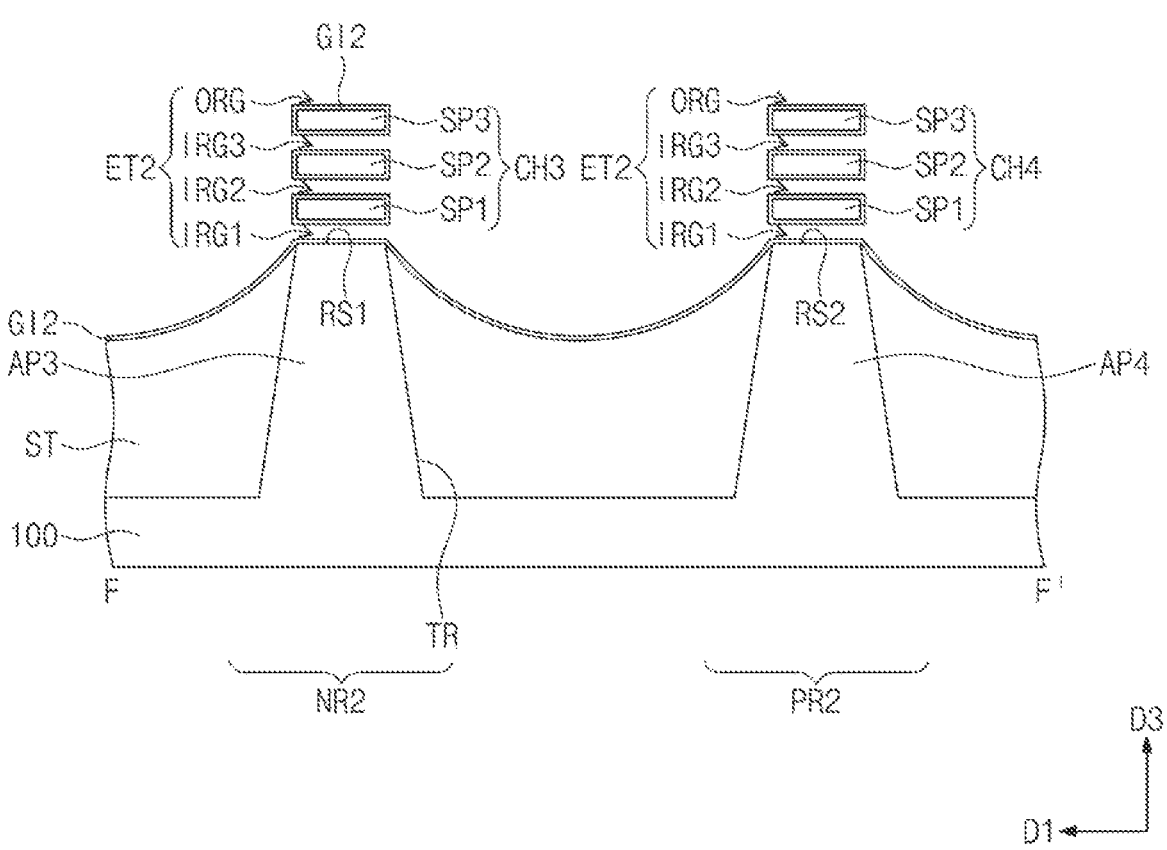
Figure 21:
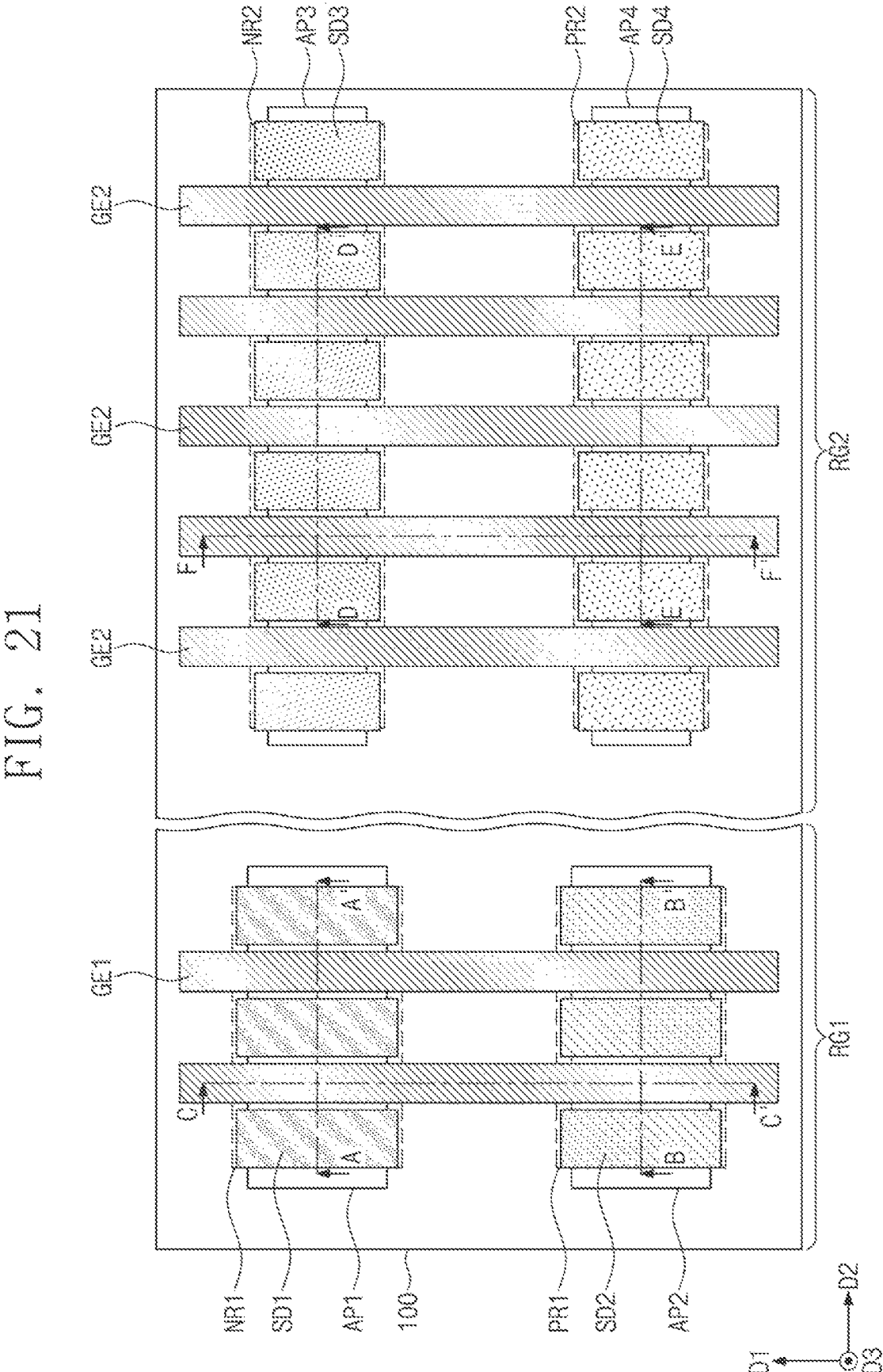
Figure 22A:
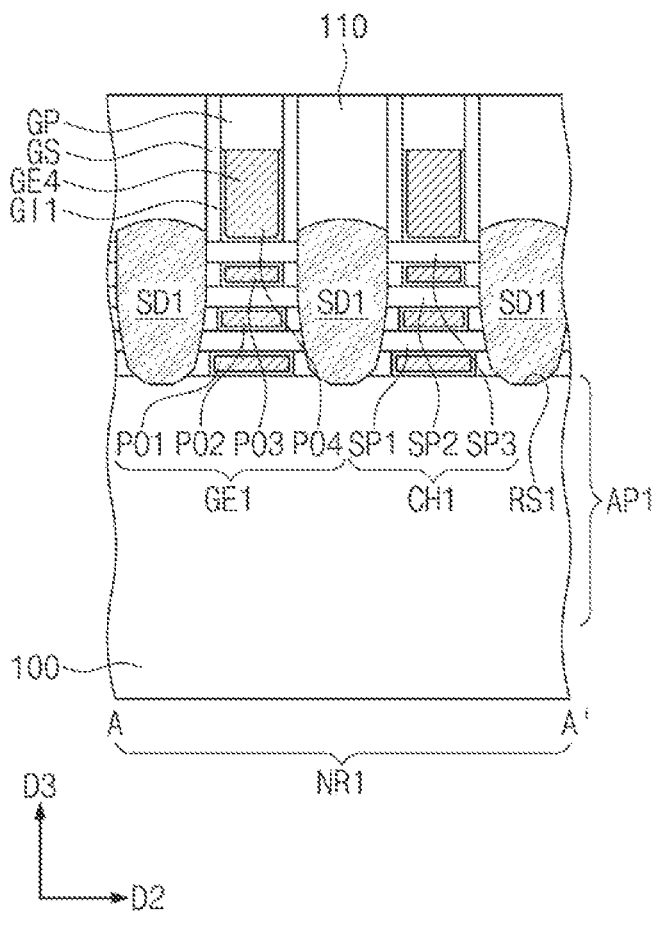
Figure 22B:
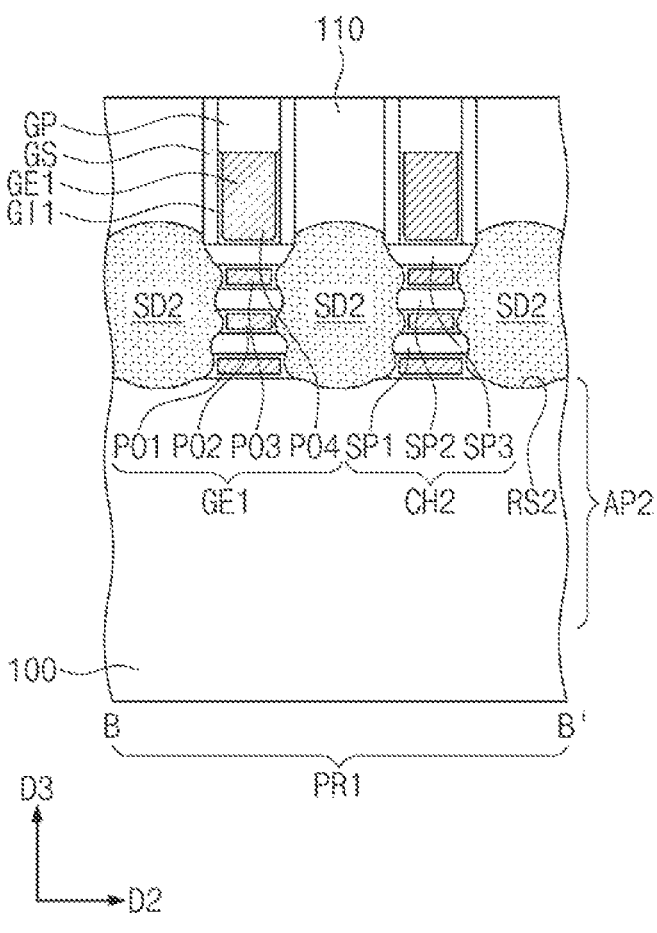
Figure 22C:
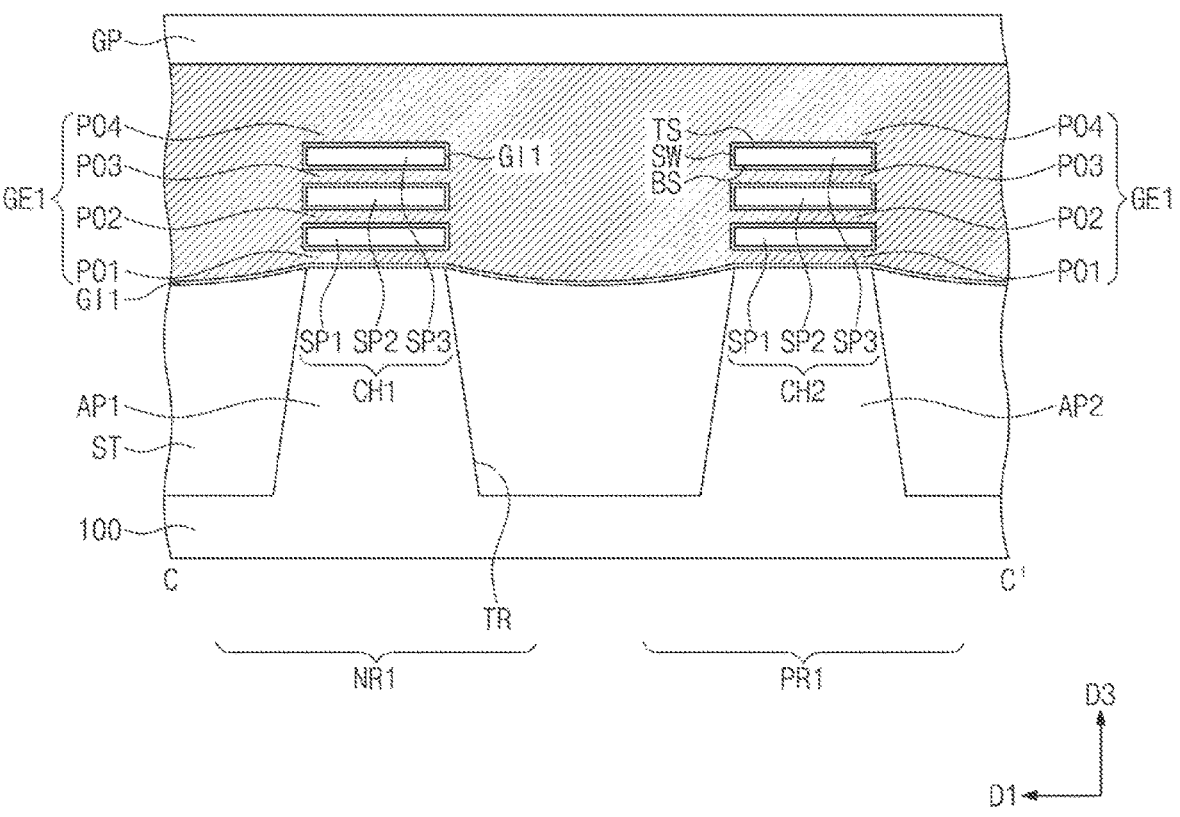
Figure 22D:
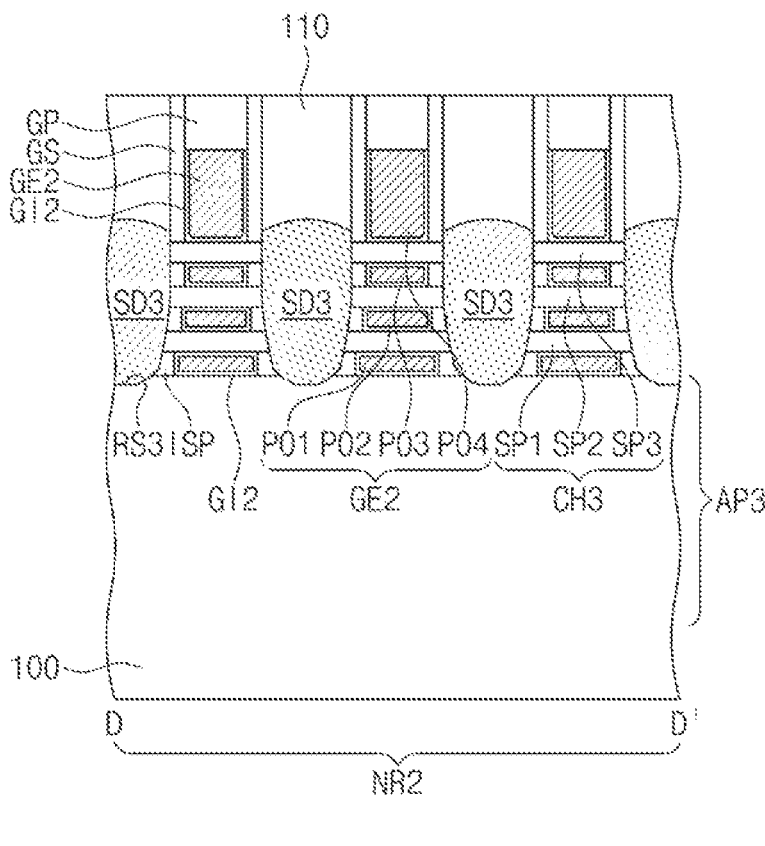
Figure 22E:
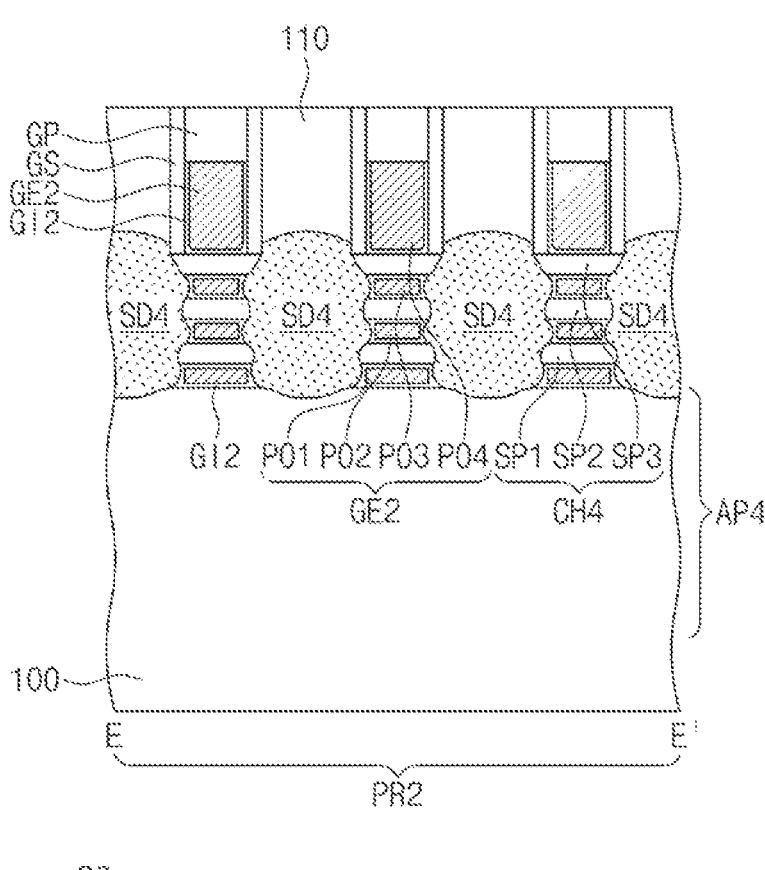
Figure 22F:
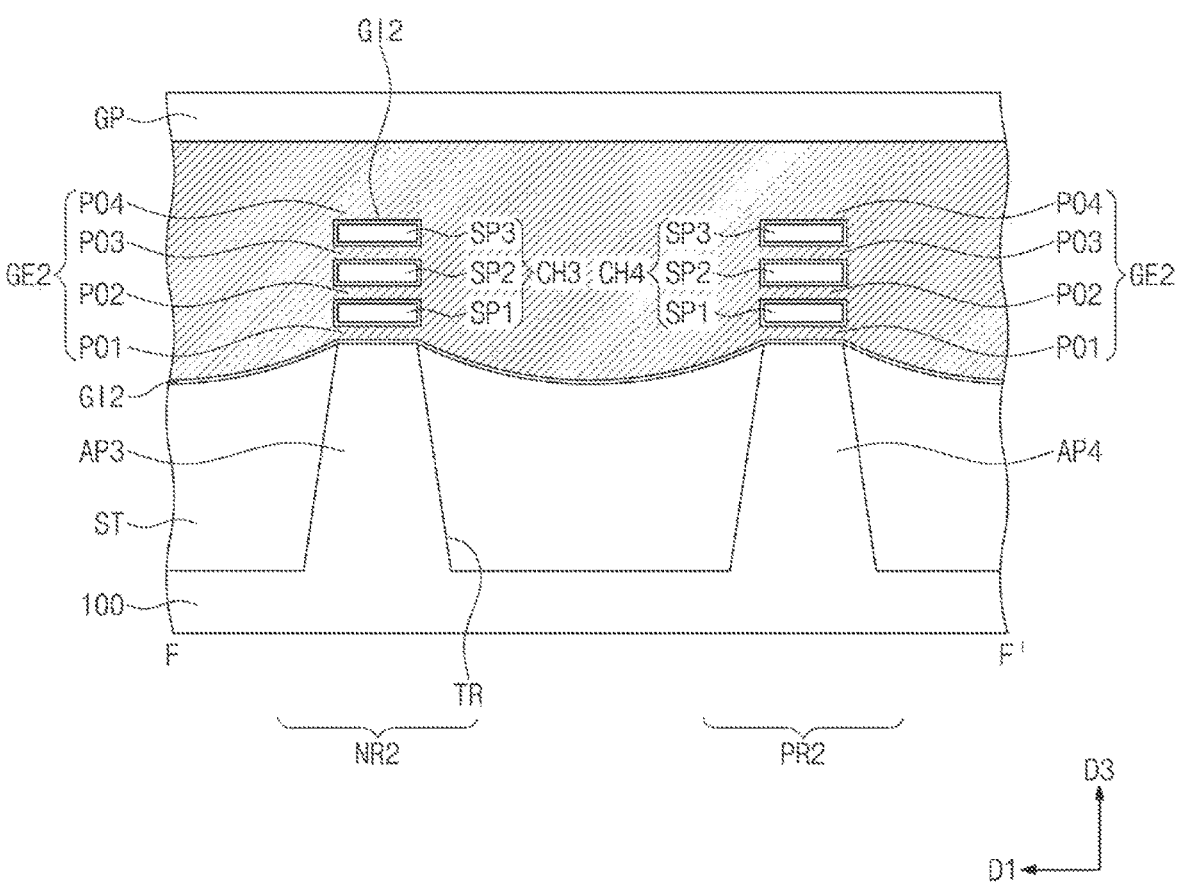

FIGS. 6C, 8C, 10C, 12C, 18C, 20C, and 22C illustrate cross-sectional views taken along line C-C' of FIGS. 5, 7, 9, 11, 17, 19, and 21, respectively. FIGS. 6D, 8D, 10D, 18D, 20D, and 22D illustrate cross-sectional views taken along line D-D' of FIGS. 5, 7, 9, 17, 19, and 21, respectively. FIGS. 10E, 20E, and 22E illustrate cross-sectional views taken along line E-E' of FIGS. 9, 19, and 21, respectively. FIGS. 10F, 20F, and 22F illustrate cross-sectional views taken along line F-F' of FIGS. 9, 19, and 21, respectively. FIG. 13 illustrates an enlarged view showing section U3 of FIG. 12A. FIG. 16A illustrates an enlarged view showing section U4 of FIG. 15A. FIG. 16B illustrates an enlarged view showing section U4 of FIG. 15A.

Referring to FIGS. 5 and 6A to 6D, a substrate 100 may be provided which includes a first region RG1 and a second region RG2. Sacrificial layers SAL and active layers ACL may be alternately formed and stacked on the substrate 100. The sacrificial layers SAL may include one of silicon (Si), germanium (Ge), and silicon-germanium (SiGe), and the active layers ACL may include another of silicon (Si), germanium (Ge), and silicon-germanium (SiGe).

For example, in some embodiments, the sacrificial layers SAL may include silicon-germanium (SiGe), and the active layers ACL may include silicon (Si). Each of the sacrificial layers SAL may have a germanium concentration of about 10 at % to about 50 at %.

The first and second regions RG1 and RG2 of the substrate 100 may be patterned to form trenches TR that define first to fourth active patterns AP1 to AP4. The first active pattern AP1 and the second active pattern AP2 may be respectively formed on a first NMOSFET region NR1 and a first PMOSFET region PR1 on the first region RG1. The third active pattern AP3 and the fourth active pattern AP4 may be respectively formed on a second NMOSFET region NR2 and a second PMOSFET region PR2 on the second region RG2.

A stack pattern STP may be formed on each of the first to fourth active patterns AP1 to AP4. The stack pattern STP may include the sacrificial layers SAL and the active layers ACL that are alternately stacked. During the patterning process, the stack pattern STP may be formed together with the first to fourth active patterns AP1 to AP4.

A device isolation layer ST may be formed to fill the trench TR. For example, a dielectric layer may be formed on an entire surface of the substrate 100, covering the first to fourth active patterns AP1 to AP4 and the stack patterns STP. The dielectric layer may be recessed until the stack patterns STP are exposed, and thus the device isolation layer ST may be formed.

The device isolation layer ST may include a dielectric material, such as a silicon oxide layer. The stack patterns STP may be exposed upwards from the device isolation layer ST. For example, the stack patterns STP may vertically protrude upwards from the device isolation layer ST.

Referring to FIGS. 7 and 8A to 8D, on the first region RG1, a first sacrificial pattern PP1 may be formed to run across the stack patterns STP on the first and second active patterns AP1 and AP2. On the second region RG2, second sacrificial patterns PP2 may be formed to run across the stack patterns STP on the third and fourth active patterns AP3 and AP4. The first sacrificial pattern PP1 and the second sacrificial patterns PP2 may be formed to have linear or bar shapes that extend in a first direction D1.

For example, the formation of the first and second sacrificial patterns PP1 and PP2 may include forming a sacrificial layer on the entire surface of the substrate 100, forming hardmask patterns MP on the sacrificial layer, and using the hardmask patterns MP as an etching mask to pattern the sacrificial layer. The sacrificial layer may include polysilicon.

According to some embodiments, the patterning process for forming the first and second sacrificial patterns PP1 and PP2 may include a lithography process that uses an extreme ultraviolet (EUV) radiation. In some embodiments, the EUV may mean an ultraviolet ray having a wavelength of about 4 nm to about 124 nm. In some embodiments, the EUV may mean an ultraviolet ray having a wavelength of about 4 nm to about 20 nm. In some embodiments, the EUV may mean an ultraviolet ray having a wavelength of about 13.5 nm. The EUV may denote light whose energy is in the range of about 6.21 eV to about 124 eV. For example, in some embodiments, the EUV may denote light whose energy is in the range of about 90 eV to about 95 eV.

The lithography process using the EUV may include exposure and development processes in which the EUV is irradiated onto a photoresist layer. For example, the photoresist layer may be an organic photoresist that contains an organic polymer such as polyhydroxystyrene. The organic photoresist may further include a photosensitive compound sensitive to the EUV. The organic photoresist may additionally include a material whose EUV absorption coefficient is high, for example, an organometallic material, an iodine-containing material, or a fluorine-containing material. For another example, the photoresist layer may be an inorganic photoresist that contains an inorganic material, such as tin oxide.

The photoresist layer may be formed to have a relatively small thickness. The photoresist layer exposed to the EUV may be developed to form photoresist patterns. When viewed in plan, the photoresist patterns may have a linear shape that extends in one direction, an island shape, a zigzag shape, a honeycomb shape, or a circular shape, but the present inventive concepts are not limited to a particular example.

The photoresist patterns may be used as an etching mask to pattern one or more mask layers that are stacked thereunder, and thus the hardmask patterns MP may be formed as discussed above. The hardmask patterns MP may be used as an etching mask to pattern a target layer or the sacrificial layer to form on a wafer a plurality of patterns or the first and second sacrificial patterns PP1 and PP2.

As a comparative example, a multi-patterning technique (MPT) requires the use of two or more photomasks to form fine-pitched patterns on a wafer. In contrast, when an EUV lithography process is performed according to some embodiments, even a single photomask may form the first and second sacrificial patterns PP1 and PP2 having fine pitches.

For example, about 45 nm or less may be given as a minimum pitch between the first and second sacrificial patterns PP1 and PP2 that are formed by the EUV lithography process according to some embodiments. The EUV lithography process may be performed to form the first and second sacrificial patterns PP1 and PP2 that are sophisticated and fine, even without the multi-patterning process.

According to some embodiments, the EUV lithography process may be used to perform not only the patterning process for forming the first and second sacrificial patterns PP1 and PP2, but also the patterning process for forming the first to fourth active patterns AP1 to AP4, and no limitation is imposed on the EUV lithography process.

A pair of gate spacers GS may be formed on opposite sidewalls of each of the first and second sacrificial patterns PP1 and PP2. The formation of the gate spacers GS may include conformally forming a gate spacer layer on the entire surface of the substrate 100 and anisotropically etching the gate spacer layer. In some embodiments, the gate spacer layer may include at least one selected from SiCN, SiCON, and SiN. In some embodiments, the gate spacer layer may be a multiple layer including at least two selected from SiCN, SiCON, and SiN.

Referring to FIGS. 9 and 10A to 10D, first recesses RS1, second recesses RS2, third recesses RS3, and fourth recesses RS4 may be respectively formed on the first, second, third, and fourth active patterns AP1, AP2, AP3, and AP4. During the formation of the first to fourth recesses RS1 to RS4, the device isolation layer ST may further be recessed on opposite sides of each of the first to fourth active patterns AP1 to AP4. In some embodiments, the first to fourth recesses RS1 to RS4 may be formed at the same time. In some embodiments, before or after the first and second recesses RS1 and RS2 are formed at the same time, the third and fourth recesses RS3 and RS4 may be formed at the same time. The formation of the first to fourth recesses RS1 to RS4 may be formed through, for example, an etching process.

The hardmask patterns MP and the gate spacers GS may be used as an etching mask. The first and second recesses RS1 and RS2 may be formed between a pair of (e.g., two) first sacrificial patterns PP1. The third and fourth recesses RS3 and RS4 may be formed between a pair of (e.g., two) second sacrificial patterns PP2.

The active layers ACL of the stack pattern STP may be formed into first, second, and third semiconductor patterns SP1, SP2, and SP3 that are sequentially stacked between neighboring first recesses RS1, between neighboring second recesses RS2, between neighboring third recesses RS3, and between neighboring fourth recesses RS4. A first channel pattern CH1 may be constituted by the first, second, and third semiconductor patterns SP1, SP2, and SP3 between neighboring first recesses RS1. A second channel pattern CH2 may be constituted by the first, second, and third semiconductor patterns SP1, SP2, and SP3 between neighboring second recesses RS2. A third channel pattern CH3 may be constituted by the first, second, and third semiconductor patterns SP1, SP2, and SP3 between neighboring third recesses RS3. A fourth channel pattern CH4 may be constituted by the first, second, and third semiconductor patterns SP1, SP2, and SP3 between neighboring fourth recesses RS4.

A width in the first direction D1 of the first to fourth recesses RS1 to RS4 may decrease with decreasing distance from the substrate 100. The first to fourth recesses RS1 to RS4 may expose the sacrificial layers SAL.

A partial removal action may be performed on the sacrificial layers SAL exposed through the first recess RS1 and the third recess RS3. A dielectric material may fill areas where the sacrificial layers SAL are partially removed, thereby forming an inner spacer ISP.

Figure 11:
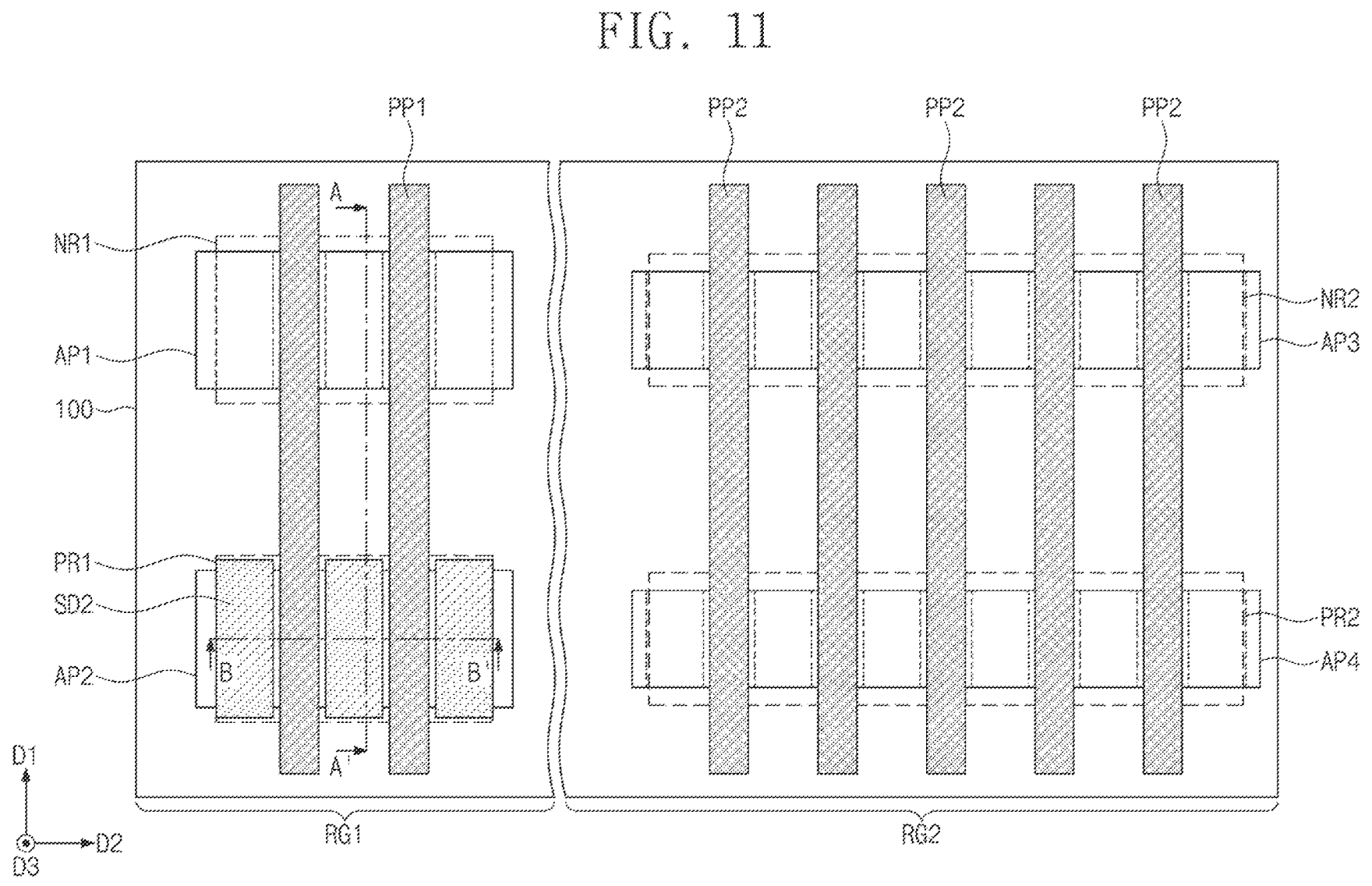
Figure 12A:
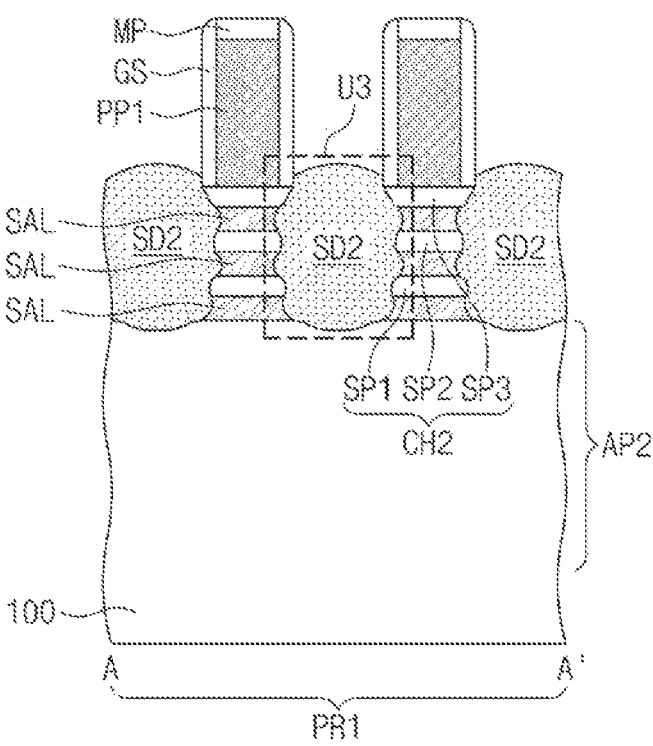
Figure 12B:
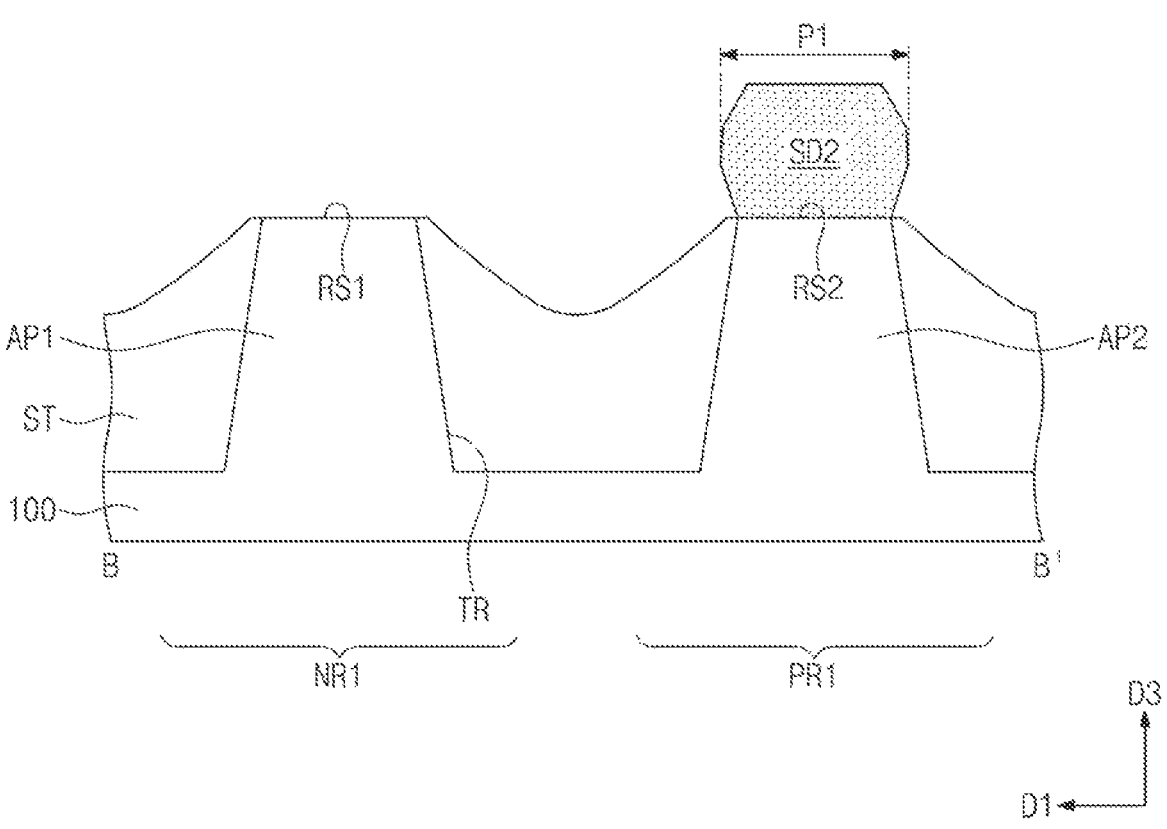

Referring to FIGS. 11, 12A, and 12B, second source/drain patterns SD2 may be formed. For example, the second source/drain patterns SD2 may be formed on an upper portion of the second active pattern AP2. A pair of (e.g., two) second source/drain patterns SD2 may be formed on opposite sides of the first sacrificial pattern PP1. That is, a second source/drain pattern SD2 may be formed on each of opposite sides of the first sacrificial pattern PP1.

A first selective epitaxial growth (SEG) process may be performed in which an inner wall of the first recess RS1 of the stack pattern STP may be used as a seed layer to form a first semiconductor layer L1. The first semiconductor layer L1 may be grown from a seed, or the substrate 100 and the first, second, and third semiconductor patterns SP1, SP2, and SP3 exposed by the second recess RS2. For example, the first SEG process may include chemical vapor deposition (CVD) or molecular beam epitaxy (MBE).

Referring to FIGS. 12B and 13, the first semiconductor layer L1 may include a semiconductor element (e.g., SiGe) whose lattice constant is greater than a lattice constant of a semiconductor element of the substrate 100. The first semiconductor layer L1 may contain germanium (Ge) whose concentration is relatively low. For example, the first semiconductor layer L1 may be formed at a temperature of about 650 degrees to about 750 degrees to have a germanium concentration of about 0 at % to about 15 at % (the first SEG process). The first semiconductor layer L1 may undergo a second SEG process to form a second semiconductor layer L2. The second semiconductor layer L2 may contain germanium (Ge) whose concentration is relatively greater than a concentration of germanium contained in the first semiconductor layer L1. For example, the second semiconductor layer L2 may be formed at a temperature of about 500 degrees to about 650 degrees to have a germanium concentration of about 30 at % to about 50 at % (the second SEG process). The second semiconductor layer L2 may undergo a third SEG process to form a third semiconductor layer L3. The third semiconductor layer L3 may contain germanium (Ge) whose concentration is relatively greater than a concentration of germanium contained in the second semiconductor layer L2. For example, the third semiconductor layer L3 may be formed at a temperature of about 450 degrees to about 500 degrees to have a germanium concentration of about 50 at % to about 55 at % (the third SEG process). The third semiconductor layer L3 may fill the third recess RS3.

The third semiconductor layer L3 may have a top surface at a level substantially the same as, higher than, or lower than a level of a top surface of the third semiconductor pattern SP3 positioned at top of the second channel pattern CH2. About 5 nm or less may be given as a level difference ΔT1 between the top surface of the third semiconductor layer L3 and the top surface of the third semiconductor pattern SP3 positioned at top of the second channel pattern CH2. That is, the level difference ΔT1 may be about 0 nm to about 5 nm. According to some embodiments, the third semiconductor layer L3 may be overgrown to have a top surface located at a level higher than a top surface of the top surface of the third semiconductor pattern SP3 positioned at top of the second channel pattern CH2.

The first to third semiconductor layers L1 to L3 may constitute a second source/drain pattern SD2. Impurities such as boron may be in-situ implanted during the first to third SEG processes. The second source/drain pattern SD2 may be doped to have a second conductivity type (e.g., p-type).

According to some embodiments, the second SEG process may be omitted, and the third SEG process may be performed immediately after the first SEG process. After the third SEG process, a fourth SEG process may be additionally performed. The fourth SEG process may form a fourth semiconductor layer L4 on the third semiconductor layer L3. The fourth semiconductor layer L4 may contain germanium (Ge) whose concentration is relatively greater than a concentration of germanium contained in the third semiconductor layer L3. For example, the fourth semiconductor layer L4 may be formed at a temperature of about 350 degrees to about 450 degrees to have a germanium concentration of about 55 at % to about 60 at % (see FIG. 3B).

Figure 14:
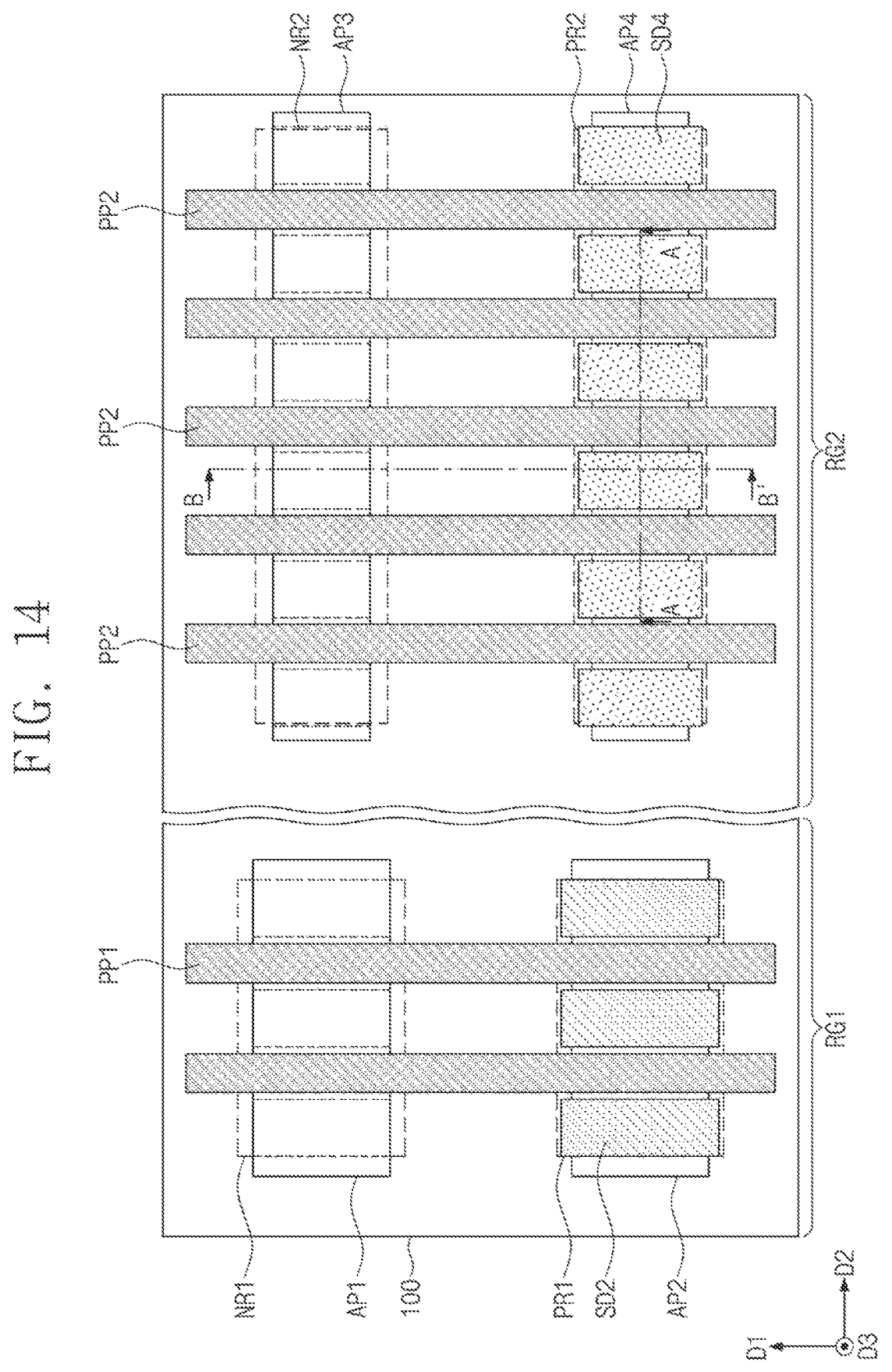
Figure 15A:
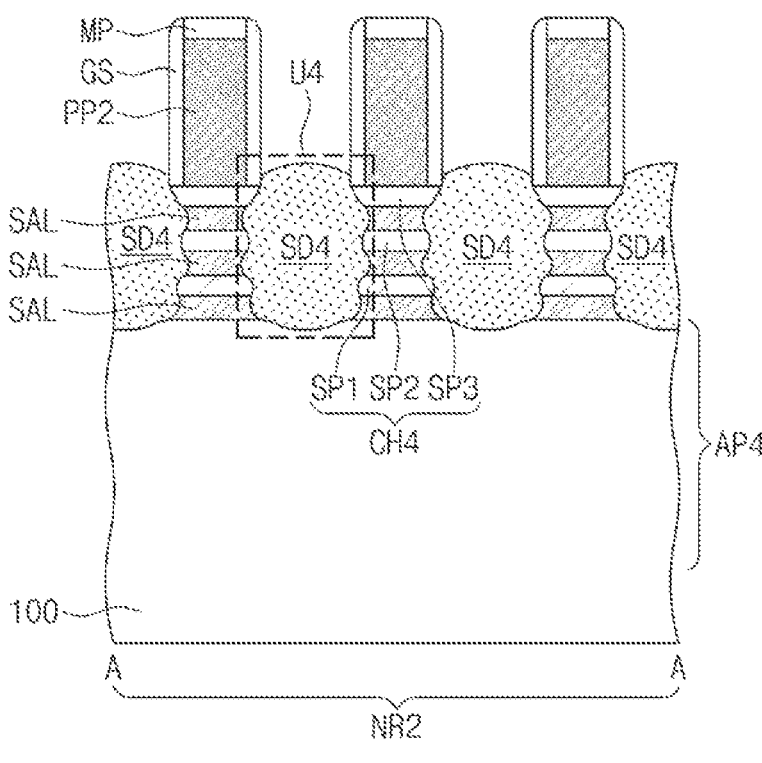
Figure 15B:
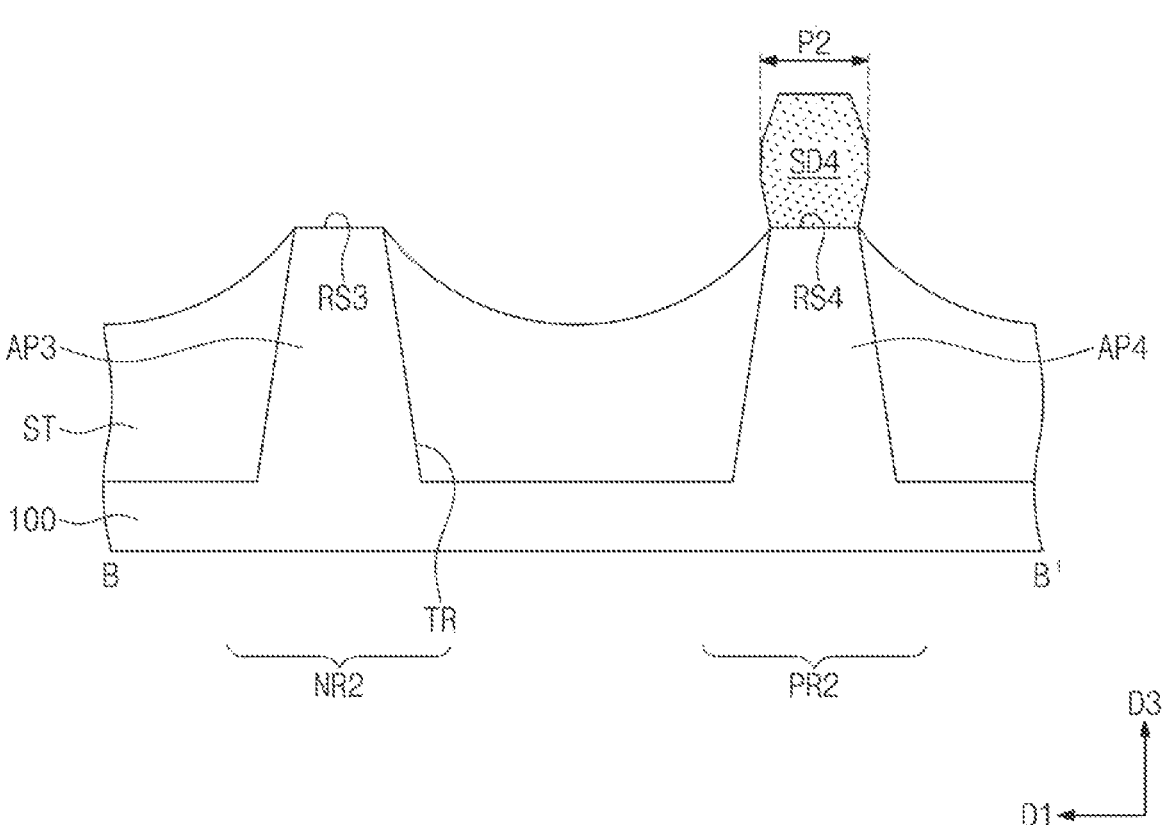
Figure 16A:
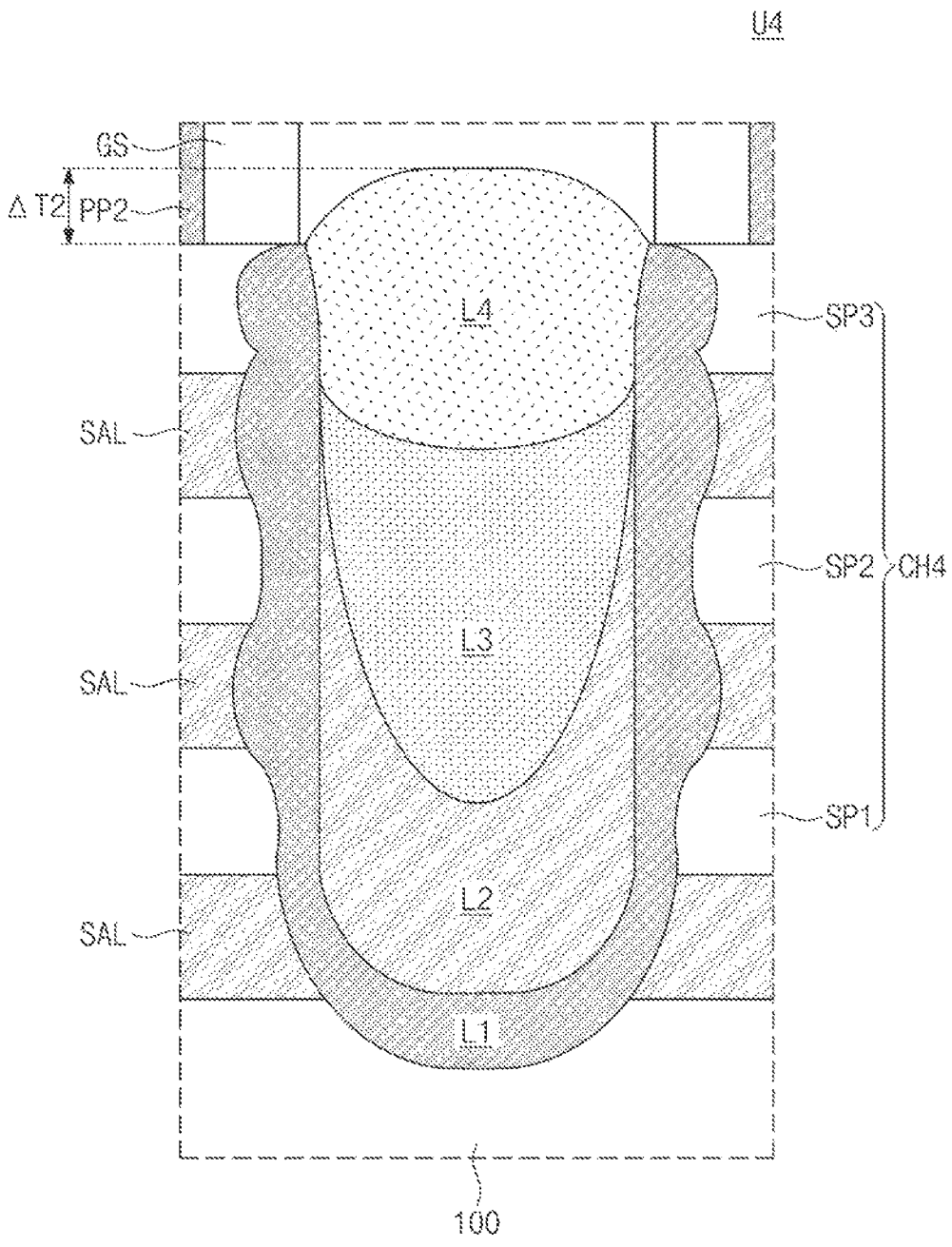
FIG. 16A illustrates an enlarged view showing section U4 of FIG. 15A.
Figure 16B:
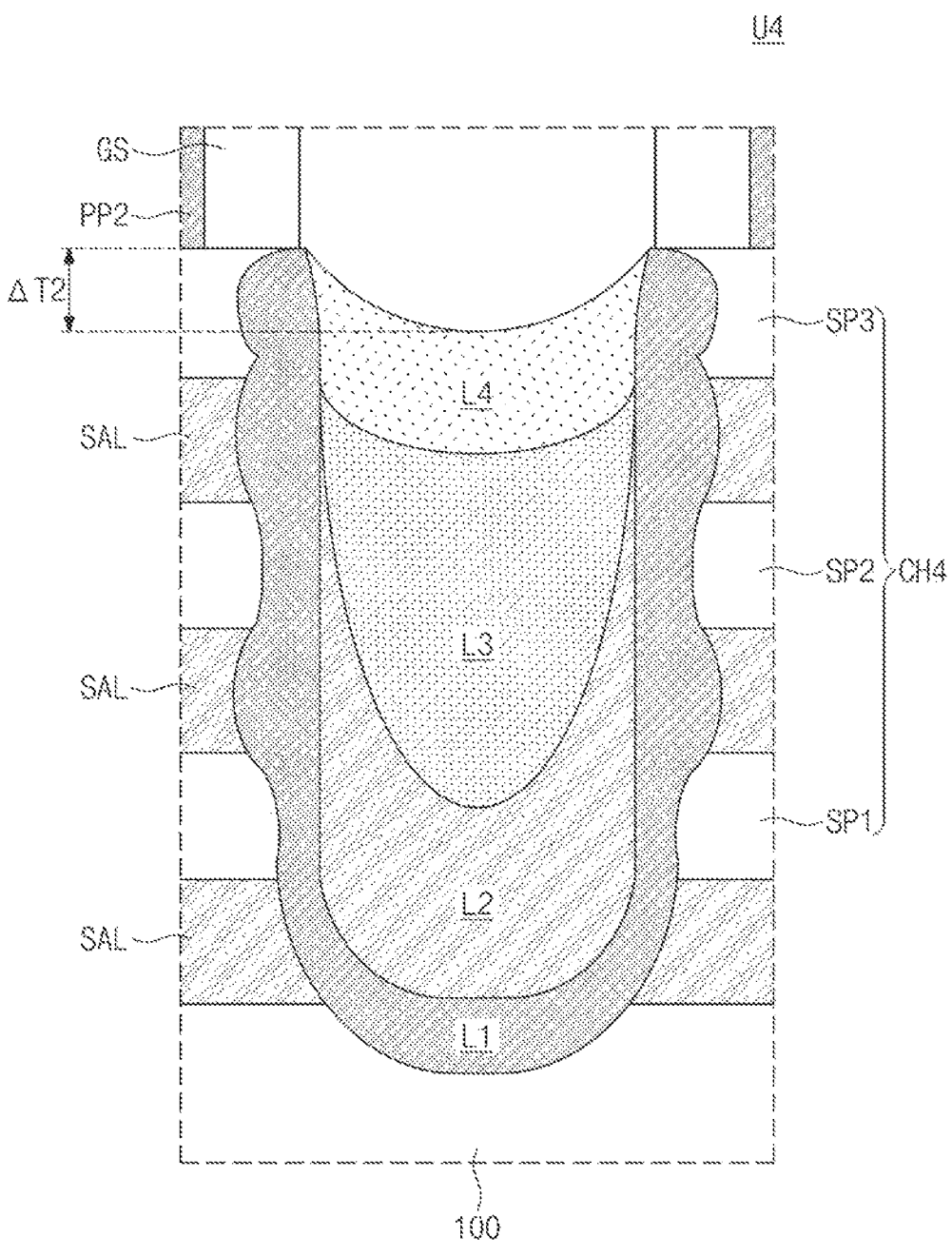
FIG. 16B illustrates an enlarged view showing section U4 of FIG. 15A.
Figure 17:
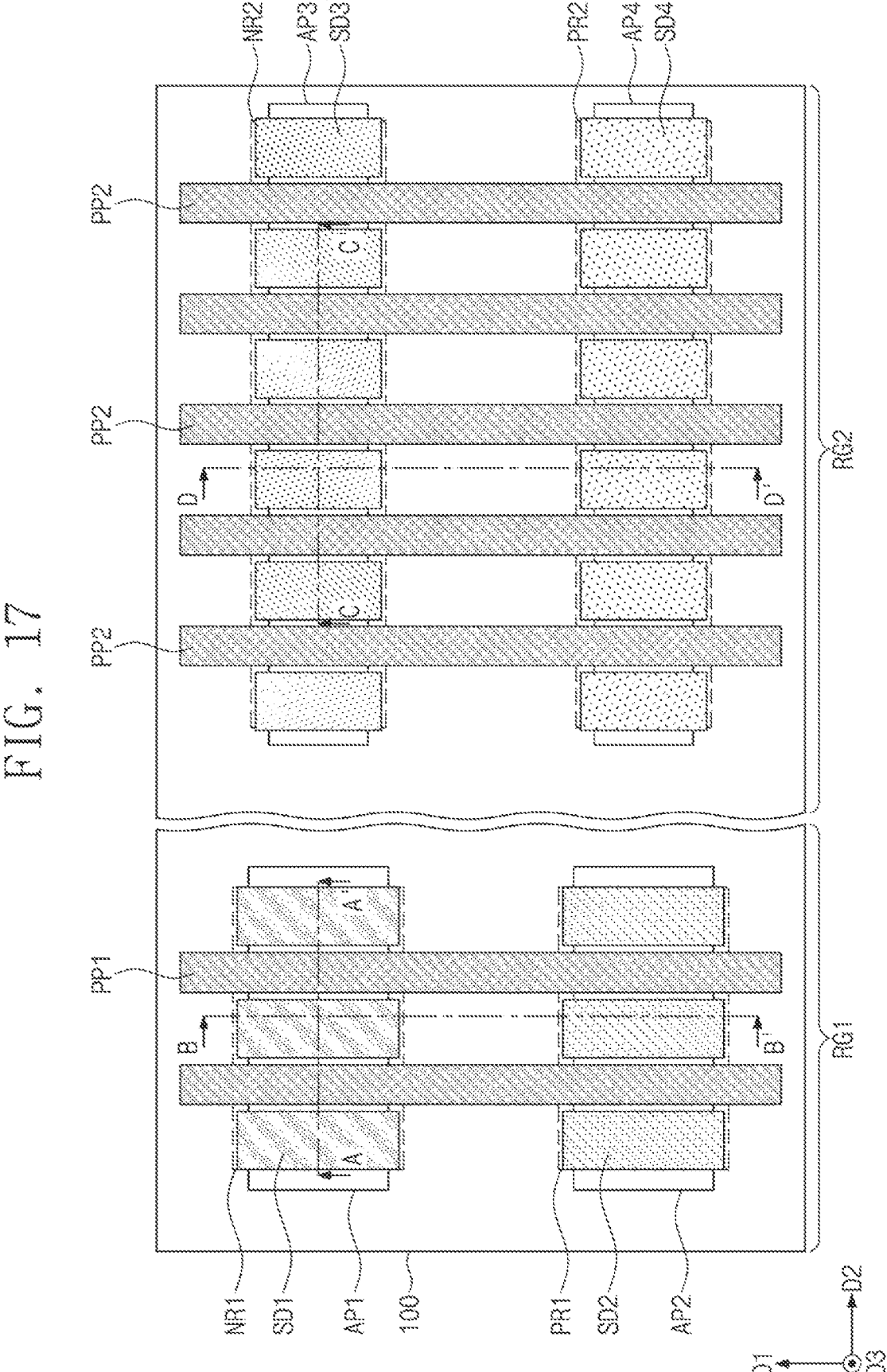
Figure 18A:
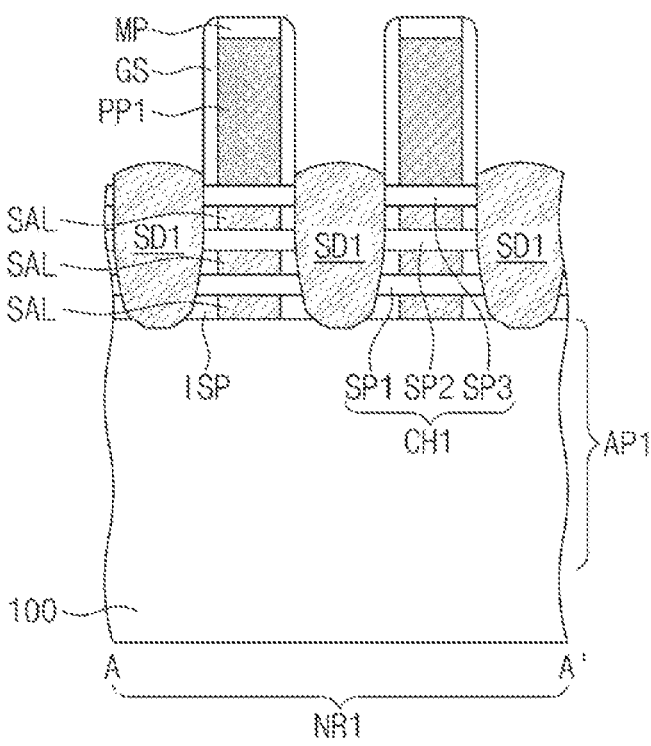
Figure 18B:
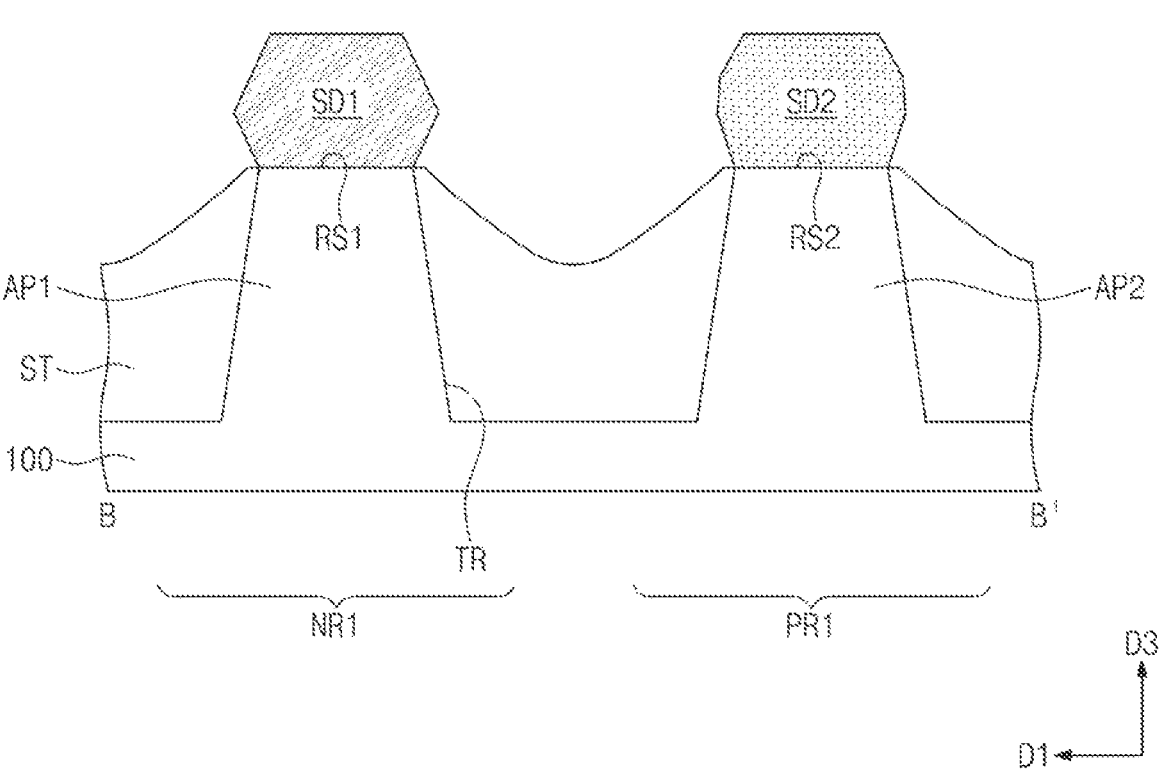
Figure 18C:
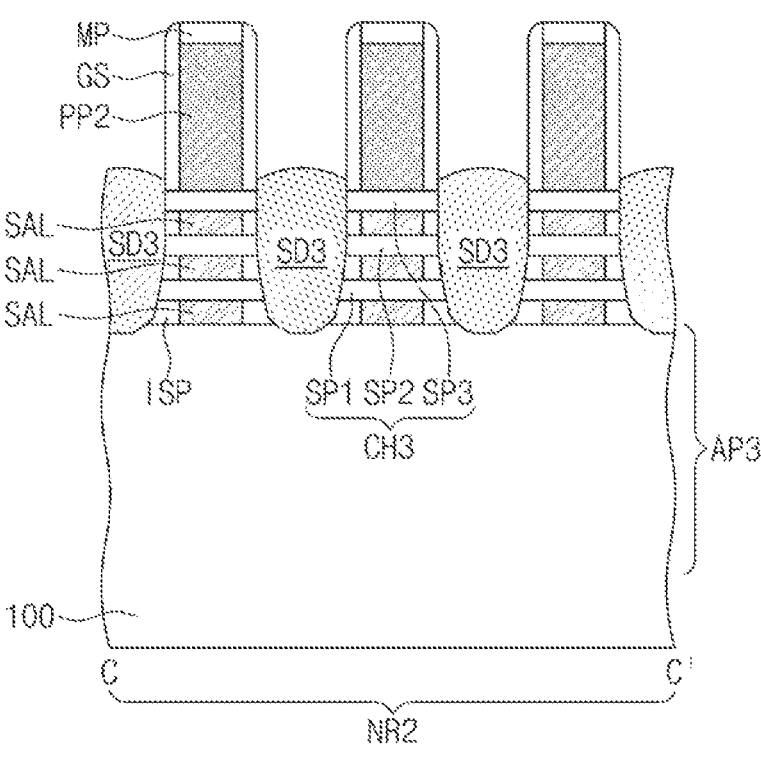
Figure 18D:
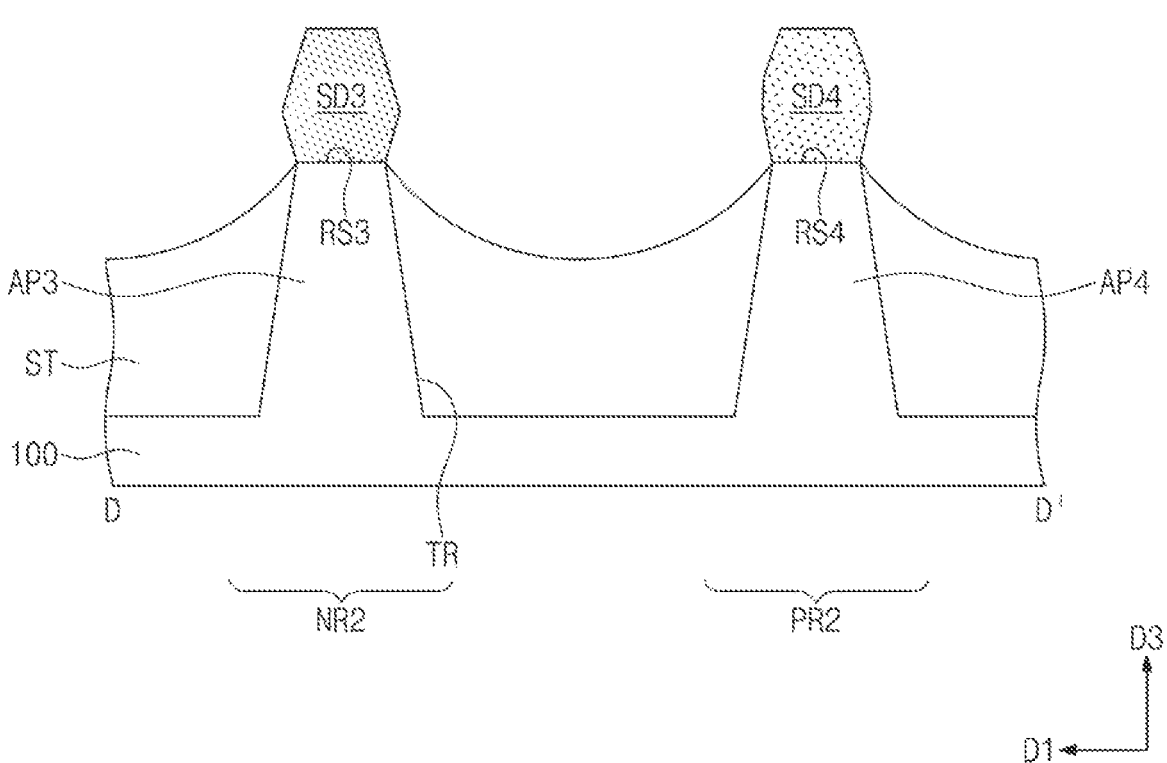
Figure 19:
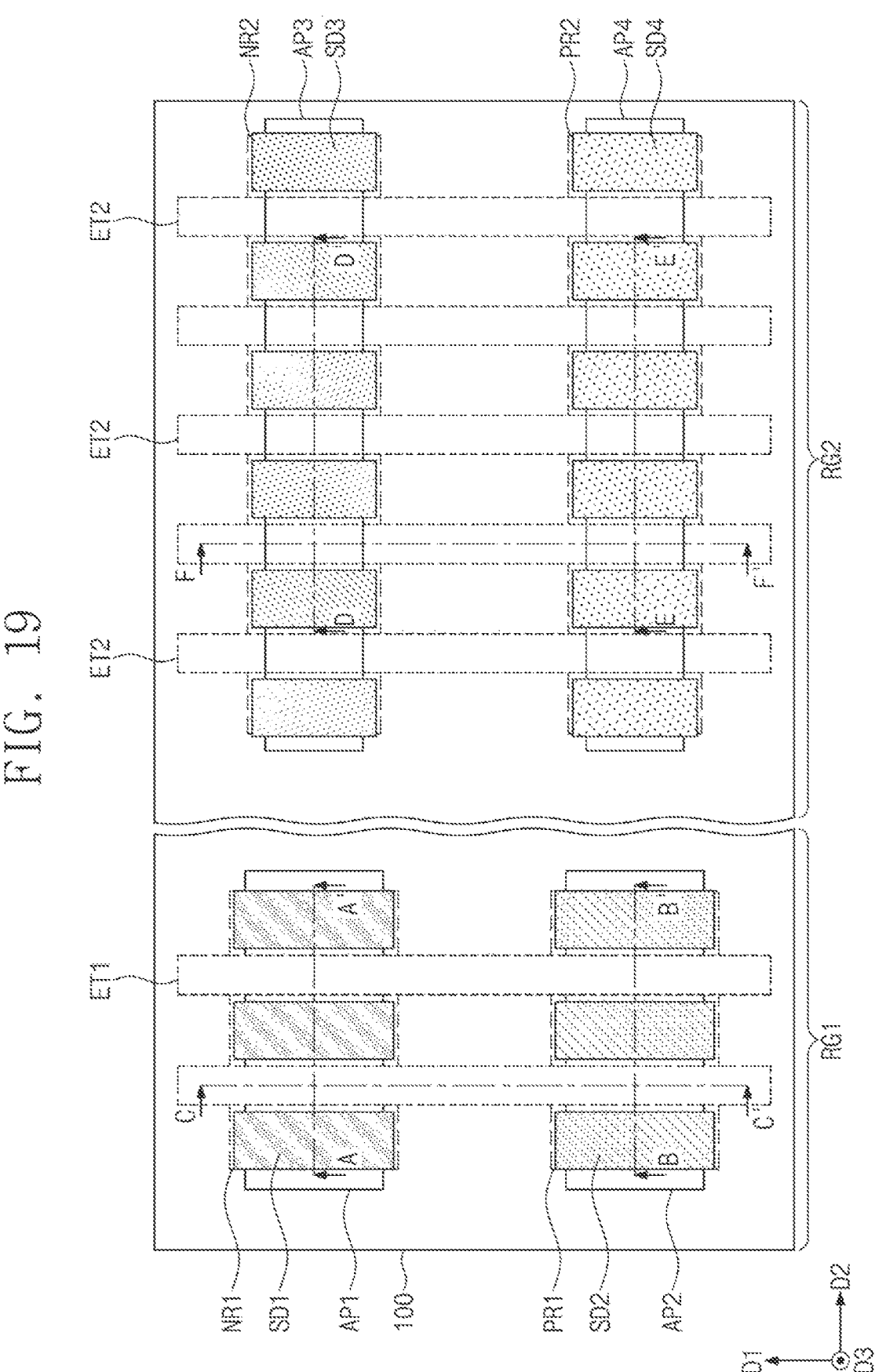

Referring to FIGS. 14, 15A, and 15B, fourth source/drain patterns SD4 may be formed. The fourth source/drain patterns SD4 may be formed on an upper portion of the fourth active pattern AP4. A pair of (e.g., two) fourth source/drain patterns SD4 may be formed on opposite sides of the second sacrificial pattern PP2. That is, a fourth source/drain pattern SD4 may be formed on each of opposite sides of the second sacrificial pattern PP2.

Referring to FIGS. 15A and 16A, an inner wall of the fourth recess RS4 of the stack pattern STP may be used as a seed layer to continuously perform the first to fourth SEG process. For example, the fourth source/drain pattern SD4 may further include at least one semiconductor layer, compared to the second source/drain pattern SD2.

According to some embodiments, after the first and second SEG processes, a reflow process may be performed. The first and second semiconductor layers L1 and L2 may downwardly flow due to fluidity occurring at the sidewalls thereof, and thus the first and second semiconductor layers L1 and L2 may have increased thicknesses at bottoms thereof and reduced thicknesses at the sidewalls thereof.

The fourth semiconductor layer L4 may have a top surface at a level substantially the same as, higher than, or lower than a level of a top surface of the third semiconductor pattern SP3 positioned at top of the fourth channel pattern CH4. About 5 nm or less may be given as a level difference ΔT2 between the top surface of the fourth semiconductor layer L4 and the top surface of the third semiconductor pattern SP3 positioned at top of the fourth channel pattern CH4. That is, the level difference ΔT2 may be from about 0 nm to about 5 nm.

As shown in FIG. 16A, the fourth semiconductor layer L4 may be overgrown to have a top surface located at a level higher than a level of the top surface of the third semiconductor pattern SP3 positioned at top of the fourth channel pattern CH4. For example, a value ranging from about 0 nm to about 5 nm may be given as a level difference between the top surface of the fourth semiconductor layer L4 and the top surface of the third semiconductor pattern SP3 positioned at top of the fourth channel pattern CH4. That is, the level difference may be from about 0 nm to about 5 nm.

In some embodiments, as shown in FIG. 16B, the fourth semiconductor layer L4 may be under-grown to have a top surface located at a level lower than a level of the top surface of the third semiconductor pattern SP3 positioned at top of the fourth channel pattern CH4. Even in this case, a value ranging from about 0 nm to about 5 nm may be given as a level difference between the top surface of the fourth semiconductor layer L4 and the top surface of the third semiconductor pattern SP3 positioned at top of the fourth channel pattern CH4. That is, the level difference may be from about 0 nm to about 5 nm.

Afterwards, the fourth source/drain patterns SD4 may be doped with impurities to have the second conductivity type (e.g., p-type).

According to some embodiments, when there is a difference in width between channel patterns of first and second PMOS regions, source/drain patterns may be formed independently or sequentially.

In a case, such as the second PMOS region, where a width in a first direction D1 of a channel pattern is less than about 20 nm, a depth in a third direction D3 of a recess may be significantly less than a width in a second direction D2 of the recess, and thus growth of semiconductor layers including silicon-germanium may be terminated before the recess is fully filled with the semiconductor layers (undergrowth). In this case, the semiconductor layer including silicon-germanium may have an uppermost surface at a level lower (by about 20 nm or less) than a level of an uppermost surface of a semiconductor pattern that constitutes the channel pattern.

According to some embodiments, a large number of semiconductor layers may be grown to form a source/drain pattern of the second PMOS region. In this case, the formed semiconductor layers may each have a relatively small thickness compared to a case when a small number of semiconductor layers are grown to form a source/drain pattern of the second PMOS region, and thus growth of the semiconductor layers may be more promoted in a lateral direction of the recess than on a bottom surface of the recess. In addition, a reflow process may promote the growth of the semiconductor layer on the bottom surface of the recess. As a result, according to some embodiments, the semiconductor layer may be grown to sufficiently fill the recess, and an active contact subsequently formed may be easily connected to the source/drain pattern.

Referring to FIGS. 17, 18A, 18B, 18C, and 18D, first source/drain patterns SD1 may be formed on an upper portion of the first active pattern AP1, and third source/drain patterns SD3 may be formed on an upper portion of the third active pattern AP3. A pair of (e.g., two) first source/drain patterns SD1 may be formed on opposite sides of the first sacrificial pattern PP1, and a pair of (e.g., two) third source/drain patterns SD3 may be formed on opposite sides of the second sacrificial pattern PP2. That is, a first source/drain pattern SD1 may be formed on each of opposite sides of the first sacrificial pattern PP1, and a third source/drain pattern SD3 may be formed on each of opposite sides of the second sacrificial pattern PP2. For example, the first and third source/drain patterns SD1 and SD3 may be formed by performing a selective epitaxial growth process in which inner walls of the first and third recesses RS1 and RS3 of the stack pattern STP are used as seed layers.

For example, the first and third source/drain patterns SD1 and SD3 may include the same semiconductor element (e.g., Si) as that of the substrate 100. The first and third source/drain patterns SD1 and SD3 may be doped with impurities to have a first conductivity type (e.g., n-type).

The formation of the first source/drain patterns SD1 may define a first channel pattern CH1 that includes first, second, and third semiconductor patterns SP1, SP2, and SP3 between a pair of (e.g., two) the first source/drain patterns SD1. Likewise, a third channel pattern CH3 may be defined to include first, second, and third semiconductor patterns SP1, SP2, and SP3 between a pair of (e.g., two) the third source/drain patterns SD3. The first and third source/drain patterns SD1 and SD3 may be formed at the same time.

Referring to FIGS. 19 and 20A to 20F, a first interlayer dielectric layer 110 may be formed to cover the first to fourth source/drain patterns SD1 to SD4, the hardmask patterns MP, and the gate spacers GS. For example, the first interlayer dielectric layer 110 may include a silicon oxide layer.

The first interlayer dielectric layer 110 may be planarized until top surfaces of the first and second sacrificial patterns PP1 and PP2 are exposed. An etch-back or chemical mechanical polishing (CMP) process may be employed to planarize the first interlayer dielectric layer 110. The hardmask patterns MP may all be removed during the planarization process. As a result, the first interlayer dielectric layer 110 may have a top surface coplanar with top surfaces of the first and second sacrificial patterns PP1 and PP2 and top surfaces of the gate spacers GS.

The first and second sacrificial patterns PP1 and PP2 may be selectively removed. The removal of the first sacrificial pattern PP1 may form an outer region ORG that exposes the first and second channel patterns CH1 and CH2. The removal of the second sacrificial patterns PP2 may form an outer region ORG that exposes the third and fourth channel patterns CH3 and CH4. The removal of the first and second sacrificial patterns PP1 and PP2 may include performing a wet etching process using an etchant that selectively etches polysilicon.

The sacrificial layers SAL exposed through the outer region ORG may be selectively removed to form first to third inner regions IRG1 to IRG3. For example, an etching process that selectively etches the sacrificial layers SAL may be performed such that only the sacrificial layers SAL may be removed while leaving the first, second, and third semiconductor patterns SP1, SP2, and SP3. The etching process may have a high etch rate for silicon-germanium whose germanium concentration is relatively high. For example, the etching process may have a high etch rate with respect to silicon-germanium whose germanium concentration is greater than about 10 at %.

During the etching process, the sacrificial layers SAL may be removed from the first and second regions RG1 and RG2. The etching process may be a wet etching process. The etching material used for the etching process may promptly etch the sacrificial layer SAL whose germanium concentrate is relatively high. The first semiconductor layer L1 having a relatively low germanium concentration may protect each of the second and fourth source/drain patterns SD2 and SD4 from the etching process.

As the sacrificial layers SAL are selectively removed, only the first, second, and third semiconductor patterns SP1, SP2, and SP3 may remain stacked on each of the first to fourth active patterns AP1 to AP4. The removal of the sacrificial layers SAL may form the first, second, and third inner regions IRG1, IRG3, and IRG3. For example, the first inner region IRG1 may be formed between the first semiconductor pattern SP1 and one of the active patterns AP1 to AP4, the second inner region IRG2 may be formed between the first semiconductor pattern SP1 and the second semiconductor pattern SP2, and the third inner region IRG3 may be formed between the second semiconductor pattern SP2 and the third semiconductor pattern SP3.

A first empty space ET1 may be constituted by the outer region ORG and the first, second, and third inner regions IRG1, IRG2, and IRG3 on the first region RG1. The first empty space ET1 may expose the first, second, and third semiconductor patterns SP1, SP2, and SP3 of each of the first and second channel patterns CH1 and CH2. A second empty space ET2 may be constituted by the outer region ORG and the first, second, and third inner regions IRG1, IRG2, and IRG3 on the second region RG2. The second empty space ET2 may expose the first, second, and third semiconductor patterns SP1, SP2, and SP3 of each of the third and fourth channel patterns CH3 and CH4.

First and second gate dielectric layers GI1 and GI2 may be formed in the first and second empty spaces ET1 and ET2, respectively. The first gate dielectric layer GI1 may be formed in the first empty space ET1, and may surround the first, second, and third semiconductor patterns SP1, SP2, and SP3. The second gate dielectric layer GI2 may be formed in the second empty space ET2, and may surround the first, second, and third semiconductor patterns SP1, SP2, and SP3.

Referring to FIGS. 21 and 22A to 22F, first and second gate electrodes GE1 and GE2 may be respectively formed in the first and second empty spaces ET1 and ET2. The first gate electrode GE1 may include first, second, and third portions PO1, PO2, and PO3 that fill the first, second, and third inner regions IRG1, IRG2, and IRG3, and may also include a fourth portion PO4 that fills the outer region ORG. The second gate electrode GE2 may include first, second, and third portions PO1, PO2, and PO3 that fill the first, second, and third inner regions IRG1, IRG2, and IRG3 of the second empty space ET2, and may also include a fourth portion PO4 that fills the outer region ORG. A gate capping pattern GP may be formed on each of the first and second gate electrodes GE1 and GE2.

Referring back to FIGS. 1 and 2A to 2H, a second interlayer dielectric layer 120 may be formed on the first interlayer dielectric layer 110. The second interlayer dielectric layer 120 may include a silicon oxide layer. Active contacts AC may be formed to penetrate the second and first interlayer dielectric layers 120 and 110 to come into electrical connection with the first, second, third, and fourth source/drain patterns SD1, SD2, SD3, and SD4. Gate contacts GC may be formed to penetrate the second interlayer dielectric layer 120 and the gate capping pattern GP to come into electrical connection with the first and second gate electrodes GE1 and GE2.

A third interlayer dielectric layer 130 may be formed on the second interlayer dielectric layer 120. A first metal layer M1 may be formed in the third interlayer dielectric layer 130. The formation of the first metal layer M1 may include forming first lines M1_I. A fourth interlayer dielectric layer 140 may be formed on the first metal layer M1. A second metal layer M2 may be formed in the fourth interlayer dielectric layer 140. The formation of the second metal layer M2 may include forming second lines M2_I.

According to some embodiments, an EUV lithography process may be employed to form the first lines M1_I and/or the second lines M2_I in the first metal layer M1 and/or the second metal layer M2. A detailed description of the EUV lithography process used in BEOL processes may be substantially the same as that used for forming the first and second sacrificial patterns PP1 and PP2. For example, about 45 nm or less may be given as a minimum pitch between the first lines M1_I formed by the EUV lithography process. That is, the minimum pitch between the first lines M1_I may be about 45 nm or less.

According to some embodiments, when there is a difference in width between channel patterns of first and second PMOS regions, source/drain patterns may be formed independently or sequentially. Accordingly, even when the channel pattern has a small width, the source/drain pattern may be formed to sufficiently fill a recess (space for the source/drain pattern), and a level difference of about 0 nm to about 5 nm may be present between a top surface of the source/drain pattern and an uppermost portion of a semiconductor pattern. Thus, according to some embodiments, the source/drain pattern and an active contact may be easily connected to each other to improve reliability and electrical properties of a semiconductor device.

Although some embodiments have been discussed with reference to accompanying figures, it will be understood that various changes in form and details may be made therein without departing from the spirit and scope of the present disclosure. It therefore will be understood that the embodiments described above are just illustrative but not limitative in all aspects.

What is claimed is:

1. A semiconductor device comprising:
   a substrate that includes a first PMOS region and a second PMOS region;
   a first active pattern on the first PMOS region and a second active pattern on the second PMOS region;
   two first source/drain patterns and a first channel pattern between the two first source/drain patterns, the two first source/drain patterns being spaced apart along a first direction on the first active pattern, and the first channel pattern including a plurality of first semiconductor patterns stacked on the first active pattern; and two second source/drain patterns and a second channel pattern between the two second source/drain patterns, the two second source/drain patterns being spaced apart along the first direction on the second active pattern, and the second channel pattern including a plurality of second semiconductor patterns stacked on the second active pattern, wherein a first width in a second direction of each of the plurality of first semiconductor patterns is greater than a second width in the second direction of each of the plurality of second semiconductor patterns, the second direction intersecting the first direction, wherein each of the two first source/drain patterns and each of the two second source/drain patterns includes a plurality of semiconductor layers having germanium concentrations that are different in an upward direction, and wherein a number of the plurality of semiconductor layers of each of the two second source/drain patterns is greater than a number of the plurality of semiconductor layers of each of the two first source/drain patterns.

2. The semiconductor device of claim 1, wherein a third width in the second direction of each of the two first source/drain patterns is greater than a fourth width in the second direction of each of the two second source/drain patterns.

3. The semiconductor device of claim 1, wherein:

among the plurality of semiconductor layers of each of the two first source/drain patterns, a germanium concentration of an overlying semiconductor layer is greater than a germanium concentration of an underlying semiconductor layer, and among the plurality of semiconductor layers of each of the two second source/drain patterns, a germanium concentration of an overlying semiconductor layer is greater than a germanium concentration of an underlying semiconductor layer.

4. The semiconductor device of claim 1, wherein:

a lowermost semiconductor layer of each of the two second source/drain patterns has a U-shaped cross-section, and a bottom side thickness of the lowermost semiconductor layer is greater than a lateral side thickness of the lowermost semiconductor layer.

5. The semiconductor device of claim 1, wherein a level difference between a top surface of an uppermost one of the plurality of second semiconductor patterns included in the second channel pattern and a top surface of each of the two second source/drain patterns is above 0 nm to about 5 nm.

6. The semiconductor device of claim 1, wherein:

a first width in the first direction of the first channel pattern is greater than about 20 nm, and a first width in the first direction of the second channel pattern is equal to or less than about 20 nm.

7. The semiconductor device of claim 1, wherein a first length in the second direction of the first channel pattern is substantially the same as a second length in the second direction of the second channel pattern.

8. The semiconductor device of claim 1, wherein a ratio of a bottom side thickness to a lateral side thickness of a lowermost semiconductor layer included in each of the two second source/drain patterns is greater than a ratio of a bottom side thickness to a lateral side thickness of a lowermost semiconductor layer included in each of the two first source/drain patterns.

9. The semiconductor device of claim 1, wherein a sidewall of each of the two first source/drain patterns and a sidewall of each of the two second source/drain patterns has an uneven embossing shape.

10. A semiconductor device comprising:

a substrate that includes a first PMOS region and a second PMOS region;

a first active pattern on the first PMOS region and a second active pattern on the second PMOS region;

two first source/drain patterns and a first channel pattern between the two first source/drain patterns, the two first source/drain patterns being spaced apart along a first direction on the first active pattern, and the first channel pattern including a plurality of first semiconductor patterns stacked on the first active pattern; and two second source/drain patterns and a second channel pattern between the two second source/drain patterns, the two second source/drain patterns being spaced apart along the first direction on the second active pattern, and the second channel pattern including a plurality of second semiconductor patterns stacked on the second active pattern, wherein a first width in a second direction of each of the plurality of first semiconductor patterns is greater than a second width in the second direction of each of the plurality of second semiconductor patterns, the second direction intersecting the first direction, wherein each of the two first source/drain patterns and each of the two second source/drain patterns includes a plurality of semiconductor layers having germanium concentrations that are different in an upward direction, and wherein a level difference between a top surface of an uppermost one of the plurality of second semiconductor patterns included in the second channel pattern and a top surface of each of the two second source/drain patterns is above 0 nm to about 5 nm.

11. The semiconductor device of claim 10, wherein a thickness of each of the plurality of semiconductor layers included in the two first source/drain patterns is greater than a thickness of each of the plurality of semiconductor layers included in the two second source/drain patterns.

12. The semiconductor device of claim 10, wherein a number of the plurality of semiconductor layers included in the two second source/drain patterns is greater than a number of the plurality of semiconductor layers included in the two first source/drain patterns.

13. The semiconductor device of claim 10, wherein:

a first width in the first direction of each of the plurality of first semiconductor patterns is greater than about 20 nm, and a first width in the first direction of each of the plurality of second semiconductor patterns is equal to or less than about 20 nm.

14. The semiconductor device of claim 10, wherein:

among the plurality of semiconductor layers of each of the two first source/drain patterns, a germanium concentration of an overlying semiconductor layer is greater than a germanium concentration of an underlying semiconductor layer, and among the plurality of semiconductor layers of each of the two second source/drain patterns, a germanium concentration of an overlying semiconductor layer is greater than a germanium concentration of an underlying semiconductor layer.

15. The semiconductor device of claim 10, wherein:

a lowermost semiconductor layer of each of the two second source/drain patterns has a U-shaped cross-section, and a bottom side thickness of the lowermost semiconductor layer is greater than a lateral side thickness of the lowermost semiconductor layer.

* * * * *